United States Patent
Szpak et al.

(10) Patent No.: US 11,327,725 B2
(45) Date of Patent: ***May 10, 2022

(54) SYSTEMS AND METHODS FOR AGGREGATING IMPLICIT AND EXPLICIT EVENT CODE OF EXECUTABLE MODELS

(71) Applicant: The MathWorks, Inc., Natick, MA (US)

(72) Inventors: Peter S. Szpak, Newton, MA (US); Biao Yu, Sharon, MA (US); Alongkrit Chutinan, Dover, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/741,957

(22) Filed: Jan. 14, 2020

(65) Prior Publication Data

US 2020/0150931 A1 May 14, 2020

Related U.S. Application Data

(63) Continuation of application No. 15/392,682, filed on Dec. 28, 2016, now Pat. No. 10,585,648.

(Continued)

(51) Int. Cl.
  *G06F 9/445* (2018.01)
  *G06F 8/10* (2018.01)
  (Continued)

(52) U.S. Cl.
  CPC .................. *G06F 8/34* (2013.01); *G06F 8/10* (2013.01); *G06F 8/35* (2013.01); *G06F 9/445* (2013.01);
  (Continued)

(58) Field of Classification Search
  CPC ..... G06F 8/10; G06F 8/34; G06F 8/35; G06F 9/445; G06F 9/44505; G06F 9/44594; G06F 30/367; G06F 30/33
  See application file for complete search history.

(56) References Cited

U.S. PATENT DOCUMENTS

| | | | |
|---|---|---|---|
| 4,827,404 A | 5/1989 | Barstow et al. | |
| 5,151,984 A | 9/1992 | Newman et al. | |

(Continued)

FOREIGN PATENT DOCUMENTS

| | | | |
|---|---|---|---|
| CN | 1359489 A | 7/2002 | |
| EP | 0670545 | 9/1995 | |

(Continued)

OTHER PUBLICATIONS

Steven Smyth et al., "SCEst: Sequentially Constructive Esterel", [Online], pp. 1-25, [Retrieved from Internet on Dec. 18, 2021], <https://rtsys.informatik.uni-kiel.de/~biblio/downloads/papers/tecs17.pdf>, (Year: 2017).*

(Continued)

*Primary Examiner* — Ziaul A Chowdhury
(74) *Attorney, Agent, or Firm* — Cesari and McKenna, LLP; Michael R. Reinemann

(57) ABSTRACT

Systems and methods may aggregate and organize implicit and explicit initialization, reset, and termination operations defined throughout the hierarchy of an executable. The systems and methods may analyze the model and identify implicit and explicit initialization, reset, and termination operations defined at various hierarchical levels. The systems and methods may aggregate the implicit and explicit initialization, reset, and termination operations into an initialize callable unit, a reset callable unit, and a termination callable unit. The systems and methods may apply optimizations to the callable units, and resolve conflicts. The (Continued)

systems and methods may define a single entry point for each of the initialize, reset, and termination callable units.

39 Claims, 34 Drawing Sheets

Related U.S. Application Data

(60) Provisional application No. 62/344,253, filed on Jun. 1, 2016.

(51) Int. Cl.
*G06F 8/35* (2018.01)
*G06F 30/33* (2020.01)
*G06F 8/34* (2018.01)
*G06F 30/367* (2020.01)

(52) U.S. Cl.
CPC ...... *G06F 9/44505* (2013.01); *G06F 9/44594* (2013.01); *G06F 30/33* (2020.01); *G06F 30/367* (2020.01)

(56) References Cited

U.S. PATENT DOCUMENTS

| | | | |
|---|---|---|---|
| 5,363,320 A | 11/1994 | Boyle et al. | |
| 5,497,500 A | 3/1996 | Rogers et al. | |
| 5,522,073 A | 5/1996 | Courant et al. | |
| 5,689,711 A | 11/1997 | Bardasz et al. | |
| 5,821,934 A | 10/1998 | Kodosky et al. | |
| 6,035,116 A * | 3/2000 | Terada | G06F 9/445 703/24 |
| 6,604,190 B1* | 8/2003 | Tran | G06F 9/383 712/204 |
| 6,820,042 B1 | 11/2004 | Cohen et al. | |
| 6,880,130 B2 | 4/2005 | Makowski et al. | |
| 6,976,246 B1 | 12/2005 | Rosaria et al. | |
| 7,043,693 B2 | 5/2006 | Wenzel et al. | |
| 7,047,176 B2 | 5/2006 | Klevans et al. | |
| 7,134,109 B2 | 11/2006 | Hayles | |
| 7,139,692 B2 | 11/2006 | Cohen et al. | |
| 7,412,366 B1 | 8/2008 | Englrhart et al. | |
| 7,506,304 B2 | 3/2009 | Morrow et al. | |
| 7,530,052 B2 | 5/2009 | Morrow et al. | |
| 7,729,894 B1 | 6/2010 | Aldrich | |
| 7,752,559 B1 | 7/2010 | Szpak et al. | |
| 7,809,545 B2 | 10/2010 | Ciolfi et al. | |
| 7,861,217 B2 | 12/2010 | Ciolfi | |
| 8,046,207 B2 | 10/2011 | Glass et al. | |
| 8,046,732 B2 | 10/2011 | Shaburov | |
| 8,117,591 B1 | 2/2012 | Michelsen | |
| 8,370,778 B1* | 2/2013 | Rochel | G06F 30/367 716/106 |
| 8,458,655 B1 | 6/2013 | Linebarger et al. | |
| 8,683,426 B2 | 3/2014 | Englehart | |
| 8,713,528 B1 | 4/2014 | Conrad et al. | |
| 8,775,974 B2 | 7/2014 | Cowan et al. | |
| 8,788,126 B1 | 7/2014 | Bull et al. | |
| 8,793,602 B2 | 7/2014 | Szpak et al. | |
| 8,990,783 B1 | 3/2015 | Yu et al. | |
| 9,026,966 B1 | 5/2015 | Ramachandran et al. | |
| 9,141,365 B1 | 9/2015 | Zander et al. | |
| 9,304,838 B1 | 4/2016 | Warlock et al. | |
| 9,311,436 B2 | 4/2016 | Englehart et al. | |
| 9,424,005 B1 | 8/2016 | Avadhanula et al. | |
| 9,430,342 B1 | 8/2016 | Byan | |
| 10,157,246 B2 | 12/2018 | Szpak et al. | |
| 10,318,251 B1 | 6/2019 | Darnell et al. | |
| 2003/0046658 A1 | 3/2003 | Raghavan et al. | |
| 2003/0058280 A1 | 3/2003 | Molinari et al. | |
| 2004/0015677 A1 | 1/2004 | Moreno et al. | |
| 2004/0260700 A1 | 12/2004 | Wang et al. | |
| 2005/0055666 A1 | 3/2005 | Kornerup et al. | |
| 2005/0108514 A1 | 5/2005 | Rothman et al. | |
| 2005/0160397 A1 | 7/2005 | Szpak et al. | |
| 2005/0216248 A1 | 9/2005 | Ciolfi et al. | |
| 2006/0288327 A1 | 12/2006 | Torgerson et al. | |
| 2007/0061791 A1 | 3/2007 | Hartikainen | |
| 2007/0074286 A1 | 3/2007 | Wendling | |
| 2009/0187887 A1 | 7/2009 | Richins | |
| 2010/0153910 A1 | 6/2010 | Ciolfi et al. | |
| 2011/0167165 A1 | 7/2011 | Byan | |
| 2012/0198457 A1 | 8/2012 | Leonelli et al. | |
| 2013/0013905 A1* | 1/2013 | Held | G06F 21/575 713/2 |
| 2013/0124825 A1 | 5/2013 | Ahn et al. | |
| 2013/0159877 A1 | 6/2013 | Banti et al. | |
| 2014/0365970 A1* | 12/2014 | Jeong | G06F 9/451 715/835 |
| 2015/0309810 A1 | 10/2015 | Gschwind et al. | |
| 2016/0042735 A1 | 2/2016 | Vibbert et al. | |
| 2016/0085888 A1 | 3/2016 | Soukhostavets | |
| 2016/0350454 A1 | 12/2016 | Chutinan et al. | |
| 2017/0026986 A1 | 1/2017 | Ji et al. | |
| 2019/0227777 A1 | 7/2019 | ChoFleming, Jr. et al. | |

FOREIGN PATENT DOCUMENTS

| | | |
|---|---|---|
| JP | 2001-075619 A | 3/2001 |
| JP | 2003-241965 A | 8/2003 |
| WO | WO-1999/46689 A1 | 9/1999 |
| WO | WO-1999/46889 | 9/1999 |
| WO | WO-2001/067192 | 9/2001 |
| WO | WO-2004/095267 A2 | 11/2004 |

OTHER PUBLICATIONS

B Agnew et al., "Planning for change: a reconfiguration language for distributed systems", [Online], pp. 313-322, [Retrieved from Internet on Dec. 18, 2021], <https://iopscience.iop.org/article/10.1088/0967-1846/1/5/006/pdf> (Year: 1994).*

Bengtsson, Kristofer et al., "Sequence Planning Using Multiple and Coordinated Sequences of Operations," [Online], 2012, pp. 308-319, [Retrieved from Internet on Sep. 27, 2019], <https://ieeexplore.ieee.org/starnp/starnp.jsp?arnurnber=6142120>.

Biehl, Matthias, "Literature Study on Model Transformations", [Online], 2010, pp. 1-28, [Retrieved from Internet on Sep. 27, 2019], <https://pdfs.sernanticscholar.org/3d6c/6bfc306c29a16afd09bb649bd21e178cd008.pdf>.

"Conditionally Reset Block States in a Subsystem—MATLAB & Simulink" downloaded from the Internet May 1, 2016, http://www.mathworks.com/help/simulink/ug/reset-block-states-in-a-  . . . , 5 pages.

Cuadrado, Jesus Sanchez et al., "Modularization of model transformations through a phasing mechanism," [Online], 2008, pp. 325-345, [Retrieved from Internet on Sep. 27, 2019], <https://link.springer.com/contentlpdf/10.1007/s 1 0270-008-0093-0.pdf>.

De Niz, Dionisio, et al., "Geodesic—A Reusable Component Framework for Embedded Real-time Systems," Sep. 2002, pp. 1-20.

Deng, William, et al., "Model-checking Middleware-based Event-driven Real-time Embedded Software," Nov. 2002, pp. 1-26.

"English Abstract of Japanese Publication No. JP-2001-075619," published on Mar. 23, 2001, one page.

"English Abstract of Japanese Publication No. JP-2003-241965," published on Aug. 29, 2003, one page.

English Translation of "Decision of Refusal" from Japanese Patent Office in Application No. 2006-549406, dated Feb. 7, 2011, (actual date of Decision is Feb. 7, 2012), pp. 1-10.

English Translation of "Official Questioning" from Japanese Patent Office in Application No. 2006-549406, dated Nov. 20, 2012, pp. 1-6.

English Translation of "Notification of Reasons for Refusal" from Japanese Patent Office in Application No. 2006-549406, dated May 24, 2011, pp. 1-6.

English Translation of "Notification of Reasons for Refusal" from Japanese Patent Office in Application No. 2006-549406, dated Jan. 14, 2014, pp. 1-59.

(56) References Cited

OTHER PUBLICATIONS

"European Search Report," European Application No. 17 174 001.2, Applicant: The MathWorks, Inc., Date of Completion of the Search: Dec. 15, 2017, dated Jan. 3, 2018, pp. 1-3.
"Initialize Signals and Discrete States—MATLAB & Simulink" downloaded from the Internet May 20, 2016, http://www.mathworks.com/help/simulink/ug/initializing-signals-and . . . , 5 pages.
Ishizuka, Shinichi, "MATLAB Family: Design Capability Compatible with Sophisticated Control Theory," Interface, CQ Publishing Co., Ltd., Sep. 1, 1997, vol. 23, No. 9, pp. 84-85.
Jamal, Rahman, et al., "Zeitkritische Regelungen unter LabVIEW," Elektronic, Sep. 2001, pp. 86-93.
Kalnins, Audris et al., "Model Transformation language MOIA", [Online], 2004, pp. 1-15, [Retrieved from Internet on Sep. 27, 2019], <http://rnelnais.rnii.lu.lv/audris/rnola_rndafa.pdf>.
Klinger, Motti, "Reusable Test Executive and Test Programs Methodology and Implementation Comparison Between HP VEE and LabVIEW," IEEE, Aug. 1999, pp. 305-312.
MathWorks Simulink User's Guide, Natick, MA, Sep. 2015, 3480 pages.
"MATLAB," Journal of the Society of Instrument and Control Engineers, Jan. 10, 1999, vol. 38, Issue 1, pp. 80-81.
"Notification of Transmittal of the International Search Report and the Written Opinion of the International Searching Authority, or the Declaration," International Filing Date: Apr. 16, 2004, International Application No. PCT/US2004/011839, Applicant: The Mathworks, Inc., dated Jul. 12, 2005, pp. 1-5.
"Notification of Transmittal of the International Search Report and the Written Opinion of the International Searching Authority, or the Declaration," International Filing Date: Jan. 6, 2005, International Application No. PCT/US2005/000390, Applicant: The Mathworks, Inc., dated Jun. 30, 2005, pp. 1-10.
Sargent, Robert G., "Verification and Validation: Some Approaches and Paradigms for Verifying and Validating Simulation Models," Proceedings of the 2001 Winter Simulation Conference, Dec. 9-12, 2001, pp. 106-114.
Schruben, Lee W. et al., "Advanced Event Scheduling Methodology," Proceedings of the 2003 Winter Simulation Conference, Dec. 7-10, 2003, pp. 159-165.
"SIMULINK® : Model-Based and System-Based Design-Simulink Reference," Version 5, The MathWorks, Inc., Jul. 2002, pp. 1-578.
"SIMULINKTM : Model-Based and System-Based Design, Using Simulink," Version 4, The MathWorks, Inc., Apr. 2003, pp. 1-838.
"SIMULINKTM : Model-Based and System-Based Design, Using Simulink," Version 5, Chapter 2, The MathWorks, Inc., Jul. 2002, pp. 1-50.
"SIMULINKTM : Model-Based and System-Based Design, Using Simulink," Version 5, The MathWorks, Inc., Jul. 2002, pp. 1-476.
"Simulink® User's Guide," R2012b, The MathWorks, Inc., Sep. 2012, pp. 1-18.
Simulink®: User's Guide, R2016a, The MathWorks, Inc., Mar. 2016, pp. 1-3840.
Takaya, Kunio, "Comprehensive Application of Matlab," Morikita Publishing Co., Ltd., Feb. 22, 2002, First Edition, pp. 117-122.
"Tool for Modeling/Simulating Dynamic Models: Basics of Simulink," Interface, CQ Publishing Co., Ltd., Oct. 1, 2001, Issue 27, No. 10, pp. 28-52.
U.S. Appl. No. 14/444,412, filed Jul. 28, 2014 by Peter S. Szpak, et al. for a System and Method for Scheduling the Execution of Model Components Using Model Events, pp. 1-42.
U.S. Appl. No. 15/392,682, filed Dec. 28, 2016 by Peter S. Szpak, et al. for Systems and Methods for Aggregating Implicit and Explicit Event Code of Executable Models, pp. 1-107.

\* cited by examiner

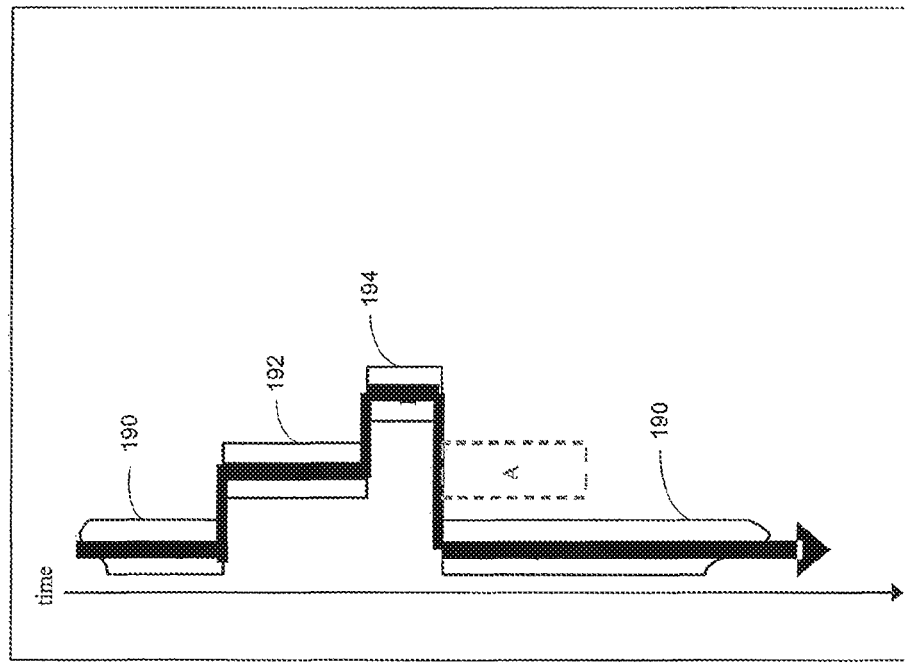
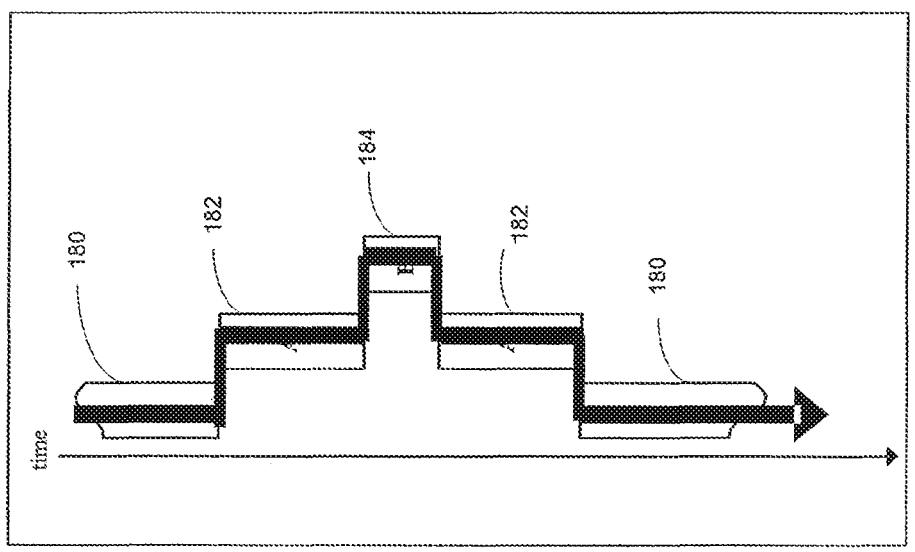
Figure 8

```
void initialize (void)                                              ─2220
{
        default initialize code [implicit initialize operations] for
PUPD_Model_Component_Instance1 ;  ─2208
        user-specified initialize code [explicit intitialize operations] for
PUPD_Model_Component_Instance1 ;  ─2210
        default initialize code [implicit initialize operations] for
PUPD_Model_Component_Instance2 ;  ─2212
        user-specified initialize code [explicit intitialize operations] for
PUPD_Model_Component_Instance2 ;  ─2214
        default initialize code [implicit initialize operations] for
Function_Call_Model_Component;  ─2216
        user-specified initialize code [explicit intitialize operations] for
Function_Call_Model_Component;  ─2218
}                                                                   }─2202 void Reset (void)                                                   ─2226
{
        user-specified reset code [explicit reset operations] for
PUPD_Model_Component_Instance1 ;  ─2222
        user-specified reset code [explicit reset operations] for
PUPD_Model_Component_Instance2 ;  ─2224
}                                                                   }─2204 void Terminate (void)                                               ─2240
{
        user-specified terminate code (explicit terminate operations] for
Function_Call_Model_Component;  ─2228
        default terminate code [implicit terminate operations] for
Function_Call_Model_Component;  ─2230
        user-specified terminate code (explicit terminate operations] for
PUPD_Model_Component_Instance2 ;  ─2232
        default terminate code [implicit terminate operations] for
PUPD_Model_Component_Instance2 ;  ─2234
        user-specified terminate code (explicit terminate operations] for
PUPD_Model_Component_Instance1 ;  ─2236
        default terminate code [implicit terminate operations] for
PUPD_Model_Component_Instance1 ;  ─2238
}                                                                   }─2206
```

FIG. 22

```
void Initialize(RT_MODEL_T *const M, real_T *U_In, real_T*Y_Out){
  DW_a_T *DW = ((DW_T *)M->dwork);
  (void) memset((void *)DW,0,sizeof(DW_T));
  *U_In = 0.0; (*Y_Out) = 0.0;
  DW->UnitDelay_DSTATE = 0.0; // Default initial condition, removed by code
generation optimizer
  DW->UnitDelay_DSTATE = getNVRAM(M->NVRAM_idx)
}
```

FIG. 23

```
void Reset(RT_MODEL_T *const M){
  DW_T *DW = ((DW_T *)M->dwork);
  DW->UnitDelay_DSTATE = 10.0;
}
```

FIG. 24

```
void step(RT_MODEL_T *const M,
real_T U_In, real_T *Y_Out){
  DW_T *DW = ((DW_T *) M->dwork);
  real_T rtb_Sum3;
  rtb_Sum3 = 1.3 * U_In + aDW->UnitDelay_DSTATE;
  *Y_Out = rtb_Sum3;
  DW->UnitDelay_DSTATE = rtb_Sum3;
}
```

FIG. 25

```
void Terminate(RT_MODEL_T *const a_M){
 DW_a_T *DW = ((DW_T *) M->dwork);
 setNVRAM(M->NVRAM_id, &DW->UnitDelay_DSTATE);
}
```

```
define S_FUNCTION_NAME name_of_function_here          — 3102 define MDL_START void mdlStart(inputArg1, inputArg2)                    — 3104

/* explicit initialize operations */ define MDL_INITIALIZE_CONDITIONS void mdlInitializeConditions(inputArg1, inputArg2)     — 3106

/* explicit initialize operations */ define MDL_RESET(id_1)

void mdlReset_id_1(inputArg1, inputArg2, inputArg3)    — 3108

/* explicit reset operations */ define MDL_TERMINATE void mdlTerminate( (inputArg1, inputArg2)              — 3110

/* explicit terminate operations */
```

FIG. 31

SYSTEMS AND METHODS FOR AGGREGATING IMPLICIT AND EXPLICIT EVENT CODE OF EXECUTABLE MODELS

CROSS-REFERENCE TO RELATED APPLICATIONS

This application is a continuation of application Ser. No. 15/392,682 filed Dec. 28, 2016, which claims the benefit of Provisional Patent Application Ser. No. 62/344,253, filed Jun. 1, 2016, for Systems and Methods for Aggregating Implicit and Explicit Event Code of Executable Models, which applications are hereby incorporated by reference in their entireties.

BRIEF DESCRIPTION OF THE DRAWINGS

The description below refers to the accompanying drawings, of which:

FIG. 8 is a schematic illustration of a data flow diagram contrasting the handling of normal and exceptional events in the illustrative embodiment of the present disclosure;

FIG. 22 is a schematic illustration of example code generated for the model of FIG. 21 in accordance with an embodiment;

FIG. 23 is a schematic illustration of example code generated for explicit initialize operations included in the model component of FIG. 16 in accordance with an embodiment;

FIG. 24 is a schematic illustration of example code generated for explicit reset operations included in the model component of FIG. 16 in accordance with an embodiment;

FIG. 25 is a schematic illustration of example code that may be generated for an algorithmic portion of the model component of FIG. 16 in accordance with an embodiment;

FIG. 26 is a schematic illustration of example code generated for explicit termination operations included in the model component of FIG. 16 in accordance with an embodiment;

FIG. 31 is a schematic illustration of an example textually-defined model element.

DETAILED DESCRIPTION OF ILLUSTRATIVE EMBODIMENTS

Figure 1:
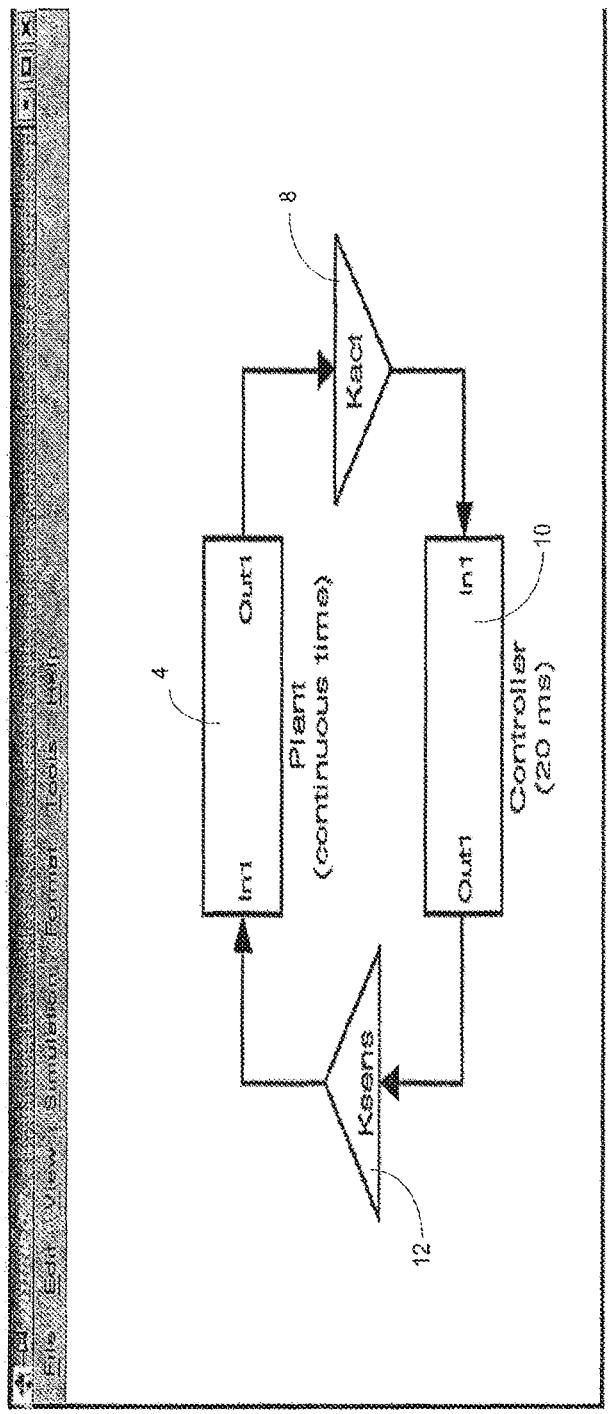
FIG. 1 is a schematic illustration of a conventional block diagram model utilizing sample rates.

Graphical modeling environments may be used by engineers to model dynamic systems. A user may create an executable graphical model by selecting desired model element types from a library browser, and placing instances of the selected model element types on a canvas. The canvas may be included in a graphical program editor. The model elements may be interconnected using connection elements that may establish data, control, mathematical, or other relationships among the connected model elements. In some embodiments, model elements may represent elemental dynamic systems and connection elements may represent signals. Relationships among model elements may also be established textually or in other ways. For example, a first model element may issue an event that triggers execution of a second model element without any connection element extending between the first and second model elements. The graphical modeling environment may also support the creation of state machine models. A state machine model may include states, junctions, and functions, and transitions may be created by connecting states and junctions together.

The Simulink® model-based design environment from The MathWorks, Inc. of Natick, Mass., is an example of a graphical modeling environment. The Simulink® environment allows users to create a pictorial model of a dynamic system, specifically a block diagram. A model may include a plurality of symbols, called model elements or blocks. A block may have zero or more input ports, output ports, and states. A block may represent a dynamic system whose inputs, states, and outputs can change continuously and/or discretely at specific points in time during execution of the model. Lines may be used to connect the blocks' ports to one another, and may represent data or other dependencies between blocks. Signals may be represented as values traveling along the lines that connect the blocks in a block diagram.

A dynamic model changes over time. For example, time-based relationships may be defined using signals and state variables, and the solution of the model may be obtained by evaluating these relationships over a time, e.g., the model's simulation time. The model may be solved repeatedly over the simulation time at intervals called time steps. The modeling environment may specify a default simulation time, for example from zero to ten seconds. Simulation time differs from actual clock time. For example, even though a model's execution may be simulated from zero to ten seconds, it may take a small fraction of that in terms of actual clock time for a data processing device, such as a workstation, to execute the model. A modeling environment may include a solver that generates a set of equations for the relationships between a model's signals and state variables. During model execution the solver solves these equations. The solver may determine the particular simulation time steps, which may also be referred to as sample times, during which the equations associated with the model's elements may be executed.

If all of a block's inputs, states, and outputs change either continuously or at one fixed, periodic rate, the block is considered to be a 'single-rate' block. If the inputs, states, and outputs update, either together, or separately at points in time defined by two or more rates, the block is considered to be a 'multi-rate' block. If a model has multi-rate blocks in it, or two or more single-rate blocks running at different rates, then the model itself is multi-rate (vs. single-rate).

A block is referred to as 'atomic' if its functional definition is outside the context of the model in which it is placed. The Simulink® environment has a set of predefined atomic blocks (e.g., Sum, Product, Gain). In addition, users may also create their own atomic blocks through user-written 'S-functions'. Being atomic, S-functions' functional definitions are specified outside the context of the model in which they are included, for example using C code or MATLAB 'm' code. A 'composite' block is a block whose functional definition is specified through the model, using sets of atomic and composite blocks. The Simulink® environment permits the user to specify subsystems, composite blocks whose definition consists of interconnected sets of pre-defined blocks, and user-written S-functions. Subsystems and other model components, such as sub-models, may be nested hierarchically, thereby defining hierarchy within a model.

The Simulink® environment's sample rates provide a mechanism for specifying how often the blocks of a model execute. FIG. 1 depicts an example of the use of sample rates in controlling the execution of blocks. For example, a designer may specify that a plant block 4 executes at a continuous rate, and a controller block 10 executes at some periodic, discrete rate. The execution of blocks may be scheduled by the Simulink® environment's infrastructure when simulating, or by the operating system for a real-time implementation. There may be no causal relationship between the dynamics of a model and the scheduling of these rates; the instants at which the components execute are predetermined.

The Simulink® environment supports the propagation of sample rates. For example, the rates of the Gain blocks 8 and 12 in FIG. 1 may be left unspecified, or rather, specified as "Inherit". In this case, assuming that the rates of the plant block 4 and the controller block 10 have been specified, the Gain blocks 8 and 12 inherit their sample rates from the plant and controller blocks 4 and 10.

Subsystems may be used to establish hierarchy within a model, where a single subsystem block is on one level of the model hierarchy, and the blocks that make up the subsystem are on a next lower level. A subsystem may itself include other subsystems, thereby establishing multiple hierarchical levels within a model. A subsystem may be virtual such that the execution of the blocks that make up the subsystem may be interspersed with the execution of other blocks of the model, such as other blocks that are at the same level of hierarchy as the virtual subsystem. A subsystem may be nonvirtual, e.g., atomic, such that the execution of the blocks that make up the atomic or nonvirtual subsystem may not be interspersed with the execution of other blocks of the model. That is, the blocks of an atomic or nonvirtual subsystem may be executed as a single unit. A subsystem may be declared atomic or nonvirtual, for example by setting an option for the subsystem. A subsystem may be configured to prevent or allow certain parameters or characteristics (e.g., sample time, data type, data width) of input, output, and/or internal variables and/or signals to be inferred from the characteristics of input, output, and/or internal variables and/or signals of other blocks of the model that are connected to the subsystem.

A subsystem may be executed conditionally or unconditionally. For conditionally executed subsystems, execution may depend on a control signal and/or control block. Examples of conditionally executed subsystems include triggered, enabled, action and iterator, triggered and enabled, and function call subsystems.

The Simulink® environment also provides mechanisms for specifying causal relationships between the dynamics of a model and the execution of model elements and components, including: function-call subsystems, triggered subsystems, iterator subsystems, action subsystems and enabled subsystems. The specifying of causal relationships permits users to specify execution of model components conditional on present and past values of signals and other data in the model.

However, the scope of conditional execution is generally restricted to a subsystem as some methods of specifying the relationships do not allow the scope of conditional execution to be defined as an arbitrary set of blocks (as opposed to the set of blocks that comprise a subsystem). This can be a significant limitation, since there are times where it is desirable to simultaneously execute a set of blocks that are not in a subsystem and/or are not contiguous in the model. For example, conventional methods of conditional execution do not allow execution of various blocks distributed throughout the model at power-up or power-down. As a result, the manner in which the causal relationships may be composed is restricted. Existing methods of specifying the causal relationships between the dynamics of a model and the execution of model components may not allow a user to enable half of the blocks in a subsystem and trigger the other blocks. Similarly, one may not trigger some of the blocks in a subsystem with one trigger, and the remaining blocks with a different trigger.

An additional drawback to some existing mechanisms for specifying the causal relationships between the dynamics of a model and the execution of model components is that these mechanisms require graphical connections to be made in the block diagram to indicate causality. This can result in an appearance which some users feel "clutters" the diagram. Another limitation to conventional mechanisms for specifying causal relationships is that existing mechanisms do not naturally map to advanced software or operating system constructs, such as initialization, exceptions, or tasks. Similarly, since existing mechanisms of specifying the causal relationships lack a first class object associated with the causal relationship, it can be difficult to configure and assign characteristics to that relationship. It may also be difficult for a user to directly leverage implicit dynamics associated with the mechanisms, for example the enable and disable methods associated with an enabled subsystem, and to conditionally execute components of a model based on these implicit dynamics.

A graphical modeling environment may include a run-time engine for executing a model. During execution, a model may receive input values and may compute output values. The run-time engine may compile the model into an in-memory executable form that may then be executed from within the modeling environment. In some embodiments, an in-memory executable form suitable for execution in an interpretive mode may be created. Execution of a model may include several phases, such as an initialization phase, a run phase, and a termination phase. The run-time engine may specify operations to be executed during the initialization and termination phases. Initialization and termination operations specified by the run-time engine may be referred to as implicit operations. With some modeling environments, the initialization and terminations phases may not be accessible to a user. Instead, a user may only specify operations to be performed during the run phase.

As described, a modeling environment may support hierarchy, and a graphical model may have multiple hierarchical levels. For example, a model may include model components, also referred to as components, that establish hierarchy in the model. Exemplary components include subsystems, sub-models, sub-Virtual Instruments (sub-VIs), super blocks, etc. A model component may include one or more model elements, but may include a plurality of model elements. A component may be saved in a library, and may be reused at other locations in the model or in other models. The execution behavior of some components, such as subsystems, may be context dependent. For example, at least some of the parameters of the group of model elements included in such a component, such as data type, data dimension, and sample time, may be undefined. Values for these parameters may be inferred from other model elements or the model in which the component is included.

The execution behavior of other components, such as a sub-model may be independent of the model in which the sub-model is included, and the model elements of a sub-model may execute as a unit.

The run-time engine may automatically determine and specify system-based, e.g., implicit, initialization and termination operations for each hierarchical level of a model. In some embodiments, implicit initialization and termination procedures may be specified for each component included in the model. For example, for each subsystem and/or sub-model, implicit initialization and termination procedures may be specified by the run-time engine. The implicit initialization and termination procedures from the different hierarchical levels may be consolidated or aggregated.

In some cases, a user may want to specify user-defined operations to be executed during the initialization and termination phases of a model's execution. User-defined operations may be referred to as explicit operations. A user may also want to specify user-defined operations to be executed during other execution phases, such as a reset phase. For example, a user may create a model of an electronic control unit (ECU) of an automobile. The model may include user-defined operations to be performed during a power up phase of the ECU, a reset phase, and a power down phase.

The present disclosure relates to systems and methods for aggregating and organizing both implicit and explicit initialization, reset, and termination operations defined throughout a model's hierarchy. A run-time engine may issue one or more events during execution of a model to mark different execution phases, such as initialization, reset, and termination events. Particular user-defined operations may be associated with the initialization, reset, and termination events, and those explicit operations may be executed in response to the occurrence of the initialization, reset, and termination events together with implicit operations automatically determined by the run-time engine. For example, model elements and/or components may listen for particular events, and may execute in response to the occurrence of such events. Furthermore, user-defined initialization, reset, and termination operations may be specified at different hierarchical levels of the model. An organizing engine may be provided that utilizes a set of rules for aggregating and organizing implicit and explicit initialize, reset, and termination operations. The rules may ensure that the implicit and explicit initialize, reset, and termination operations are organized and executed deterministically. The aggregation and organization may be performed automatically without user specification or participation. The automated process may be advantageous, for example, when a model contains a large number of model elements, e.g., hundreds or more, and a large number of hierarchical levels, e.g., 40, 50 or more hierarchical levels.

A model analyzer may analyze a model including all of the model's hierarchical levels. The model analyzer may provide information on the model's structure to the organizing engine. Starting at the model's lowest hierarchical level for example, the organizing engine may determine whether any explicit or implicit operations are defined for execution during initialization, reset, and/or termination phases of the model execution. The organizing engine may combine and arrange the explicit operations with implicit initialization and termination operations for the lowest hierarchical level, based on the rule set. For example, in some cases, explicit operations may be scheduled for execution before implicit operations. The organizing engine may then analyze a next higher hierarchical level of the model. The organizing engine may determine whether any explicit operations are defined for execution during initialization, reset, and/or termination phases of the model execution at the current hierarchical level. The organizing engine may combine and arrange the explicit operations with implicit initialization and termination operations for the current hierarchical level, based on the rule set.

The organizing engine may also aggregate the explicit and implicit operations of the current hierarchical level with the explicit and implicit operations of the previously analyzed hierarchical level(s), e.g., the lowest hierarchical level, based on the rule set. This process of organizing and aggregating explicit and implicit operations may be performed at each hierarchical level of the model until the top level of the model is reached. The aggregated operations may be included in callable units, such as initialization, reset, and termination callable units. The organizing engine may define single entry points for each callable unit to execute the aggregated implicit and explicit operations during initialization, reset, and termination phases. For example, the organizing engine may define function calls for the initialization, reset, and termination callable units.

It should be understood that a model may include additional and/or other phases besides initialization, reset, and termination. For example, a model may include a warm start phase, a cold start phase, a partial reset phase, a soft reset phase, a full reset phase, a hard reset phase, a normal terminate phase, and an emergency terminate phase, among others.

In some implementations, some of the implicit and explicit operations of a model may not be aggregated into a single callable unit, based on the rule set. For example, if a model includes a sub-model, the implicit and explicit operations aggregated into callable units for the sub-models may not be aggregated or combined with the implicit and explicit operations of other portions of the model. In some implementations, a user may choose to explicitly invoke implicit and explicit initialize, reset, or terminate operations, among others, of a sub-model. In that case, the implicit and explicit initialize, reset, or terminate operations may not be aggregated with other implicit and explicit initialize, reset, or terminate operations of the model that includes the sub-model.

A code generator may generate code for the model. The generated code may be executed outside of a modeling environment in which the model is executed. The generated code may include code for the explicit and implicit operations as organized and aggregated by the organizing engine. For example, the code generator may generate code sections corresponding to the callable units, and may include single entry points in the generated code for the code sections corresponding to the explicit and implicit operations associated with initialization, reset, and termination specified at all hierarchical levels of the model.

Some embodiments of the present disclosure provide a mechanism for tying the execution of model components to the occurrence of specified model events. Sample rates may be specified as events thus tying model component execution to the dynamics of the model. Non-contiguous model elements may be configured to conditionally execute based on model event occurrence. Additionally, the scope of component execution may not be limited to subsystems in their entirety. The conditional execution of components based on event occurrence may also be used for exception handling. Associations between model components and events may be established without drawing additional component connections in the view of the model.

Illustrative embodiments of the present disclosure may make reference to the Simulink® modeling environment and the MATLAB® technical computing environment (both applications from The MathWorks of Natick, Mass.) However, it should be recognized by those skilled in the art, that the illustrative embodiments of the present disclosure may also be applied to other modeling environments and other types of diagrams, including the Stateflow® state diagramming and data flow diagramming application from the MathWorks of Natick, Mass.

A Simulink™ Model Event, which may also referred to hereafter as "Event" or "Simulink® Event", may be explicitly defined in a MATLAB workspace as an object. Its attributes may include a name, a color, an optional expected rate, an optional task, and an explanation as to how the function corresponding to the event should be implemented (e.g. inline vs. explicitly defined signature).

Events that have been defined may be "posted" by model elements, based on arbitrary conditions the user defines. Blocks that "receive" that event execute when it is posted. "Posting" may refer to sending a message to an event handler indicating the occurrence of a particular event. Blocks that have registered with or otherwise hooked into the event handler may then be informed about the occurrence of the event when the event posts.

Figure 2:
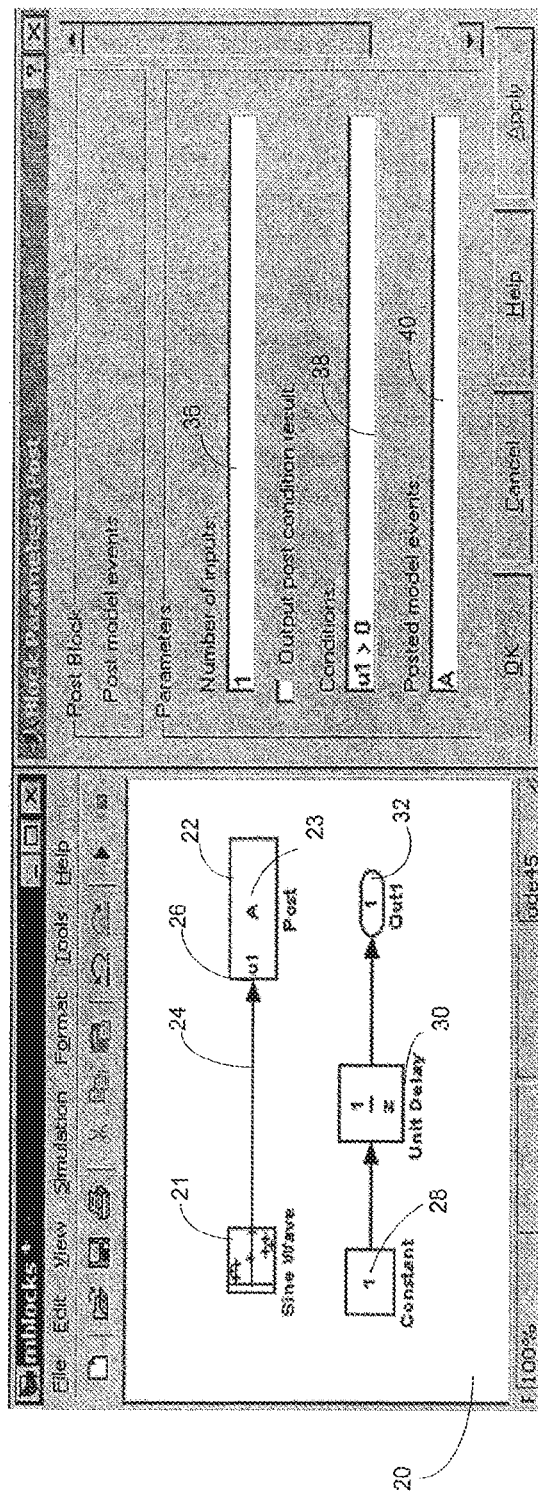
FIG. 2 is a schematic illustration of a model utilizing the posting process of an illustrative embodiment of the present disclosure.

FIG. 2 depicts an example of a model 20 utilizing the posting process. The event "A" has been defined and given the attribute of the color "blue". In the model 20 the block "Post" 22 has been configured (as seen by the dialog in that figure) to post the event "A" conditionally when the signal 24 at its input port 26 is greater than zero. The dialog box solicits a number of parameters from the user for the post block 22 including the number of inputs 36, the condition 38 under which the block executes, and the name assigned to the defined model event 40. The view of the model 20 indicates that the sample rate of the block "Constant" 28 has been specified to be event "A". That sample rate (i.e.: the occurrence of the event "A") is propagated to the blocks "Unit Delay" 30 and "Out1" 32 which have been set to inherit their sample rates. All three blocks thus receive event "A". All three blocks 28, 30 and 32 may assume the "color" of the Event "A" and be shaded blue in a display to a user as a way of expressing the logical association. Therefore, when the output of "Sine Wave" block 21 is positive, "A" is posted by the block "Post", the three blocks 28, 30 and 32 execute, and the value at the model's root outport is updated.

The model depicted in FIG. 2 shows the resolution of some of the issues associated with conditional execution of subsystems that are provided by illustrative embodiments of the present disclosure. There is a first class object "A" associated with the causal relationship, so that it is possible to configure and assign characteristics to that relationship, such as color. The scope of conditional execution may not be restricted to a subsystem. The three blocks 28, 30 and 32 that are conditionally executed are not grouped within a parent subsystem, and may be chosen from non-contiguous areas of the model 20. Additionally, the scope of conditional execution employs rate propagation (only the block "Constant" 28 specifies "A" as its sample rate). This results in a method of specifying sample rates that is more concise than would otherwise be the case if every block receiving "A" had to have its sample rate explicitly specified as "A". Also, the association of blocks with an event does not require a graphical connection between the post block 22 and the constant block 28 to be made in the diagram to indicate causality. The causal relationship between the condition specified by the "Post" block 22 and the execution of the three blocks 28, 30 and 32 is through their common reference to the Event object named "A" 23.

An event's "scope" may be the scope of the workspace within which it exists. If a workspace is associated with a subsystem or model, the scope of the event may be that subsystem or model. In some implementations, blocks may only specify their sample time as an event when that event is in scope from that block.

Figure 3:
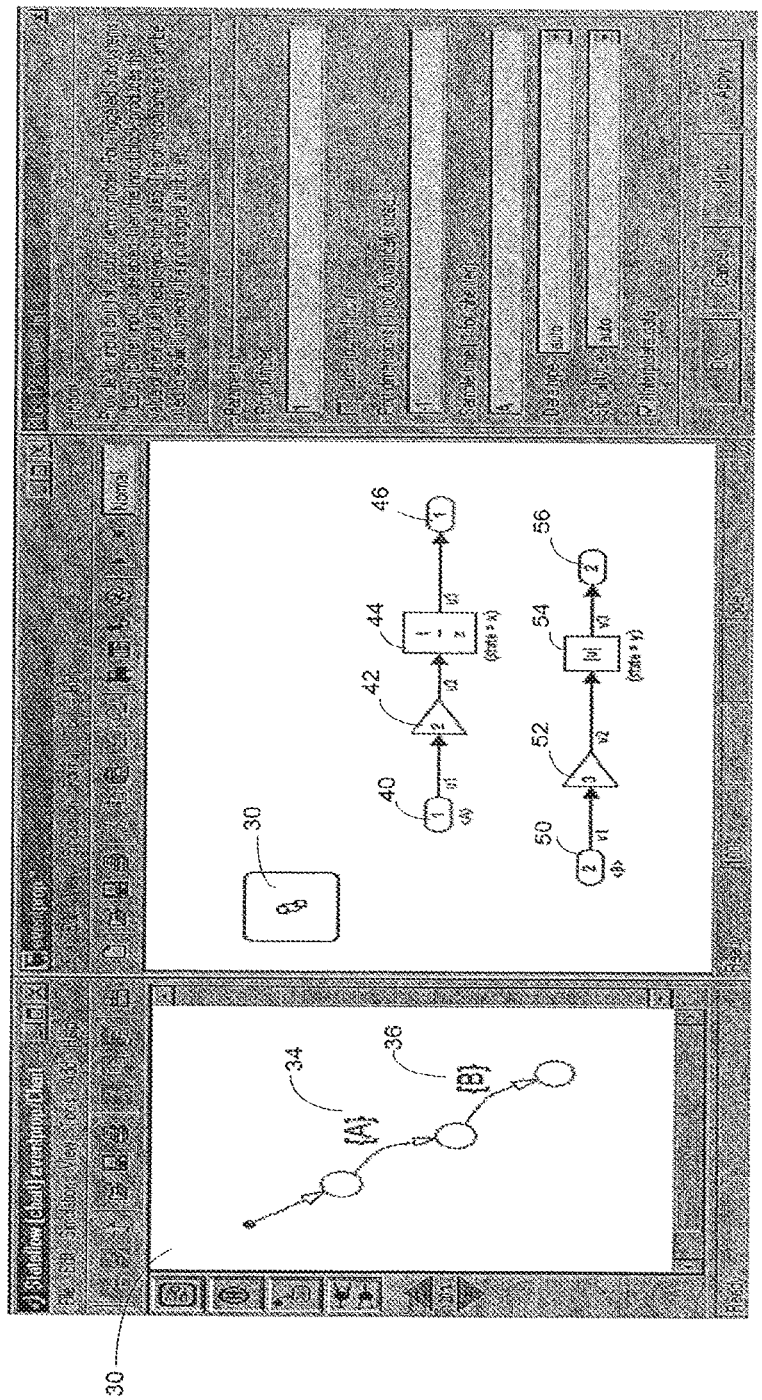
FIG. 3 is a schematic illustration of the posting and receiving of events in a Stateflow™ environment in accordance with the illustrative embodiment of the present disclosure.

FIG. 3 depicts another example of an environment in which the explicit posting and receiving of events occurs, displaying a Stateflow® chart 30 and a block diagram model 32 of the components of the chart in more detail. In this example, the user defines events "A" 34 and "B" 36, with the attribute colors green and blue, respectively. Both events 34 and 36 have their sample rates specified as 20 ms. The Stateflow chart 30, then executes every 20 ms and posts these events in a well-defined, periodic sequence. The two input port blocks 40 and 50 have their sample rates set to the events "A" 34 and "B" 36. The remainder of the blocks takes on those events as inherited sample rates and may be shaded to the color corresponding to the event. The set of blocks colored green 40, 42, 44 and 46 receive the event "A", and execute when that event is posted. Likewise, the set of blocks colored blue 50, 52, 54 and 56 execute when event "B" is posted.

The set of blocks handling each event may execute in the relative order that they appear in in the model's sorted block list. The sorted block list order may be determined by data dependencies among the blocks of a model. Accordingly, every 20 ms the Stateflow chart 30 executes, and the chain of green blocks 40, 42, 44, and 46 executes, left to right, followed by the chain of blue blocks 50, 52, 54 and 56, left to right. Furthermore, since the optional sample rate of the events has been explicitly specified to be 20 ms, a runtime check may be performed to assert that those events are posted every 20 ms. One advantage of explicitly specifying an event's rate is that any code generated for that rate can use the corresponding constant sample time in the generated code wherever elapsed time between successive execution is required, rather than requiring the usage of timers, as may otherwise be the case.

In contrast to explicit events, which are defined as workspace objects and whose conditions for posting are explicitly specified by the user (e.g., through the use of "Post" blocks or state chart logic), implicit events may be implied by model constructs, and may be automatically posted in response to execution of those constructs. In some embodiments, a user cannot post implicit events. However, the user can handle implicit events, meaning that the user can define model components that execute directly in response to an implicit event.

Illustrative embodiments of the present disclosure may include the five types of implicit events noted in the table below:

| Name of Event | Type of Event | Scope | Location where posted | When posted |
| --- | --- | --- | --- | --- |
| $t_s$ | Startup | Entire model | Root of model | Beginning of model execution |
| $t_0$ | Initialize | Enable/If/Case subsystem | Top level of subsystem | The first time the subsystem transitions from inactive to active |
| $t_e$ | Enable | Enable/If/Case subsystem | Top level of subsystem | Whenever the subsystem transitions from inactive to active |
| $t_d$ | Disable | Enable/If/Case subsystem | Top level of subsystem | Whenever the subsystem transitions from active to inactive |
| $t_f$ | Shutdown | Entire model | Root of model | End of model execution |

Those skilled in the art will recognize that other types of implicit events may be handled in addition to those listed in the table above. For example, other types of implicit events that may be supported include error conditions, such as an implicit event posted when a product block attempts to divide by zero, or a logarithm block attempts to take the logarithm of zero. Objects corresponding to implicit events may automatically populate the various workspaces of the model, whereby their properties may be configured by the user.

Figure 4:
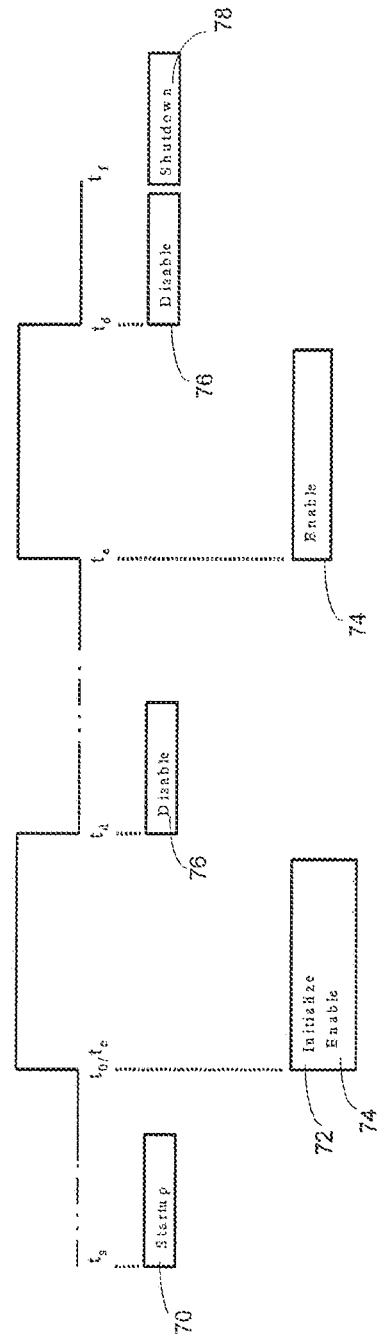
FIG. 4 is a schematic illustration of a timing diagram of implicit events occurring in an enabled subsystem.

FIG. 4 depicts the implicit events noted in the table above in a timing diagram. FIG. 4 shows the relative timing of the events that are in scope in an enabled subsystem or its descendants in the function-call hierarchy; the time varying signal is the signal enabling the subsystem. All five types of implicit events have an asynchronous sample rate. The implicit events include startup 70, initializing 72, enabling 74, disabling 76 and shutdown 78.

Figure 5:
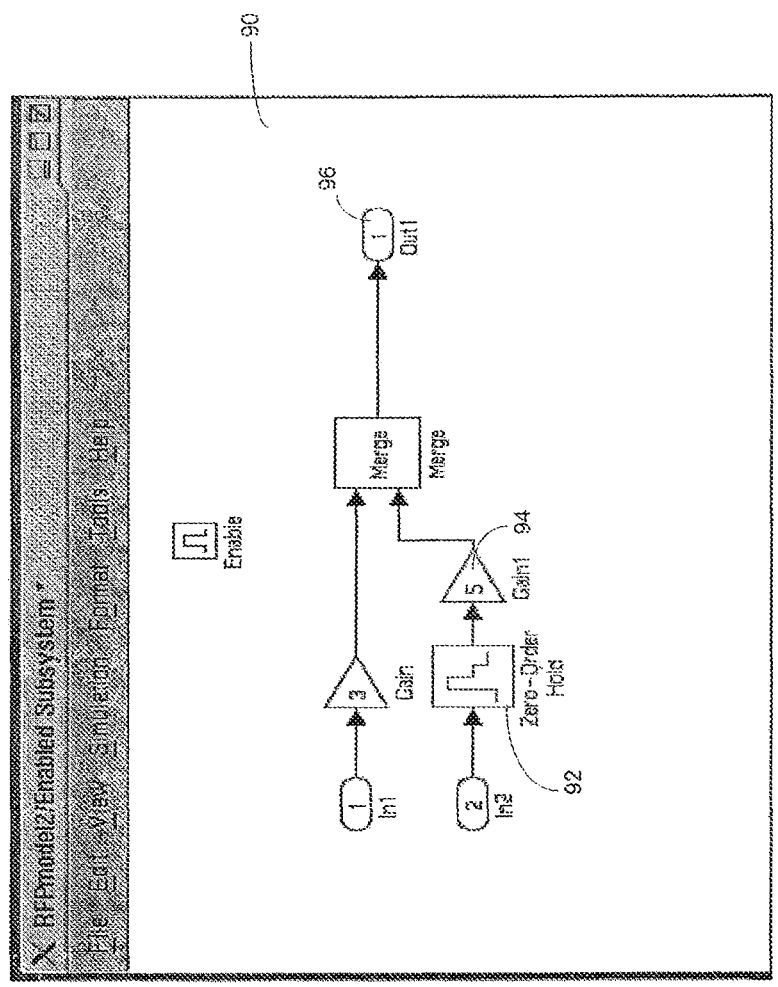
FIG. 5 is a schematic illustration of a model using implicit events in an enabled subsystem.

An example of the use of implicit events in an enabled subsystem 90 is shown in FIG. 5. The subsystem 90 has implicit enable and disable events associated with it that are posted when the subsystem enables and disables. The block "Zero-Order Hold" 92 has its sample rate specified as "Disable", so that it executes when the implicit disable event executes, i.e. when the enabled subsystem 90 disables. Through propagation, the block "Gain1" 94 also inherits that event (disable) as its sample rate, and together, these two blocks execute and update the memory associated with the subsystem output port 96 when the subsystem 90 disables.

Each event may map 1-1 to a function (also referred to herein as the "event handler") that serves as the entry point to the code corresponding to the blocks whose sample rate has been specified or inherited as the event. Whenever the conditions leading to the posting of the event are true, the system may react by calling the function. The function may be inlined during code generation. The choice of whether or not to inline an event's function may be a property of the corresponding event object. As a default implementation, a user may choose to inline implicit events' functions, and not to inline explicit events' functions.

One of the properties of a Simulink® Event may be its task. By default, an event may inherit its task from the context from which it is posted. For example, in FIG. 3 the events "A" 34 and "B" 36 may execute in the same task as the Stateflow chart 30 posting those events. The generated code may call the functions corresponding to "A" and "B" as local function calls as depicted in the pseudocode below corresponding to the model of FIG. 3.

```
void model_step( )
{
    A( );
    B( );
}
```

```
void A( )
{
    u3 = x;
    u2 = 2*u1;
    x  = u2;
}
void B( )
{
    v3 = y;
    v2 = 3*v1;
    y  = v2;
}
```

The task of an event may be specified as the name of a model task object, corresponding to a task in a real-time implementation. Simulink® task objects may correspond to spawned operating system tasks. Properties of a Task object may include a designated rate (periodic value, or asynchronous), priority, task stack size, whether the task is preemptible, or other properties. When an event is posted whose task is different from the task of the block or model construct posting the event, the function corresponding to the event may be scheduled in the event's task. If the task is specified to be periodic, the function may execute during any timestep of that task during which the event is posted. If the task is specified as asynchronous, then the posting of the event may cause the task to be executed by the operating system.

Figure 6A:
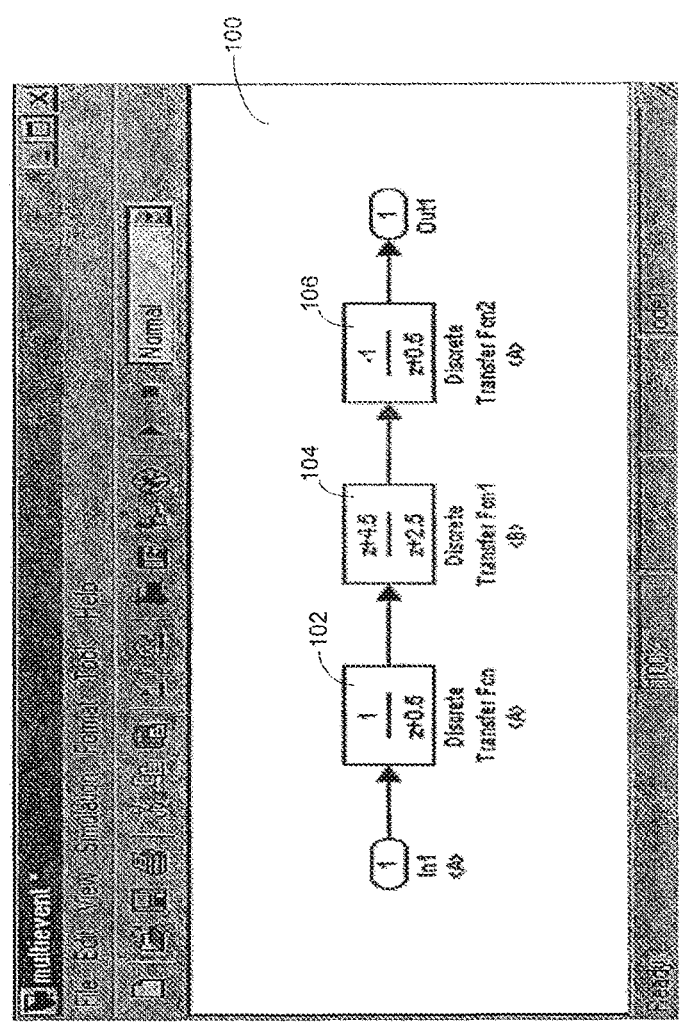
FIG. 6A is a schematic illustration of a model with event transitions occurring within the same task and without event transition blocks.
Figure 6B:
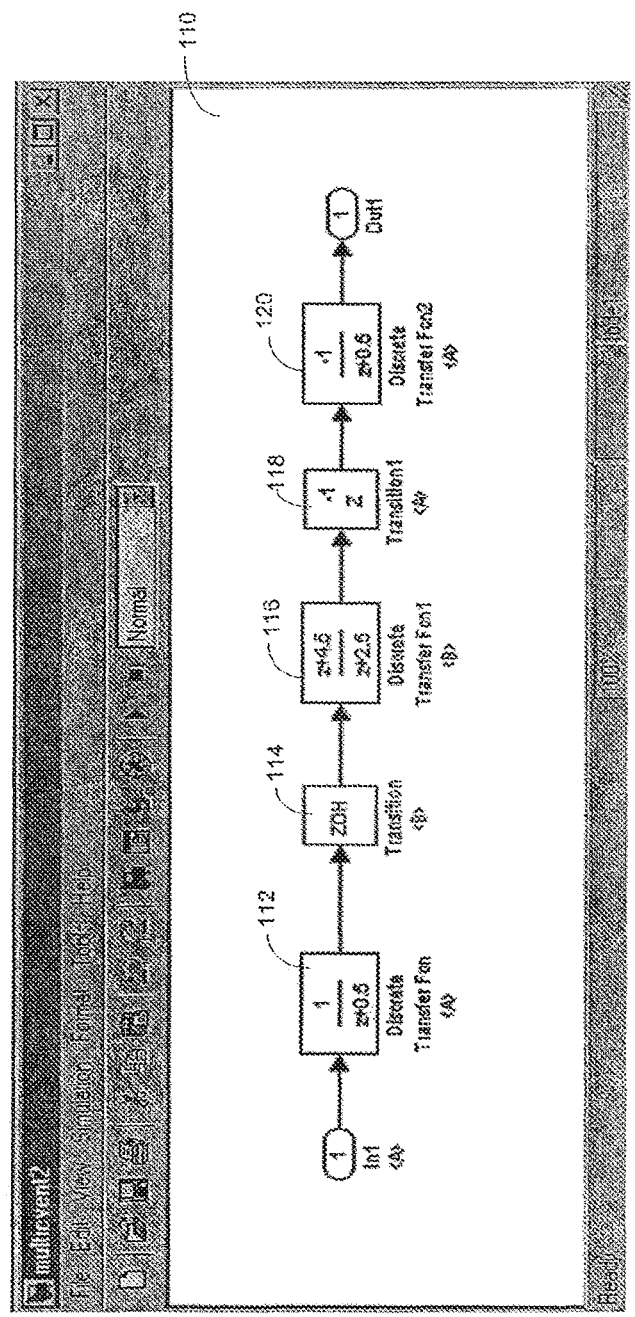
FIG. 6B is a schematic illustration of a model with event transitions occurring in different tasks using event transition blocks.
Figure 6C:
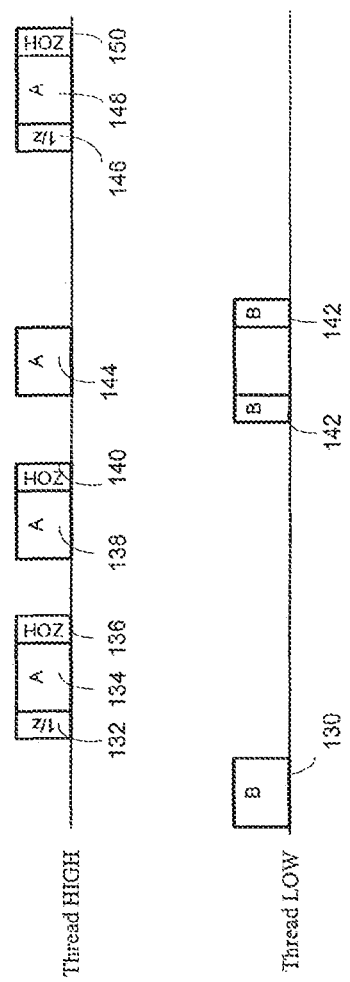
FIG. 6C is a schematic illustration of a timeline of the use of event transition blocks in a model.

Illustrative embodiments may avoid the asynchronous posting of events and multithreaded implementation, through the use of tasks. Tasks may be used to help insure data integrity when using events in a real-time implementation by indicating where an event transition block is required for the sake of data integrity. Tasks may also be used to specify the relative priority of the tasks associated with a transition. Illustrative embodiments may use an event transition block that is a generalization of a Simulink® rate transition block. FIGS. 6A, 6B and 6C illustrate some of the issues involved with event transitions and the usage of event transition blocks.

FIG. 6A depicts a model 100 with transitions occurring in response to the occurrence of Event A and Event B. In the model 100, the events A and B have the same task, and the data integrity issue may be resolved by utilizing persistent memory to store data at the boundaries between the two events. Since both events are in the same task, they cannot preempt each other, and no additional mechanisms (e.g., double buffering) are necessary. In this model 100, persistent memory is utilized for the outputs of the left two transfer function blocks 102, 104 and transition blocks are not necessary to transfer data between the transfer function blocks 102, 104, and 106.

However, if Events A and B are specified to execute in different tasks, event transition blocks are necessary, as shown in FIG. 6B. In the model 110 of FIG. 6B, Event A has a task with high priority, while Event B has a task of low priority. In this case, the block named Transition 114, which lies at the boundary between the first 112 and second 116 transfer function blocks, acts as a zero-order hold. The block named Transition1 118, which lies at the boundary between the second 116 and third 120 transfer function blocks, acts as a delay by default.

The timeline of FIG. 6C shows the functionality of the event transition blocks of FIG. 6B. Since the event transition block Transition 114 acts as a Zero Order Hold, it is represented in the figure by time slices labeled "ZOH". Since the event transition block Transition1 118 acts as a delay, it is represented in the figure by time slices labeled "1/z". The event transition block Transition 114 executes each time the handler for Event A executes, as long as the task assigned to event A is not preempting the task containing Event B. This prevents the input to the handler for B from changing in the middle of its execution. This may be necessary since in an asynchronous, causal system, there may be no way of knowing in advance when event B will next be posted. The output function for the event transition block Transition1 118 executes each time Event A is posted after the handler for Event B has completed execution. This ensures that the handler for Event A utilizes the latest value computed by the handler for B, but doesn't execute the output function of Transition1 if it is unnecessary.

Thus, in FIG. 6C, the low priority task associated with Event B executes (step 130), a delay executes (step 132), the high priority task associated with Event A (step 134) executes and is followed by the Zero Order Hold (step 136). The task associated with Event A then executes (step 138) without being preceded by the delay since B hasn't executed since the last time A executed. The Zero Order Hold (step 140) is then executed following the high priority task (step 138). The low priority task associated with B (step 142) then executes and is interrupted by the high priority task (step 144). Following the completion of the high priority task (step 144) the low priority task (step 142) resumes without the Zero Order Hold being executed since the low priority task had already started. The process then continues with the delay (step 146), the high priority task (step 148) and the Zero Order Hold (step 150) being executed in order.

In addition to ensuring data integrity, event transition blocks may be necessary for resolution during event propagation. However, when transitioning between events that are in the same task, the block may copy its input value to its persistent output. Post-compiling may then be attempted to reduce the block. Transition blocks may require an Initial-Condition parameter to initialize their memory. In some implementations, the default value of this parameter is zero.

Events may also be used to handle errors encountered as a model executes. When an error occurs, the model may "post an event exceptionally". An event that is posted exceptionally is called an "exception event". A key characteristic of an exception event is that it is handled differently from an event that is posted non-exceptionally, or a "normal event". In particular, when one event posts another exception event, that first event's function never resumes execution upon exiting the function for the exception event. In other words, if B interrupts A exceptionally, the execution of A is not resumed after the completion of B. Note that an event may be called both normally and exceptionally in the same model.

Figure 7A:
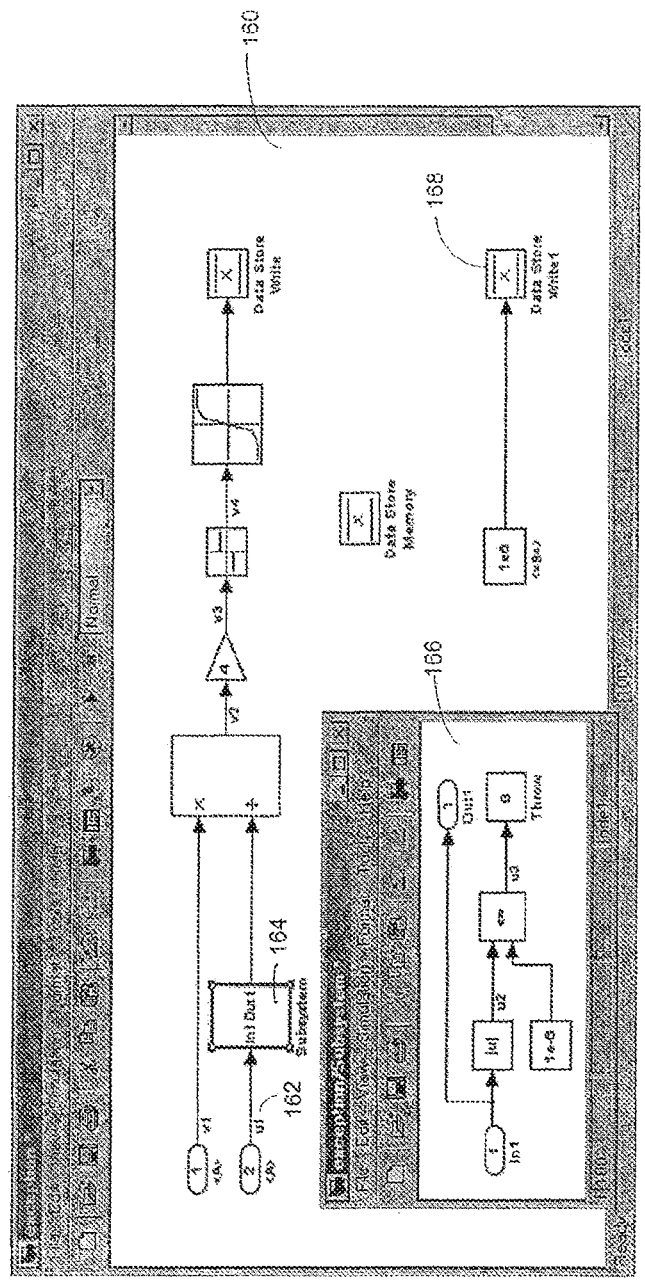
FIG. 7A is a schematic illustration of a model utilizing the illustrative embodiment of the present disclosure to handle events as exceptions.

The usage of an exception event in a model is depicted in FIG. 7A. In the model 160, the upper component is part of the handler for Event A. If the magnitude of the input u1 162 is less than or equal to 1e-6, Event B is posted exceptionally, or "thrown" for short, by the Throw block 166 in the exception subsystem 164. The exception subsystem 164 evaluates the input 162 and only throws event B if the input u1 162 is less than or equal to 1e-6. The Throw block 166 is similar in functionality to the Post block except that it posts an event exceptionally rather than normally. When Event B is thrown, the handler for Event B executes, setting a data store 168 to a large, fixed constant. When the handler for Event B finishes, control does not return to the handler for Event A, since Event B was thrown as an exception, but rather returns to the calling process. Code representative of the process depicted in FIG. 7A may be represented as follows:

```
void model_step( )
{
    A( );
}
void A( )
{
    u2 = fabs(u1);
    u3 = u2 <= 1.0e-6;
    if (fabs(u1) <= 1.0e-6) {
        B( ); /* return from B( ) exceptionally */
        return;
    }
    v4 = rt_sgn(4*(v1 / u1));
    x = rt_lookup(rtP.lookup, v4);
}
void B( )
{
    x = 1.0e6;
}
```

If Event B had been posted normally instead of as an exception, when the handler for Event B was finished, the handler for Event A would have completed execution. These two contrasting scenarios are depicted abstractly in FIG. 8. It will be understood by those skilled in the art that it may be important to have a precise mechanism for controlling how blocks are sorted when introducing events into a model, since events introduce a causal relationship above and beyond the causal relationships implied by data dependency.

The model in FIG. 7A utilized an atomic subsystem to enforce a sorted block order in which the Throw block executes prior to the product block that it is intended to conditionally circumvent via the exception event B. Because the atomic subsystem is earlier than the product block in the sorted block list, its contents, including the Throw block, will execute prior to the product block. One drawback of an atomic subsystem is that its contents are not rendered at the same graphical level as its parent graph, making its contents less easily discernible.

Figure 7B:
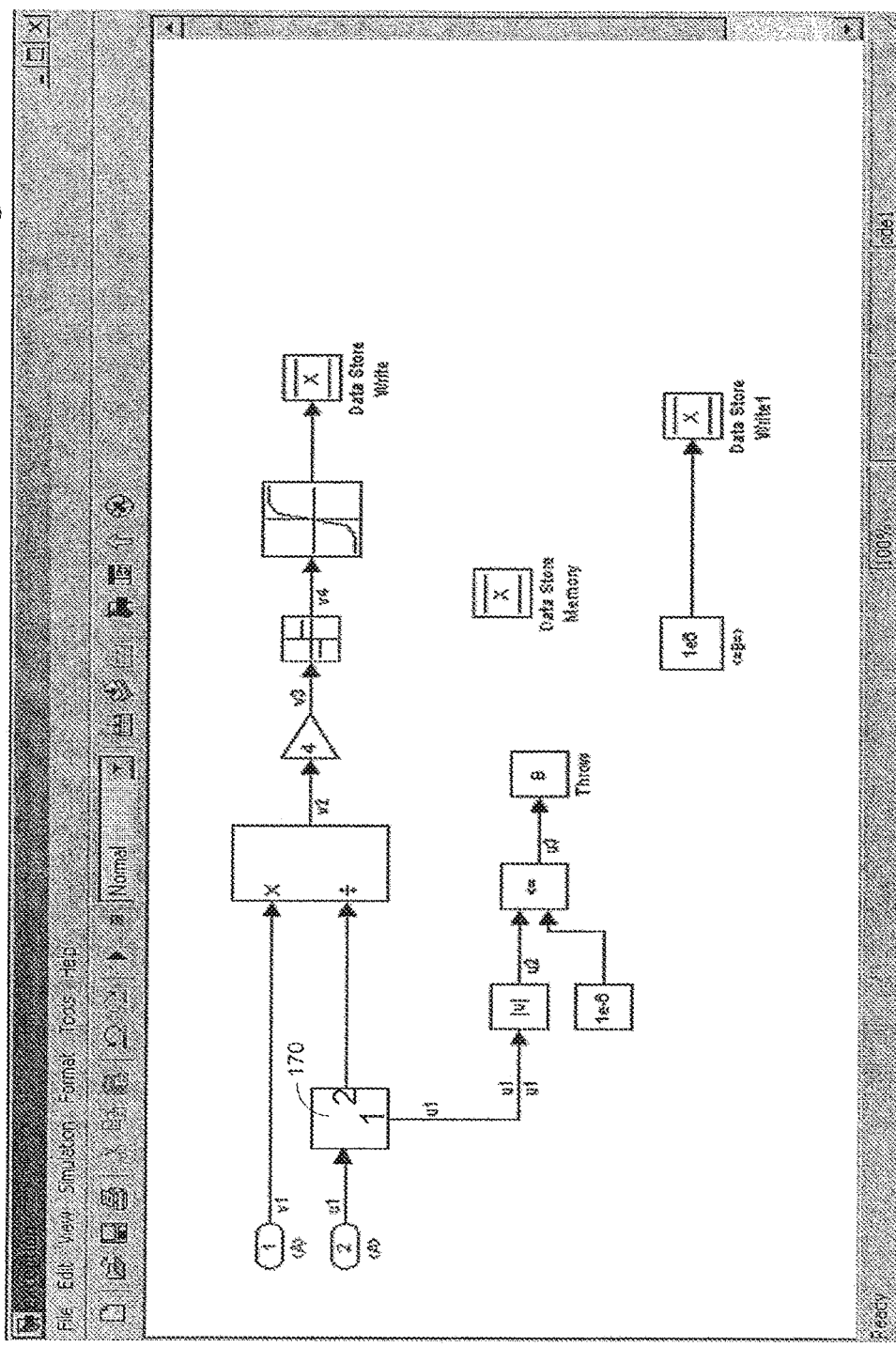
FIG. 7B is a schematic illustration of a model utilizing the illustrative embodiment of the present disclosure to control execution order using a branch priority block.
Figure 7C:
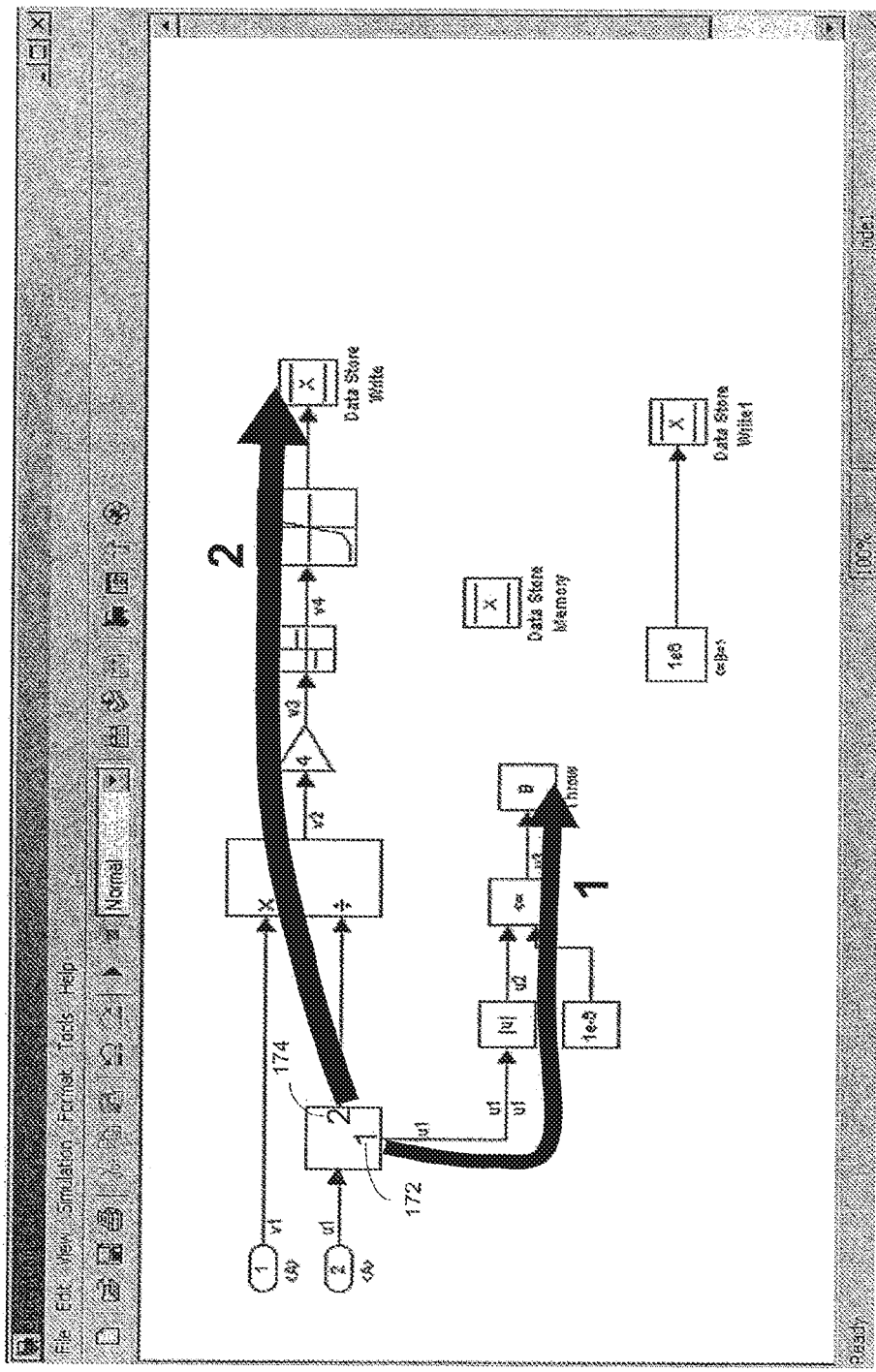
FIG. 7C is a schematic illustration highlighting the execution order dictated by the branch priority block in the model of FIG. 7B.

An alternative mechanism to the use of an atomic subsystem for controlling execution order is to assign the priority of branches leaving a block, and then all blocks in a branch inherit the priority of that branch when such inheritance is unique and unambiguous. FIG. 7B shows the placement of a "Branch Priority Block" 170 that specifies that blocks in the lower branch should execute prior to blocks in the upper branch. FIG. 7C indicates the execution order dictated by the Branch Priority Block 170 of FIG. 7B. The number "1" (172) in the Branch Priority Block 170 indicates that the lower branches should execute first. The number "2" in the Branch Priority Block 170 indicates that the upper branch should execute second.

Figure 7D:
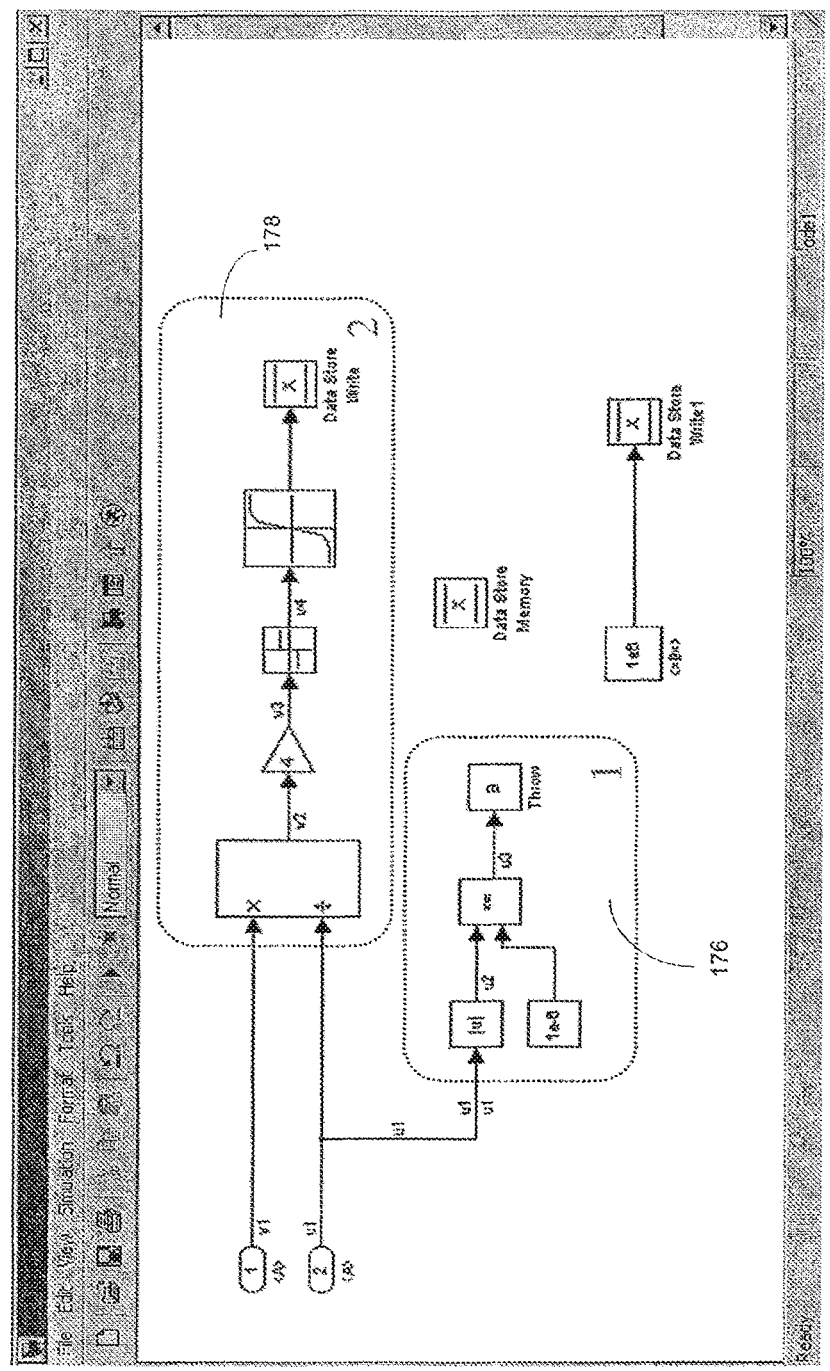
FIG. 7D is a schematic illustration of a model utilizing the illustrative embodiment of the present disclosure to control execution order with block groups.

An additional alternative to the use of an atomic subsystem for controlling execution order is depicted in FIG. 7D. FIG. 7D depicts the use of "block groups". The blocks in Group 1 (176) will appear before the blocks in Group 2 (178) in the sorted block list.

In the diagram on the left in FIG. 8 showing a normal posting process for two events, the execution of a model (step 180) triggers Event A (step 182). During the execution of Event A, Event B occurs normally and is handled (step 184). Following the handling of Event B (step 184), the handling of Event A (step 182) is resumed. Following the completion of the execution of Event A (step 182) control is returned to the point in model execution prior to the occurrence of Event A (step 180).

In the diagram on the right in FIG. 8 showing an exception posting process for two events, the execution of a model (step 190) triggers Event A (step 192). During the execution of Event A (step 192), Event B occurs exceptionally and is handled (step 194). Because Event B was handled exceptionally, control passes back to the point in model execution that existed prior to the occurrence of Event A (step 190) without the handling of Event A resuming.

The "early return" associated with an exception event can also help prevent computations downstream from a signal involved in an error condition from uselessly executing. For example, in the example of FIG. 7, the check for the magnitude of u1 occurs as part of the atomic subsystem executing before the product block and blocks downstream from the product block. Because of the early return from the interrupted event, those blocks are spared from (useless) execution if Event B is thrown.

As discussed above, an event may be posted normally or exceptionally. The Post block may be used to post an event normally, while the Throw block may be used to post an event exceptionally. In addition, a user-specified S-Function API can be used to post an event normally or exceptionally. A model component may handle the event when it is thrown normally, or when it is thrown exceptionally, but not both cases. A block's sample time may be specified as 'A' to indicate that it handles Event A when posted normally, or 'A.exception' to indicate that it handles Event A when posted exceptionally. A block with sample time A does not handle Event A when it is posted exceptionally, and a block with sample time A.exception does not handle Event A when it is posted normally.

Explicit events posted exceptionally should have a nonempty handler; there should be at least one block in the model handling the event exceptionally. If this is not the case, an error may be raised. This requirement is justified by the recognition that an explicit exception event is posted by the model components the user has taken the time to create, and that such an event should be handled by the model. Implicit events are posted normally if there is a nonempty handler. If no model component is handling the implicit event posted normally, the event is posted exceptionally instead. A Throw block may repost an event that it is handling normally as an exception event. This scenario may be utilized when success handling the event normally is not guaranteed. Following an initial attempt, the event may be handled exceptionally.

Figure 9:
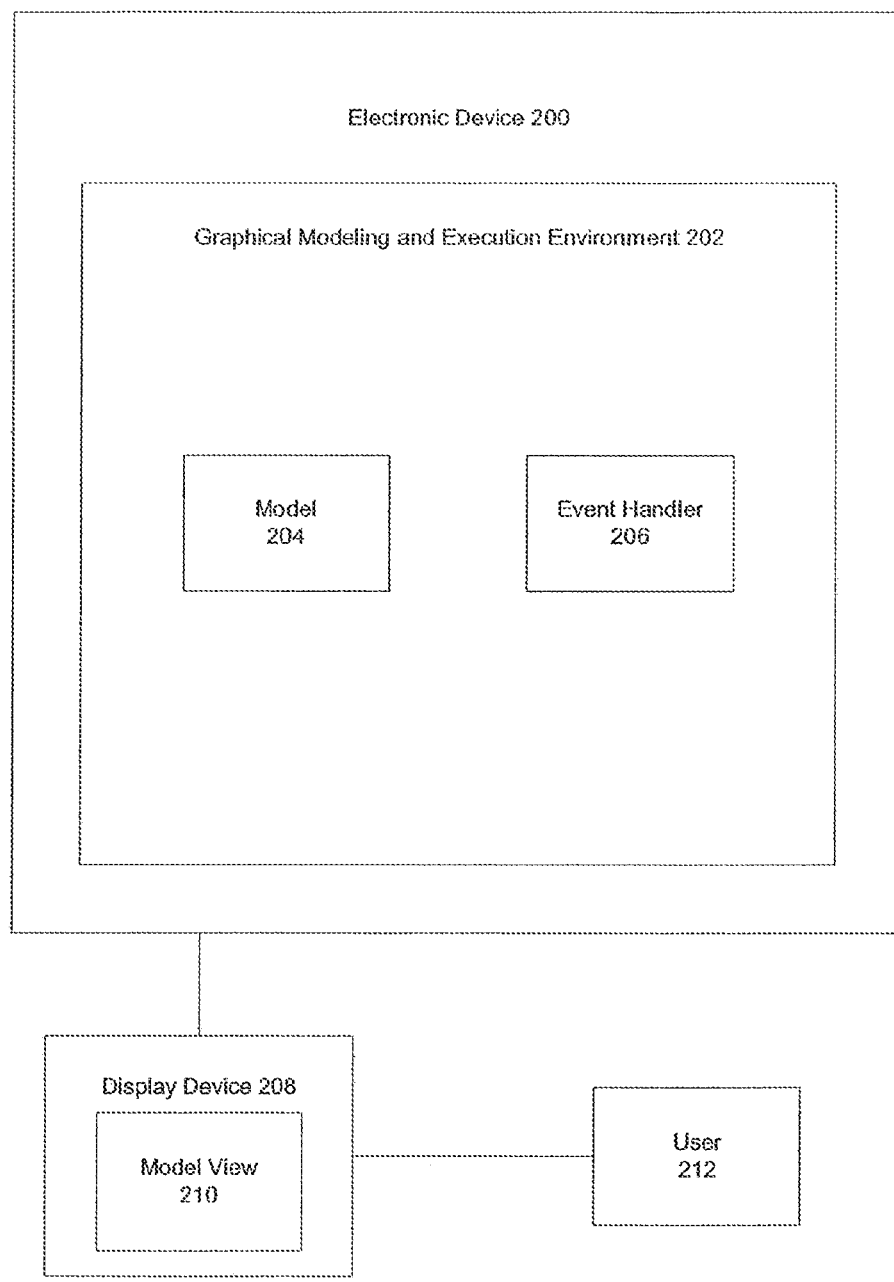
FIG. 9 is a schematic illustration of an environment suitable for practicing the illustrative embodiment of the present disclosure.

FIG. 9 depicts an environment suitable for practicing illustrative embodiments of the present disclosure. An electronic device 200 holds a graphical modeling and execution environment 202 such as the Simulink® or Stateflow® applications. The electronic device 200 may be a workstation or server, laptop, PDA, network attached appliance, or some other digital electronic device capable of supporting the graphical modeling and execution environment 202. The graphical modeling and execution environment 202 includes at least one graphical model 204 and an event handler 206 as discussed above. The electronic device 200 is interfaced with a display device 208 which displays a view 210 of the model 204 for a user 212. The display device 208 and user 212 may be located locally or remotely to the electronic device 200. Those skilled in the art will recognize there are many different possible software and hardware configurations within the scope of the present disclosure.

Figure 10:
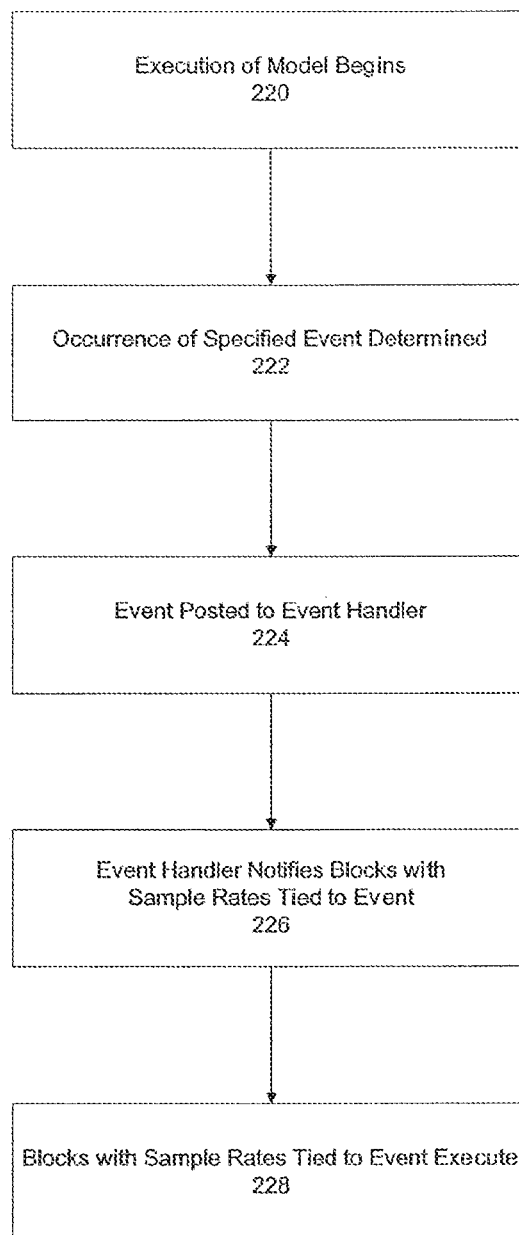
FIG. 10 is a flowchart of a high level view of the sequence of steps followed by the illustrative embodiment of the present disclosure to associate sample rates with event occurrence.

One high level sequence of steps followed by illustrative embodiments of the present disclosure is shown in FIG. 10. The sequence begins with the execution of the model 204 in the graphical modeling and execution environment 202 (step 220). The occurrence of a previously specified event during the execution of the model is then determined (step 222). The event occurrence is posted to the event handler 206 (step 224). The event handler may notify the registered blocks whose sample rates are tied to the occurrence of the event (step 226). Following notification, the blocks whose sample rates are tied to the event occurrence may execute (step 228).

Figure 11A:
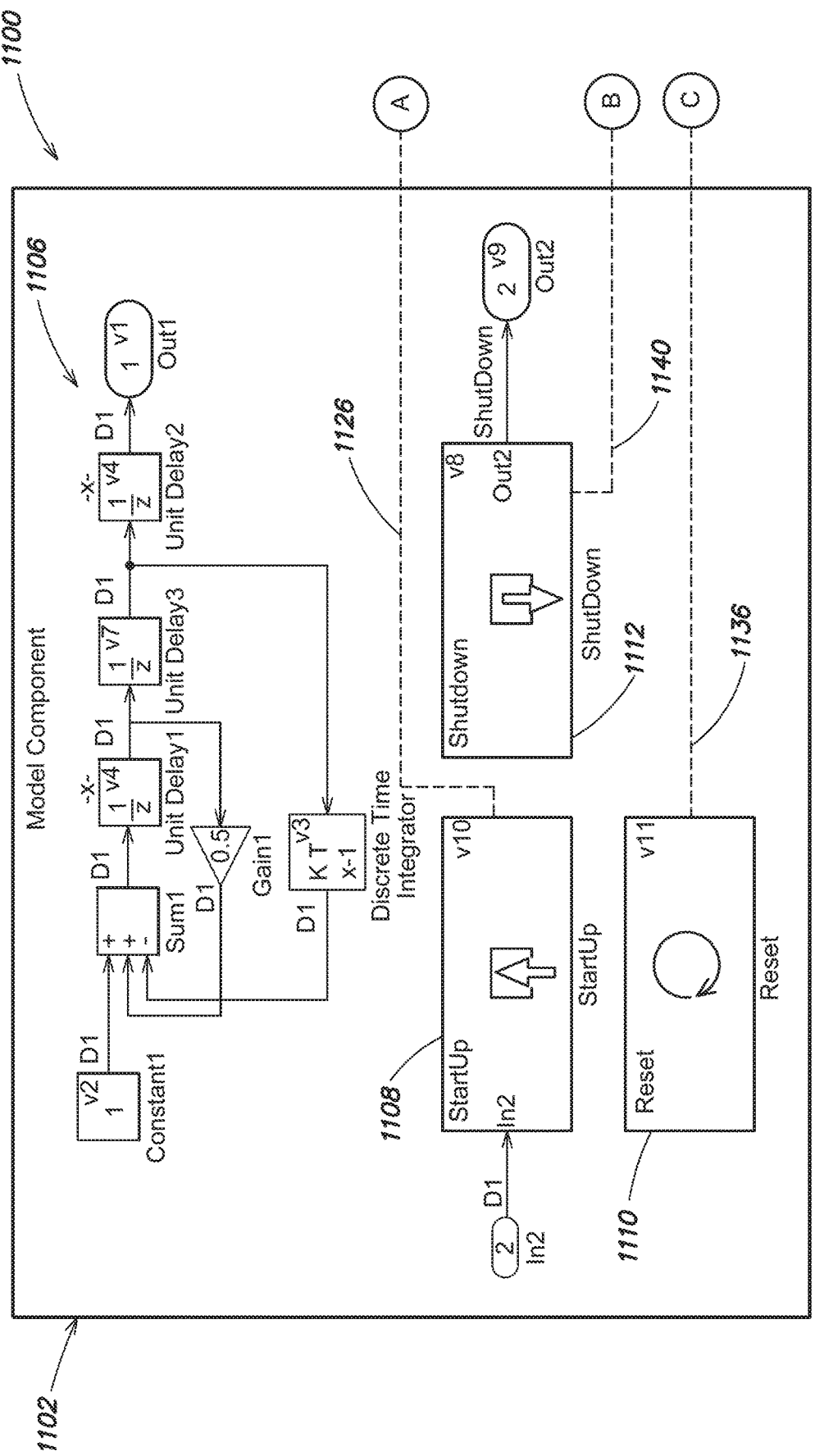
FIGS. 11A and 11B are partial views of a schematic illustration showing an association between a model component and an executable form of the model component in accordance with an embodiment.
Figure 11B:
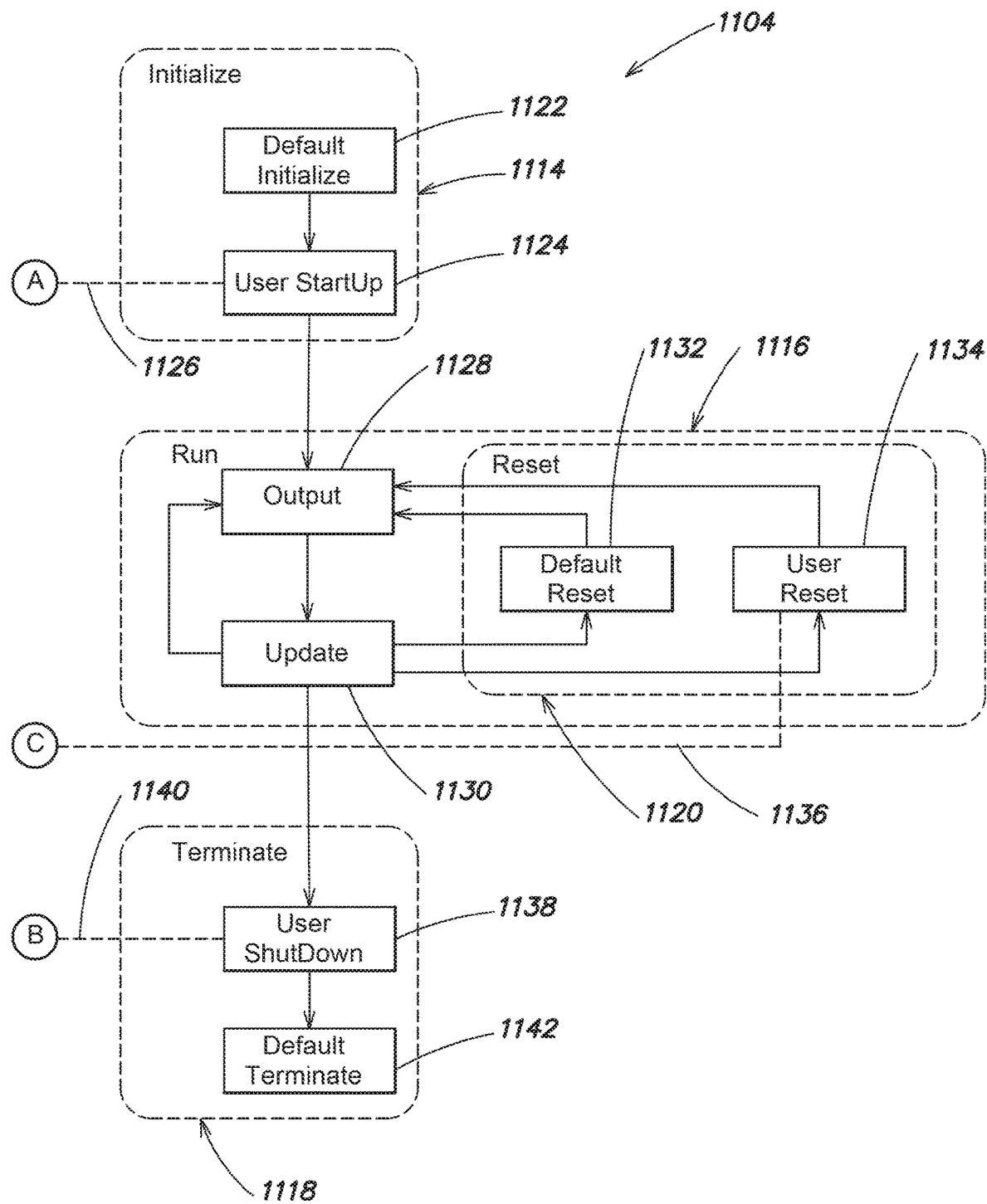

FIGS. 11A and 11B are partial views of a schematic illustration of an association 1100 between a model component 1102 and a portion of an in-memory executable form 1104 produced for the model component 1102. The executable form 1104 may be produced by a simulation engine of a modeling environment. The model component 1102 may include a run-time portion 1106 that may model the operation of a dynamic system, such as a controller or other system. The run-time portion 1106 may include a plurality of model elements, such as blocks, interconnected by connection elements, such as arrows. The model elements or blocks may represent equations computations that may be implemented as block methods. The block methods may be evaluated, e.g., executed, during model execution. The user may also include an initialization subsystem 1108, a reset subsystem 1110, and a termination subsystem 1112 within the model component 1102 in order to define user-specified operations to be executed during initialization, reset, and termination phases of the model component 1102. The initialization subsystem 1108 may include user-specified operations to be performed during initialization of the model component 1102. The reset subsystem 1110 may include user-specified operations to be performed during a reset of the model component 1102. The termination subsystem 1112 may include user-specified operations to be performed during termination of the model component 1102. Initialization, reset, and termination of the model component 1102 may occur as part of initialization, reset, and termination of a model that includes the model component 1102. The operations included in the initialization subsystem 1108, the reset subsystem 1110, and the termination subsystem 1112 may be specified by the user graphically, e.g., through model elements, and/or textually.

Implicit initialization, reset, and termination operations automatically defined by the modeling environment may not be included or represented in the initialization, reset, and termination subsystems 1108, 1110, and 1112.

In some embodiments, the initialization subsystem 1108, the reset subsystem 1110, and the termination subsystem 1112 may be implemented as conditionally executed subsystems. For example, the initialization subsystem 1108, the reset subsystem 1110, and the termination subsystem 1112 may be implemented as triggered subsystems that execute once each time a respective trigger event occurs. The trigger event for the initialization subsystem 1108 may be an initialization event. The trigger event for the reset subsystem 1110 may be a reset event. The trigger event for the termination subsystem 1112 may be a termination event.

It should be understood that the initialization subsystem 1108, the reset subsystem 1110, and/or the termination subsystem 1112 may be implemented in other ways.

A model analyzer of a modeling environment may analyze the model component 1102, and identify the implicit and user-specified (explicit) operations to be executed at initialization, reset, and termination. An organizing engine may organize the implicit and explicit operations included in the in-memory executable form 1104 produced for the model component 1102. The executable form 1104 for the model component 1102 may include an initialize portion 1114, a run portion 1116 and a terminate portion 1118. The run portion 1116 may include a reset portion 1120. The initialize portion 1114 may include default initialize operations 1122, which may be implicit operations specified by the modeling environment. The initialize portion 1114 also may include user startup operations 1124, which may implement the operations specified by the user in the initialization subsystem 1108 of the model component 1102, as indicated by dashed line 1126. The organizing engine may arrange the user startup operations 1124 to execute after the default initialize operations 1122.

The run portion 1116 may include output methods 1128 and update methods 1130 for the model elements included in the run-time portion 1106 of the model component 1102. The reset portion 1120 may include default reset operations 1132, which may be implicit operations specified by the modeling environment. In addition, the reset portion 1120 may include user reset operations 1134, which may implement the operations specified by the user in the reset subsystem 1110 of the model component 1102, as indicated by dashed line 1136. The organizing engine may arrange the user reset operations 1134 to execute after the default reset operations 1132.

The terminate portion 1118 may include user shutdown operations 1138, which may implement the operations specified by the user in the termination subsystem 1112 of the model component 1102, as indicated by dashed line 1140. The terminate portion 1118 also may include default terminate operations 1142, which may be implicit operations specified by the modeling environment. The organizing engine may arrange the user shutdown operations 1138 to execute before the default terminate operations 1142.

The model component 1102 may be included in a model and/or in another model component, which may be included in a model. The model component 1102 may thus exist at a lower hierarchical level relative to a model's top-level or relative to another model component. The top-level model and/or model component that includes the model component 1102 may also include implicit and explicit initialization, reset, and termination operations. The organizing engine may aggregate the implicit and explicit initialization, reset, and termination operations defined for the model component 1102 with implicit and explicit initialization, reset, and termination operations defined at higher hierarchical levels than the model component 1102. In some implementations, some of the implicit and explicit initialization, reset, and termination operations may not be aggregated.

Figure 12:
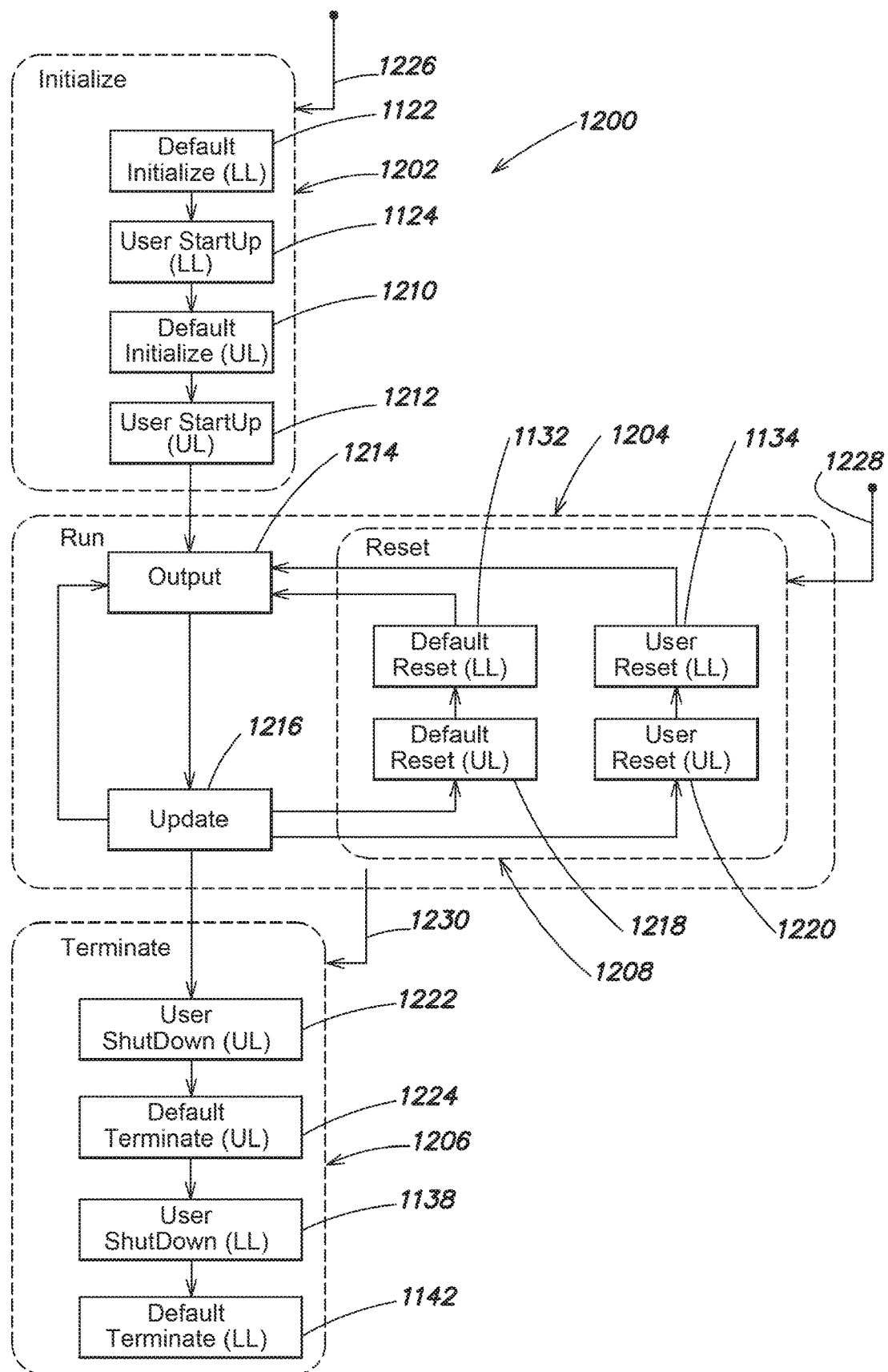
FIG. 12 is a schematic illustration of an example executable form of a model or a model component in accordance with an embodiment.

FIG. 12 is a schematic illustration of an example of a portion of an in-memory executable form 1200 produced by a modeling environment for a model or a model component that includes the model component 1102. The executable form 1200 may include an initialize portion 1202, a run portion 1204 and a terminate portion 1206. The run portion 1204 may include a reset portion 1208. The initialize portion 1202 may include the default initialize operations 1122 and the user startup operations 1124 of the model component 1102. The initialize portion 1202 also may include default initialize operations 1210 and user startup operations 1212 associated with the model or model component that includes the model component 1102. The model component 1102 may be at a lower level (LL) of the model hierarchy, and the model or model component that includes the model component 1102 may be at an upper level (UL) of the model hierarchy.

The run portion 1204 may include output methods 1214 and update methods 1216. The reset portion 1208 may include the default reset operations 1132 and the user reset operations 1134 associated with the model component 1102.

The reset portion 1208 also may include default reset operations 1218 and user reset operations 1220 associated with the model or model component that includes model component 1102.

The terminate portion 1206 may include the user shutdown operations 1138 and the default terminate operations 1142 of the model component 1102. The terminate portion 1206 also may include user shutdown operations 1222 and default terminate operations 1224 associated with the model or model component that includes the model component 1102.

The organizing engine may arrange the user startup operations 1124 and 1212 to execute after the default initialize operations 1122 and 1210. In addition, the organizing engine may arrange the default initialize operations 1122 and the user startup operations 1124 of a lower hierarchical level to execute before the default initialize operations 1210 and the user startup operations 1212 of a higher hierarchical level. The organizing engine also may arrange the default reset operations 1132 and the user reset operations 1134 of a lower hierarchical level to execute before the default reset operations 1218 and the user reset operations 1220 of a higher hierarchical level. The organizing engine may additionally arrange the user shutdown operations 1222 and the default terminate operations 1224 of a higher hierarchical level to execute before user shutdown operations 1138 and default terminate operations 1142 of a lower hierarchical level.

The initialize portion 1202, the reset portion 1208 and the terminate portion 1206 may be implemented as individual callable units. Furthermore, the organizing engine may define one entry point indicated at 1226 for the initialize portion 1202 that includes operations 1122, 1124, 1210, and 1212 to be executed at model initialization. The organizing engine may define another entry point indicated at 1228 for the reset operations 1132, 1134, 1218, and 1220 to be executed during a model reset. The organizing engine may define yet another entry point indicated at 1230 for the operations 1222, 1224, 1138, and 1142 to be executed at model termination.

The organizing engine may utilize one or more rules for organizing, aggregating and arranging initialize, reset, and termination operations. For example, as indicated at FIGS. 11 and 12, the organizing engine may place user specified operations to be executed at model initialization after the implicit operations that are executed at model initialization. Similarly, the organizing engine may place user specified operations to be executed at model reset after implicit operations that are executed at model reset. In addition, the organizing engine may place user specified operations before implicit operations that are executed at model termination. Furthermore, the organizing engine may place default initialize and user startup operations for a lower hierarchical level to execute before default initialize and user startup operations for a higher hierarchical level. The organizing engine may place default reset and user reset operations for a lower hierarchical level to execute before default reset and user reset operations for a higher hierarchical level. The organizing engine may place user shutdown and default terminate operations of a higher hierarchical level to execute before user shutdown and default terminate operations of a lower hierarchical level.

In some implementations, the ordering may be different. In addition, multiple user defined operations may be defined for each of the phases. For example, a first user defined reset may be placed before the default reset, and then a second user defined reset may be placed after the default reset.

Figure 13:
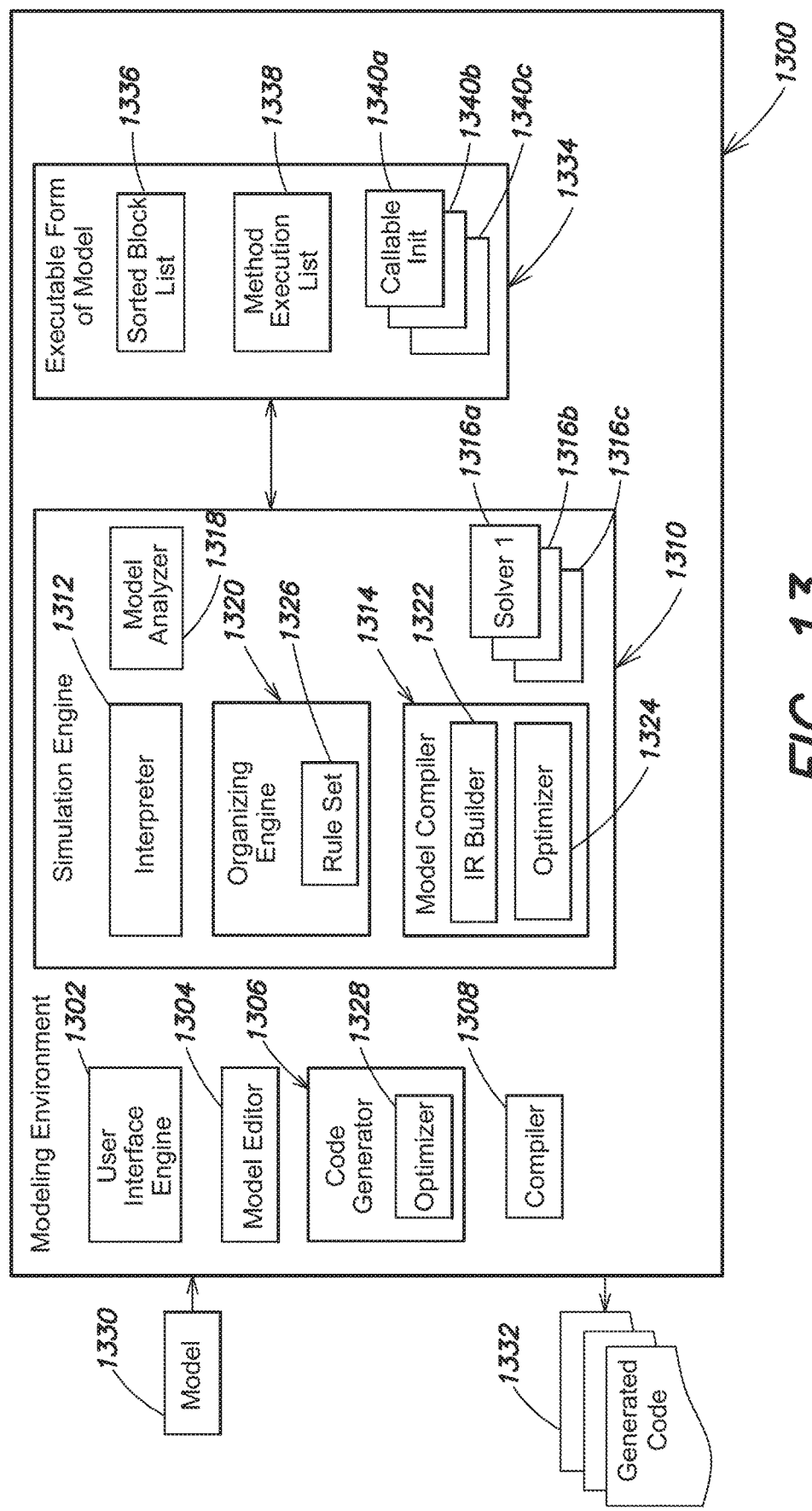
FIG. 13 is a partial, schematic illustration of an example modeling environment in accordance with an embodiment.

FIG. 13 is a partial, schematic illustration of an example modeling environment 1300 in accordance with an embodiment. The modeling environment 1300 may include a User Interface (UI) engine 1302, a model editor 1304, a code generator 1306, a compiler 1308, and a simulation engine 1310. The UI engine 1302 may create and present one or more User Interfaces (UIs), such as Graphical User Interfaces (GUIs) and/or Command Line Interfaces (CLIs), on the display of a workstation, a laptop, a hand-held device, such as a mobile phone or a tablet, or other data processing device. The GUIs and CLIs may provide a user interface to the modeling environment 1300, such as a model editing window. The model editor 1304 may perform selected operations on a model, such as open, create, edit, and save, in response to user inputs or programmatically.

The simulation engine 1310 may include an interpreter 1312, a model compiler 1314, one or more solvers, such as solvers 1316-$c$, a model analyzer 1318, and an organizing engine 1320. The model compiler 1314 may include one or more Intermediate Representation (IR) builders, such as IR builder 1322, and an optimizer 1324. In some implementations, one or more IR builders may be included or associated with the solvers 1316. The organizing engine 1320 may include or have access to one or more rules, which may be organized into one or more rule sets, such as rule set 1326.

The code generator 1306 also may include an optimizer 1328.

In some embodiments, the rule set 1326 may incorporate one or more of the following rules:

1. during initialization phase, at a given hierarchical level, user-specified (explicit) code executes after system-generated (implicit) code. As a result, the explicit initialization, if there is any, overrides the implicit initialization;
2. during initialization phase, parent component initialization code (explicit and/or implicit) executes after child component initialization code (explicit and implicit). As a result, initialization(s) of parent component, if there is any, overrides initialization(s) of child component;
3. during reset phase, at a given hierarchical level, user-specified (explicit) code executes after system-generated (implicit) code. As a result, the explicit reset, if there is any, overrides the implicit reset;
4. during reset phase, parent component reset code (explicit and/or implicit) executes after child component reset code (explicit and implicit). As a result, reset(s) of parent component, if there is any, overrides reset(s) of child component;
5. during termination phase, at a given hierarchical level, user-specified (explicit) code executes before system-generated (implicit) code. As a result, implicit termination overrides explicit termination; or
6. during termination phase, parent component termination code (explicit and/or implicit) executes before child component termination code (explicit and/or implicit). As a result, termination(s) of child component, if there is any, overrides termination(s) of parent component.

The modeling environment 1300 may access a computer-based, executable graphical model, such as model 1330. The model compiler 1314 of the simulation engine 1310 may generate an in-memory executable form 1334 of the model 1330, which may be executed within the modeling environment 1300, for example by the interpreter 1312. Simulation of a model may include generating and solving a set of equations, and may involve one or more of the solvers

1316*a-c*. Exemplary solvers include one or more fixed-step continuous time solvers, which may utilize numerical integration techniques, and one or more variable-step solvers, which may for example be based on the Runge-Kutta and Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the *Simulink User's Guide* from The MathWorks, Inc. (March 2016 ed.)

The executable form 1334 of the model may include a sorted block list 1336, a method execution list 1338, and a plurality of callable units 1340*a-c*.

The code generator 1306 may generate code, such as generated code 1332, for the model 1330. For example, the user interface engine 1302 may provide or support a Code Generation button in a GUI that may be selected by the user, or the user interface engine 1302 may receive a code generation command entered by the user, e.g., in the GUI or the CLI. The code generation command also may be invoked programmatically, for example, when a particular event occurs. In response to the code generation command being activated, the code generator 1306 may generate code, such as the code 1332, for the model 1330. The behavior of the generated code 1332 may be functionally equivalent to the behavior of the executable model 1330.

The generated code 1332 may be textual code, such as textual source code, that may be compiled, for example by the compiler 1308, and executed on a target machine or device, which may not include a modeling environment and/or a simulation engine. The generated code 1332 may conform to one or more programming languages, such as Ada, Basic, C, C++, C#, SystemC, FORTRAN, VHDL, Verilog, embedded MATLAB, a vendor or target specific HDL code, such as Xilinx FPGA libraries, assembly code, etc. The generated code 1332 may include header, main, make, and other source files. The compiler 1308 may compile the generated code for execution by target hardware, such as a microprocessor, a Digital Signal Processor (DSP), etc. In some embodiments, the generated code 1332 may be accessed by a hardware synthesis tool chain, which may configure a programmable hardware device, such as a Field Programmable Gate Array (FPGA), a System on a Chip (SoC), etc., from the generated code 1332. The model 1330 and the generated code 1332 may be stored in memory, e.g., persistent memory, such as a hard drive or flash memory, of a data processing device. The modeling environment 1300 may be loaded into and run from the main memory of a data processing device.

In some implementations, the code generator 1306 and/or the compiler 1308 may be separate, such as separate application programs, from the modeling environment 1300. The code generator 1306 and/or the compiler 1308 may also be run on different data processing devices than the data processing device running the modeling environment 1300. In such embodiments, the code generator 1306 may access the model 1330, which may be stored in memory in the form of one or more files, and generate the code 1332 for the model 1330.

In some embodiments, one or more of the user interface engine 1302, the model editor 1304, the code generator 1306, the compiler 1308, and the simulation engine 1310 may be implemented through one or more software modules or libraries containing program instructions that perform the methods described herein. The software modules may be stored in a memory, such as a main memory, a persistent memory and/or a computer readable media, of a workstation, server, or other data processing machine or device, and executed by one or more processors. Other computer readable media may also be used to store and execute these program instructions, such as non-transitory computer readable media, including optical, magnetic, or magneto-optical media. In some embodiments, one or more of the user interface engine 1302, the model editor 1304, the code generator 1306, the compiler 1308, and the simulation engine 1310 may comprise hardware registers and combinational logic configured and arranged to produce sequential logic circuits. In some embodiments, various combinations of software and hardware, including firmware, may be utilized to implement the described methods.

Figure 14A:
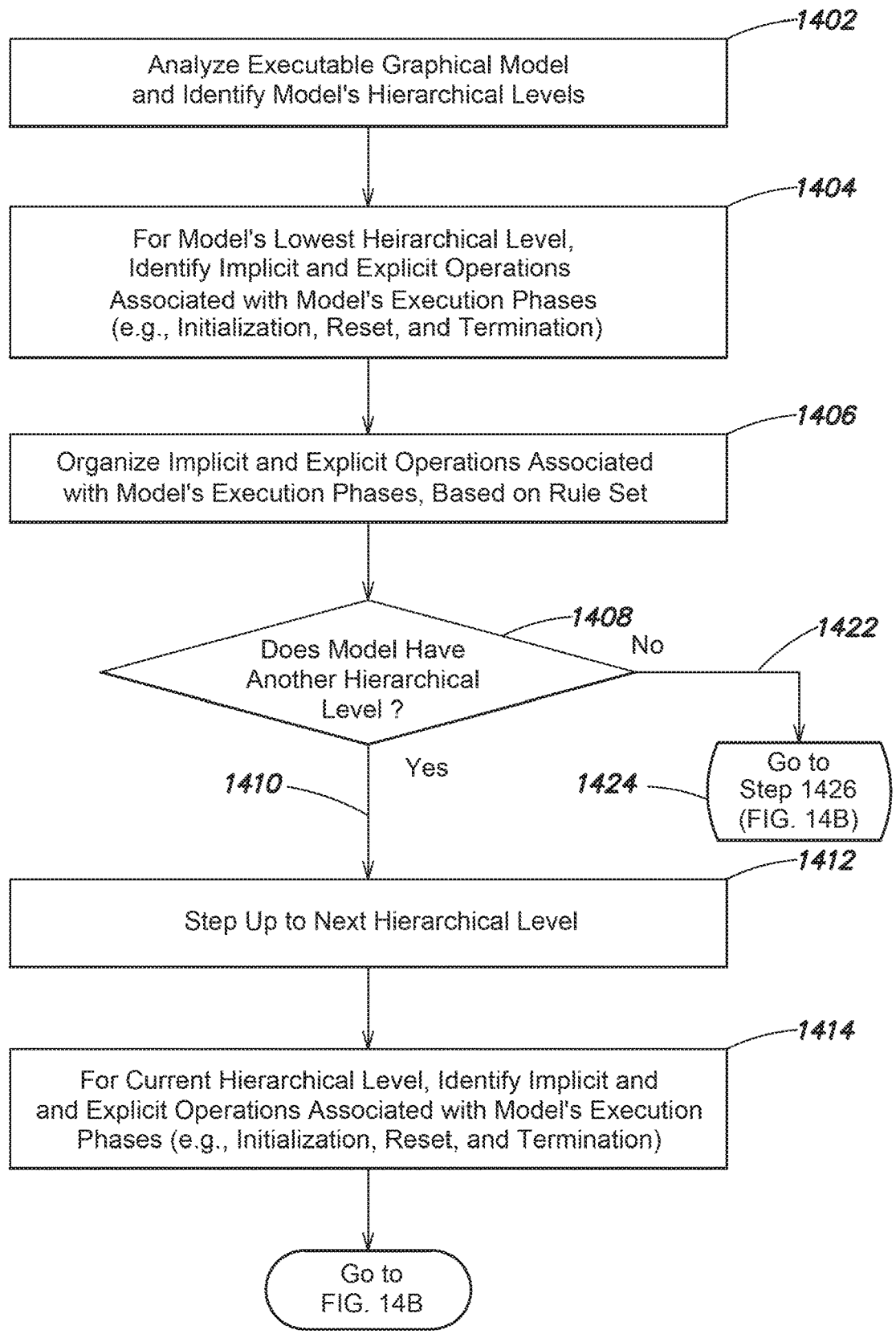
FIGS. 14A and 14B are partial views of a flow diagram of an example method in accordance with an embodiment.
Figure 14B:
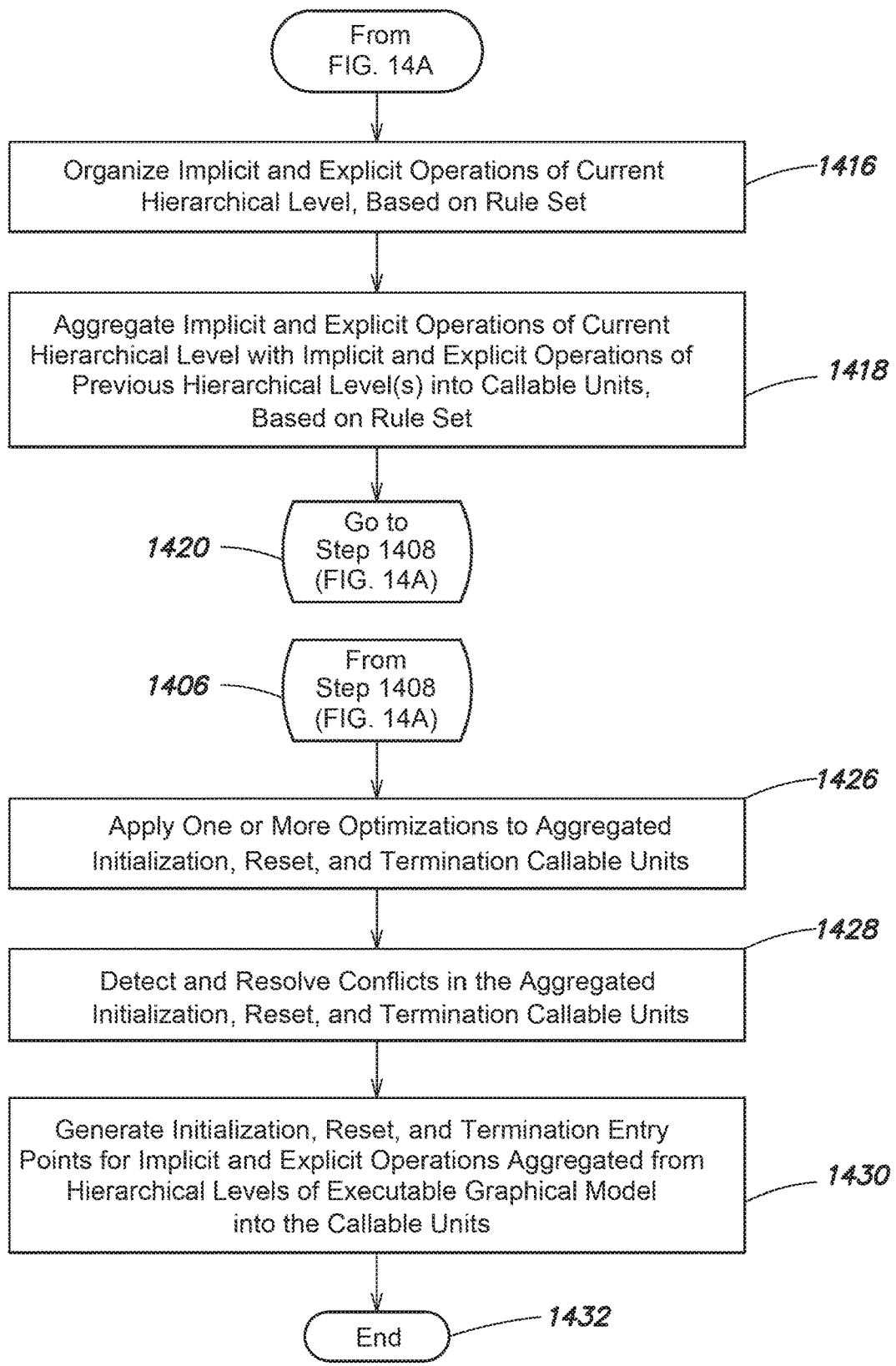

FIGS. 14A and 14B are partial views of a flow diagram of an example method in accordance with an embodiment. The model analyzer 1318 may access and analyze a model, such as the model 1330, e.g., to identify the model's hierarchical levels. The analysis may include analyzing the model's connectivity structure, as indicated at step 1402. The connectivity structure may be determined from data and/or control dependencies among model elements and model components. In some embodiments, the model analyzer 100 may construct a graph, such as a directed graph, that represents the connectivity structure of the model 1330. The graph may include nodes representing model elements of the model, and edges representing the connection elements of the model. In some embodiments, the graph may include special nodes that represent components, such as subsystems, sub-models, etc. The special nodes may be implemented as additional graphs that represent the connectivity structures of the respective components of the model 1330. In some embodiments, such special nodes may be removed, and the graph representing the model 1330 may be flattened.

Starting at the model's lowest hierarchical level, the organizing engine 1320 may identify implicit and explicit operations associated with different execution phases, such as initialization, reset, and termination, as indicated at step 1404. The organizing engine 1320 may organize the implicit and explicit operations, as indicated by the rule set 1326, as indicated at step 1406. For example, the organizing engine 1320 may group together implicit and explicit operations to be executed during initialization, and may schedule the implicit operations to execute before the explicit operations, e.g., based on the rules of the rule set 1326. Similarly, the organizing engine 1320 may group together implicit and explicit operations to be executed during a reset phase, and may schedule the implicit operations to execute after the explicit operations. The organizing engine 1320 may group together implicit and explicit operations to be executed during termination, and may schedule the explicit operations to execute before the implicit operations. In some implementations, some of the implicit and explicit operations may not be aggregated.

The organizing engine 1320 may determine whether the model has another hierarchical level directly above the current level, as indicated at decision block 1408. If there is a next higher hierarchical level, the organizing engine 1320 may move to that hierarchical level, as indicated by Yes arrow 1410 leading to step 1412. For the current hierarchical level, the organizing engine 1320 may identify implicit and explicit operations associated with the model's execution phases, e.g., initialization, reset, and termination, as indicated at step 1414. The organizing engine 1320 may organize the implicit and explicit operations, as indicated by the rule set 1326, as indicated at step 1416 (FIG. 14B). Again, the organizing engine 1320 may group together implicit and explicit operations to be executed during initialization, and may schedule the implicit operations to execute before the explicit operations, e.g., based on the rules of the rule set 1326. Furthermore, the organizing engine 1320 may group together implicit and explicit operations to be executed during a reset phase, and may schedule the implicit operations to execute after the explicit operations. The organizing engine 1320 may group together implicit and explicit operations to be executed during termination, and may schedule the explicit operations to execute before the implicit operations.

The organizing engine 1320 may also aggregate implicit and explicit operations of previously analyzed, e.g., lower, hierarchical levels with the implicit and explicit operations of the current hierarchical level into callable units, for example into the callable units 1340 included in the executable form 1334 of the model, as indicated at step 1418. The aggregation may be performed according to the rule set 1326. For example, the organizing engine 1320 may generate one or more initialization callable units, one or more reset callable units, and one or more termination callable units. In some implementations, the callable units may be subroutines, procedures, functions, routines, methods, and/or subprograms.

In some embodiments, the rules of the rule set 1326 may specify that the implicit and explicit operations of the current hierarchical level that are associated with initialization and reset may be scheduled to execute after implicit and explicit operations of the next lower (child) hierarchical level that are associated with initialization and reset. Implicit and explicit operations of the current hierarchical level associated with termination may be scheduled to execute before implicit and explicit operations of the next lower (child) hierarchical level that are associated with termination.

As indicated by Go To step 1420, processing may then return to decision step 1408 (FIG. 14A). Steps 1412-1420 may be repeated until the operations at the top-level of the model are processed, thereby processing all of the model's hierarchical levels. As indicated by No arrow 1422 and Go To step 1424, the optimizer 1324 may apply one or more optimizations to the one or more initialization callable units, the one or more reset callable units, and/or the one or more termination callable units, as indicated at step 1426 (FIG. 14B). For example, the optimizer 1324 may search for and remove redundant instructions that may be present in the callable units 1340, which includes both implicit and explicit operations. Suppose for example, an implicit initialization operation initializes a block's state to a value of 0.5. Suppose further, an explicit initialization operation initializes the same block state to a value of 0.5. The optimizer 1324 may remove one of these redundant operations from the initialization callable unit, thereby resulting in a more optimized executable. Other exemplary optimizations include for-loop fusion, expression folding, and buffer reduction.

The organizing engine 1320 may detect and resolve conflicts in the callable units, based on the rule set 1326, as indicated at step 1428. Examples of conflicts may include conflicts in the setting of initialization values, conflicts in the settings of model element parameters, etc. Suppose, an implicit initialization operation initializes a block state to a value of 0.5. Suppose further, an explicit initialization operation initializes the same block state to a value of 1.75. The rule set 1326 may include one or more rules indicating that explicit operations have priority over implicit operation in the case of conflicts. Accordingly, the organizing engine 1320 may remove the implicit operation that initializes the block state to 0.5 from the initialization callable unit. The rule set may also include one or more rules indicating that explicit operations at a first hierarchical level have priority over explicit operations at lower hierarchical levels than the first hierarchical level, e.g., a parent level has priority over a child level.

The organizing engine 1320 may provide single entry points for the initialization, reset, and termination callable units, as indicated at step 1430. That is, a single initialization entry point may be created for executing the implicit and explicit operations that are associated with the initialization event, and have been aggregated from all hierarchical levels of the model into the initialization callable unit. Similarly, a single reset entry point may be created for executing the implicit and explicit operations that are associated with the reset event, and have been aggregated from all hierarchical levels of the model into the reset callable unit. Finally, a single entry point may be created for executing the implicit and explicit operations that are associated with the termination event, and that have been aggregated from all hierarchical levels of the model into the termination callable unit. Single entry points allow for execution of the operations organized and aggregated from the same or different hierarchical levels.

Processing may then be complete, as indicated by End step 1432.

As described, the simulation engine 1310 may generate an executable form of model, such as executable form 1334, that includes execution instructions for the model. The generation of execution instructions, and the simulation of a model by the modeling environment 1300 may involve several phases, such as an initialization phase, a simulation (or run) phase, zero, one or more reset phases, and a termination phase. In some implementations, simulation may include initialization, run, reset, and termination phases.

Model execution may involve processing input data and generating output data. In some embodiments, execution of a model may be carried out over a time span, e.g., a simulation time, which may be user specified or machine specified. Simulation time is a logical execution time, and may begin at a simulation start time and end at a simulation end time. At successive points between the simulation start and end times, which points in time may be called simulation time steps, states, inputs and outputs of model elements of the model may be computed. The sizes of the time steps may be fixed or may vary, and may be determined by the particular solver 1316 selected and used in the execution of the model. Execution instructions may be generated by the simulation engine 1310 to execute the model over the entire simulation time.

Initialization Phase

The initialization phase may mark the start of execution of a model, and may include compiling and linking of instructions. Implicit operations of the initialization phase may involve preparing data structures and evaluating parameters, configuring and propagating block characteristics, determining block connectivity, and performing block reduction and block insertion. The preparation of data structures and the evaluation of parameters may result in the creation and initialization of one or more data structures for use in the initialization phase. For the blocks of the model, a method may require the blocks to evaluate all of their parameters, and this method may be called for each block in the model. If there are any unresolved parameters, execution and/or compilation errors may be thrown. During the configuration and propagation of block, port, and signal characteristics, compiled attributes (such as data dimensions, data types, complexity, sample modes, and sample time) of each block, port, and signal may be setup on the basis of the corresponding behaviors and the attributes of the blocks, ports, and signals that are connected to the given block, port, and signal. The attribute setup may be performed through a process during which block behaviors "ripple through" the model from one block to the next following signal, dataflow, control, state, physical, message, or other connectivity.

This process may be referred to as inferencing, an implementation of which is propagation. In the case of a block that has explicitly specified its block (or port) behaviors, propagation helps ensure that the attributes of the block (or port) are compatible with the attributes of the blocks (or ports) connected to it. If not, a warning or an error may be issued by the simulation engine 1310, and presented to a user by the user interface engine 1302. Secondly, in many cases, blocks (or ports) are implemented to be compatible with a wide range of attributes. Such blocks (or ports) may adapt their behavior in accordance with the attributes of the blocks (or ports) connected to them. The exact implementation of the block may be chosen on the basis of the model in which the block finds itself. Included within this step may be other aspects such as validating that all rate-transitions yield deterministic results, and that the appropriate rate transition blocks and/or delay blocks are being used. The initialization phase also may determine block connectivity. For example, virtual blocks may play no semantic role in the execution of a model. In this step, the virtual blocks may be optimized away, e.g., removed, and the remaining non-virtual blocks may be reconnected to each other appropriately. This compiled version of the model with actual block connections may be used from this point forward in the execution process. The way in which blocks are interconnected in the model does not necessarily define the order in which the equations (e.g., included in methods) corresponding to the individual blocks will be solved (executed). These equations may include output equations, derivative equations and update equations.

Block sample times may also be determined during the initialization phase. A block's sample time may be set explicitly, e.g., by setting a SampleTime parameter of the block, or it may be determined in an implicit manner based on the block's type or its context within the model. The SampleTime parameter may be a vector $[T_s, T_o]$ where $T_s$ is the sampling period and $T_o$ is the initial time offset.

The selected solver 1316 may determine the size of the simulation time steps for the simulation of the model, and these simulation time steps may be selected to correspond with the sample times of the blocks of the model. When a simulation time step matches the sample time for a block, a sample time hit occurs, and the block is scheduled for execution during that simulation step.

The solvers 1316a-c may include or access one or more schedulers that may generate execution lists for the blocks of the model. In particular, the schedulers may generate a block sorted order list and a method execution list. The schedulers may utilize one or more algorithms for generating the block sorted order and method execution lists. For example, a static scheduler may use the Rate Monotonic Scheduling (RMS), Earliest Deadline First Scheduling, Static Cyclic Scheduling, Round Robin Scheduling, or Deadline Monotonic Scheduling. A dynamic scheduler may use an event calendar to schedule future events, such as timeouts and alarms.

During the implicit portion of the initialization stage, memory may be allocated and initialized for storing run-time information, such as default values, for blocks of the model.

During the initialization phase, the model analysis and the aggregating and organizing of operations associated with initialization, reset, and termination, as described in the flow diagram of FIGS. 14A and 14B, may be performed. Furthermore, the callable units 1340 for initialization, reset, and termination, may be produced. In addition, the sorted block list 1336 and the method execution list 1338 may be produced. The initialization phase may also include execution of the initialization callable unit, thereby executing the implicit initialization operations and the user-specified initialization operations.

Other implicit or explicit operations that may be performed during initialization include calls to callbacks that that start Analog-to-Digital converters (ADC), Digital-to-Analog converters (DAC), actuators or other hardware or physical elements. Additional initialization operations include loading data from memory, reading sensor data, computing an initial condition, for example based on the sensor data, and setting an initial state of a model or model element, for example based on the computed initial condition.

The initialization phase may occur once.

Run Phase

The run or simulation phase may follow the initialization phase. During the run phase, the simulation engine 1310 may enter a simulation loop or iteration loop stage during which the simulation engine 1310 successively computes the states and outputs of the model elements at particular simulation time steps from the simulation start time to the simulation end time. At each step, new values for the model element's inputs, states, and outputs may be computed, and the model elements may be updated to reflect the computed values. The length of time between steps is called the step size. The step sizes depend on the type of solver 1316 selected and used to simulate the model, the model's fundamental sample time, and whether the model's continuous states have discontinuities, such as zero crossings. The steps of the simulation or iteration loop may be repeated until the simulation end time is reached. At the end of the simulation time, the model reflects the final values of the model element's inputs, states, and outputs.

Reset Phase(s)

In some embodiments, the run phase may include zero, one or more reset phases. A reset phase may include an implicit portion during which system-generated operations may be executed. A reset phase also may include an explicit portion during which user specified (explicit) reset operations may be executed. In some implementations, a reset phase may only include explicit reset operations.

During the run phase, code may or may not be generated for the model. If code is generated, the model may be executed through an accelerated execution mode in which the model, or a portion of it, is translated into either software modules or hardware descriptions. If this stage is performed, then the stages that follow may use the generated code during the execution of the model. If code is not generated, the model may execute in an interpretive mode in which the compiled and linked version of the model may be directly utilized by the simulation engine 1310 to execute the model over the simulation time. A model need not necessarily be executed when code is generated for the model. Instead of executing the model within the modeling environment 1300, the generated code 1332 may be compiled and deployed on a target device, such as a controller, test hardware, etc.

Termination Phase

The termination phase may follow the run phase. During the termination phase, the simulation engine 1310 may perform clean-up operations. For example, the simulation engine 1310 may release allocated memory.

The termination phase may also include user-specified (explicit) termination operations, which may be executed during the termination phase. Exemplary implicit or explicit operations that may be performed during the termination phase include downloading internal memory to persistent memory, such as a Non-Volatile Random Access Memory (NVRAM), turning off ADCs and DACs, and writing data out to data files and closing the data files.

The termination phase may occur once.

Figure 15:
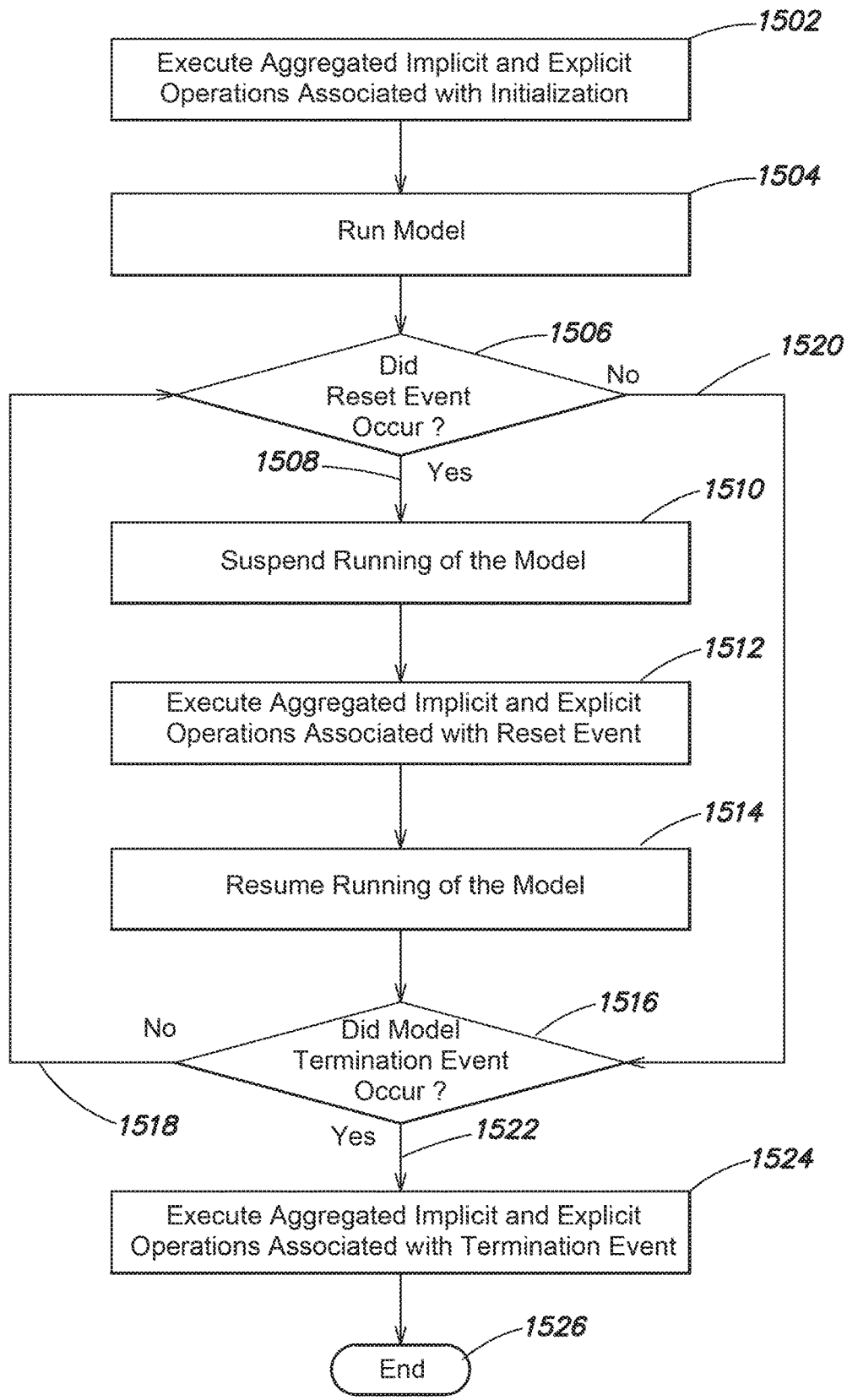
FIG. 15 is a flow diagram of an example method of model execution in accordance with an embodiment.

FIG. 15 is a flow diagram of an example method of model execution in accordance with an embodiment. Execution of a model may start with an initialization phase at which aggregated implicit and explicit initialization operations are executed, as indicated at step 1502. The aggregated implicit and explicit initialization operations may be executed in response to an event, such as an initialization event. It should be understood that the initialization event may be triggered in a number of different ways. For example, the initialization event for a model may be user-specified. In some embodiments, a model may include an initialization port, and one or more model elements and/or model components may be selected and connected to the initialization port by the user. The one or more model elements and/or model components may specify functionality that determines when the initialization event for the model occurs. Alternatively, the occurrence of an initialization event may be specified by a user through one or more textual commands. In other implementations, the initialization event may be programmatically determined, for example by the simulation engine 1310. For example, the simulation engine 1310 may issue an initialization event at the start of a model's execution.

Execution may next involve a run phase, during which the model is executed or simulated, as indicated at step 1504. As noted, the simulation of a model may include zero, one or more reset phases, and a termination phase. For example, during the run phase, the simulation engine 1310 may determine whether a reset event occurs, as indicated at decision step 1506. A reset event may be user-specified. In some embodiments, a reset event may not occur programmatically. For example, a model or model component may include a reset port to which one or more model elements or components may be connected. The one or more model elements or components may specify functionality for issuing the reset event. If a reset event has occurred, the simulation engine 1310 may suspend the running of the model, as indicated by Yes arrow 1508 leading to step 1510. The simulation engine 1310 may execute aggregated implicit and explicit reset operations, as indicated at step 1512. Execution of the model may then resume, as indicated at step 1514.

The simulation engine 1310 may determine whether a termination event occurred, as indicated at decision step 1516. A termination event may be user-specified or may occur programmatically. For example, the simulation engine 1310 may issue a termination event when the simulation end time is reached. In some implementations, a model or model component may include a termination port to which one or more model elements or model components may be connected. The one or more model elements or components may specify functionality for issuing the termination event. If a termination event has not occurred, e.g., the simulation end time has not yet been reached, processing may return to decision step 1506, as indicated by No arrow 1518. If another reset event occurs, then steps 1510-1514 may be performed. Otherwise, a determination may be made if a termination event has occurred, as indicated by No arrow 1520 leading to decision step 1516. If a termination event occurs, the simulation engine may execute the aggregated implicit and explicit termination operations, as indicated by Yes arrow 1522 leading to step 1524. Model execution may then be complete, as indicated by End step 1526.

It should be understood that FIG. 15 is meant for illustrative purposes only, and that model execution may occur differently in different embodiments, such as different modeling environments. For example, one or more reset phases may follow the termination phase of a model.

In some embodiments, the initialize event, the reset event, and the terminate event may be broadcast to all levels of a model's hierarchy. In other embodiments, the initialize event, the reset event, or the terminate event may be limited in scope to one or more hierarchal levels, or to a portion of a model, such as one or more subsystems or one or more sub-models. In other embodiments, multiple initialize, reset, or terminate events may be defined, and each such event may have a different scope.

Figure 16:
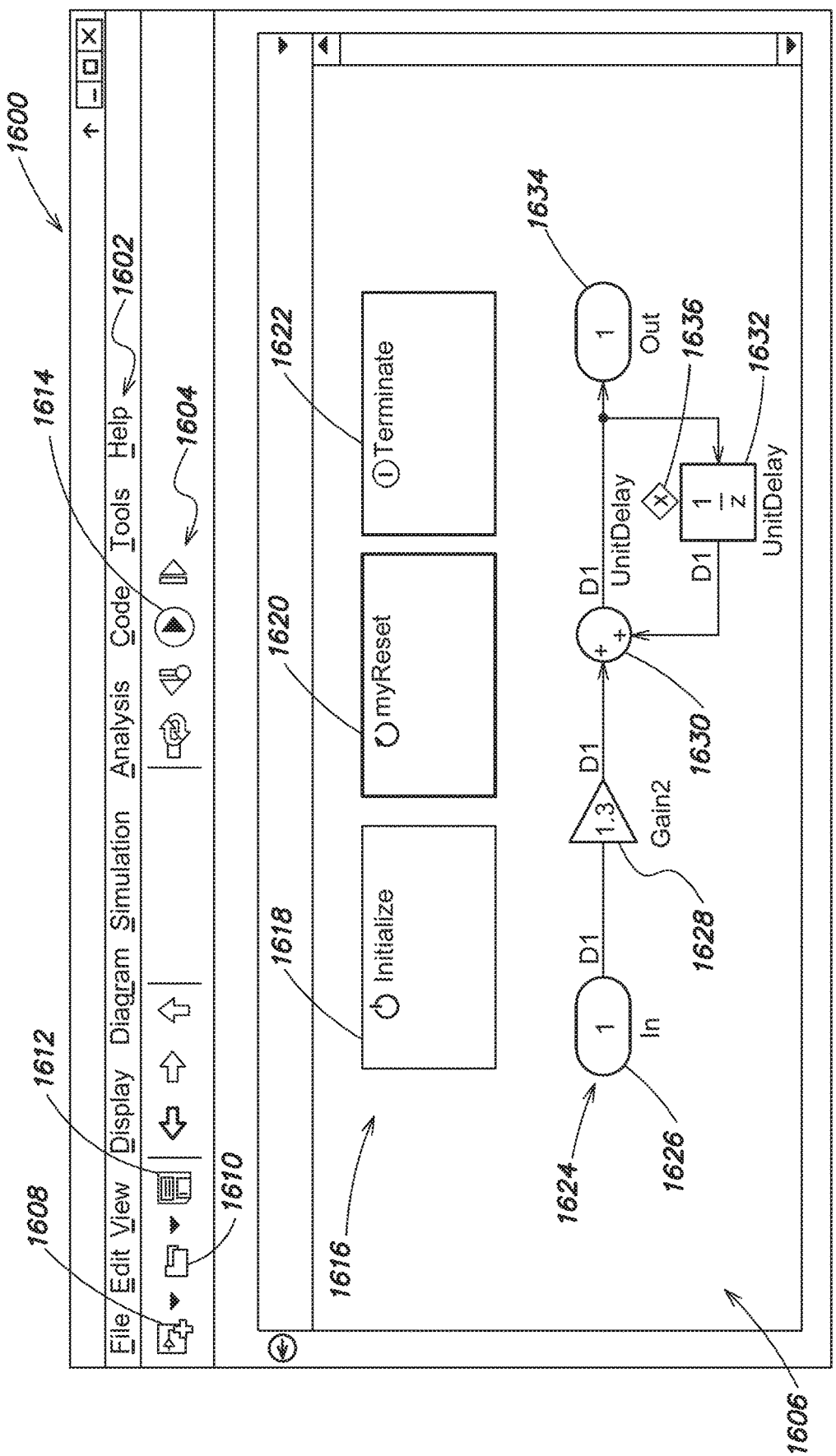
FIG. 16 is a schematic illustration of an example model component presented on a model editor window in accordance with an embodiment.

FIG. 16 is a schematic illustration of an example model editor window 1600, which may be generated by the modeling environment 1500 and presented on a display of a data processing system. The model editor window 1600 may include a plurality of graphical affordances, such as user interface elements and/or windows elements (widgets), at least some of which may be operated by a user to construct, edit, run, and save a model, among other operations. For example, the model editor window 1600 may include a menu bar 1602, a toolbar 1604, and a canvas 1606. The menu bar 1602 may include a plurality of commands, and the commands may be organized into drop-down categories, such as File, Edit, View, Display, etc. The toolbar 1604 may include a plurality of graphical command buttons for executing frequently used commands. For example, the toolbar 1604 may include a New button 1608, an Open button 1610, a Save button 1612, and a Run button 1614, among others.

A user may select model element types from one or more palettes (not shown), and add instances of the selected model element types to the canvas 1606 to construct or revise a model. At least some of the selected model elements may be graphical objects. A model may have portions operating according to different execution domains, such as a time-based portion, a dynamic portion, a state-based portion, a dataflow based portion, a control flow portion, an event based portion, etc. For example, a model may include a graphical state-based component, such as a chart.

A graphical model component 1616 having executable semantics may be opened and presented on the canvas 1606. The model component 1616 may implement Power Up Power Down (PUPD) functionality, and may include an initialize subsystem 1618, a reset subsystem 1620 (labeled myReset), a terminate subsystem 1622, and an algorithmic model portion 1624. The algorithmic model portion 1624 may compute an estimated position, for example the estimated position of a car, based on the car's speed. The algorithmic model portion 1624 may include a plurality of interconnected model elements, such as an Inport block 1626, a Gain block 1628, a Sum block 1630, a Unit Delay block 1632, and an Outport block 1634. The Sum block 1630 and the Unit Delay block 1632 may implement the functionality of a discrete integrator, e.g., in the form of an accumulator. One or more of the model elements of the algorithmic model portion 1624 may include internal state. For example, the Unit Delay block 1632 may include an internal state variable, x, which may be graphically represented on the Unit Delay block 1632 by a state variable icon 1636. The state variable, x, may represent a current or starting position, and may be obtained from a sensor.

The initialize subsystem 1618, the myReset subsystem 1620, and the terminate subsystem 1622 may each include or define user-specified functionality, e.g., explicit operations, that is to be executed during initialize, reset, and terminate phases, respectively, of the execution of the PUPD model component 1616.

Figure 17:
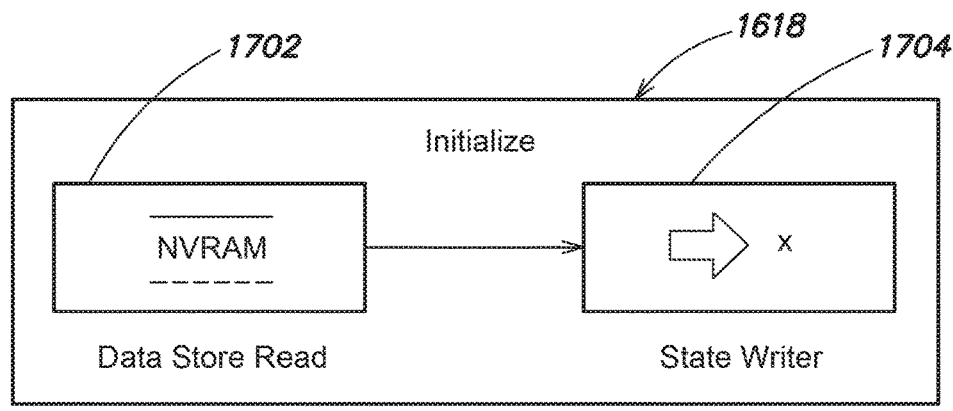
FIG. 17 is a schematic illustration of an example initialize subsystem in accordance with an embodiment.

FIG. 17 is a schematic illustration of the initialize subsystem 1618, which has been opened to illustrate the model elements forming the initialize subsystem 1618. The initialize subsystem 1618 may include a Data Store Read block 1702 connected to a State Writer block 1704. During execution of the initialize subsystem 1618, the Data Store Read block 1702 may read a value from memory, e.g., from non-volatile memory, and provide that value to the State Writer block 1704. The State Writer block 1704 may utilize the value received from the Data Store Read block 1702 to set the internal state variable, x, of the Unit Delay block 1632 (FIG. 16) to the received value. The initialize subsystem 1618 thus initializes the internal state variable, x, of the Unit Delay block 1632 from a value stored in memory before startup of the algorithmic model portion 1624.

Figure 18:
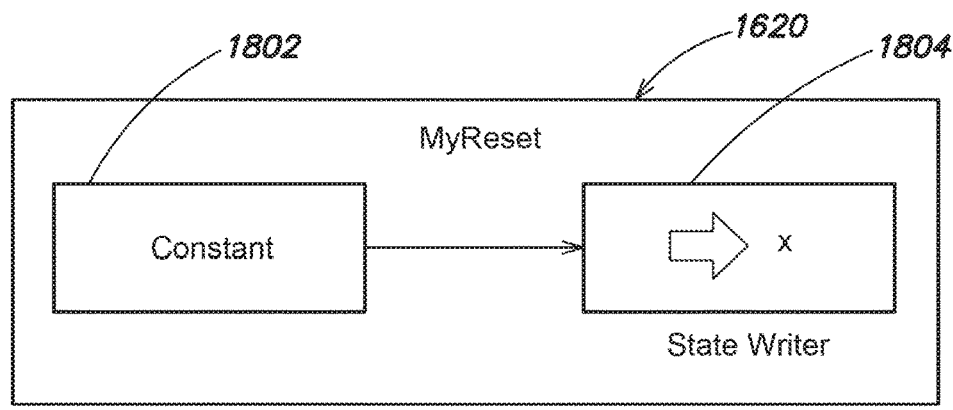
FIG. 18 is a schematic illustration of an example reset subsystem in accordance with an embodiment.

FIG. 18 is a schematic illustration of the myReset subsystem 1620, which has been opened to illustrate the model elements forming the myReset subsystem 1620. The myReset subsystem 1620 may include a Constant block 1802 connected to a State Writer block 1804. During execution of the myReset subsystem 1620, the Constant block 1802 provides a predetermined value to the State Writer block 1804, which sets the internal state variable, x, of the Unit Delay block 1632 to the predetermined value. The myReset subsystem 1620 thus resets the internal state variable, x, of the Unit Delay block 1632 to a predetermined value. The reset phase may be invoked for example when the position data computed by the algorithmic model portion 1624 exceeds some threshold, fails to match a check value, etc.

Figure 19:
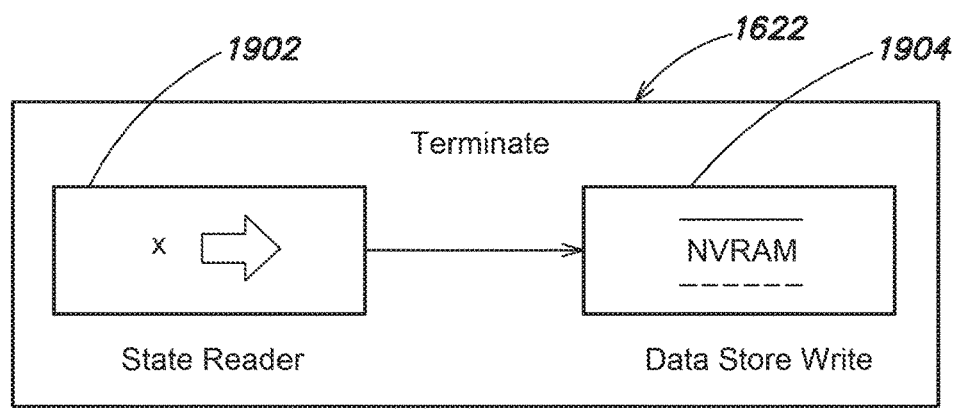
FIG. 19 is a schematic illustration of an example terminate subsystem in accordance with an embodiment.

FIG. 19 is a schematic illustration of the terminate subsystem 1622, which has been opened to illustrate the model elements forming the terminate subsystem 1622. The terminate subsystem 1622 may include a State Reader block 1902 connected to a Data Store Write block 1904. During execution of the terminate subsystem 1622, the State Reader block 1902 may read the internal state variable, x, of the Unit Delay block 1632, and provide that value to the Data Store Write block 1904. The Data Store Write block 1904 may write the received value to memory, e.g., non-volatile memory. The terminate subsystem 1622 thus stores to non-volatile memory the value of the internal state variable x of the Unit Delay block 1632 before shutdown of the algorithm model portion 1624. The memory location to which the Data Store Write block 1904 writes may be the same memory location from which the Data Store Read block 1702 of the initialize subsystem 1618 reads.

In some embodiments, a user may include an operation in a reset subsystem that invokes implicit initialize operations.

In some implementations, multiple initialize, reset, or terminate operations may be included in a given hierarchical level, for example in a given subsystem or sub-model.

Figure 29:
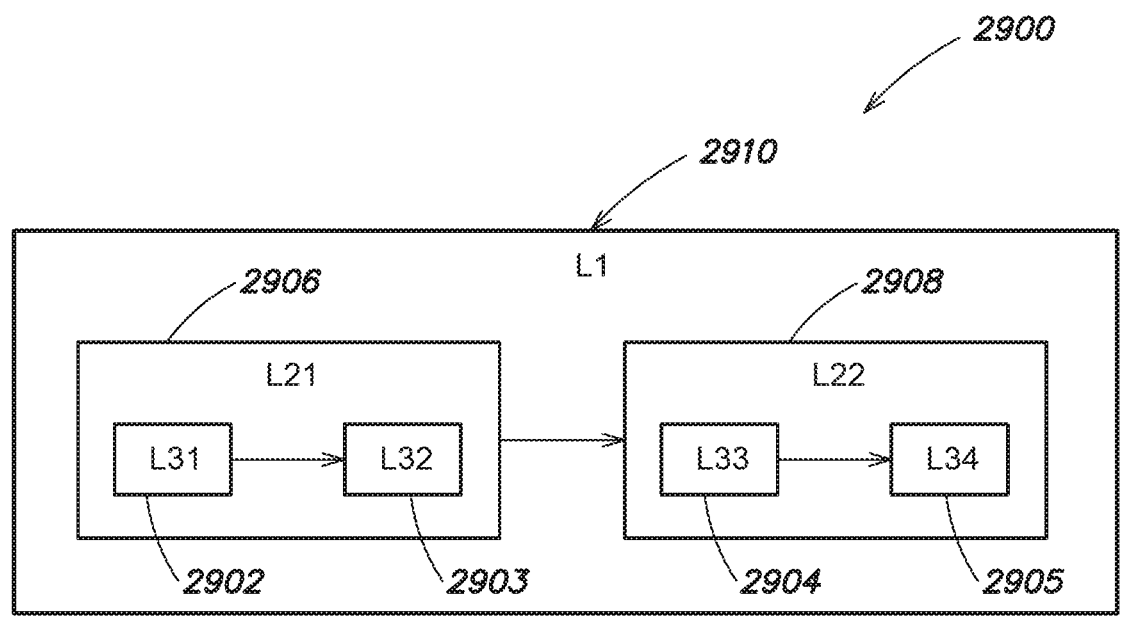
FIG. 29 is a schematic illustration of an example model in accordance with an embodiment.

FIG. 29 is a schematic illustration of an example model 2900 having multiple hierarchical levels. At a lowest hierarchical level, the model 2900 may include four model components 2902-2904 (labeled L31, L32, L33, and L34). At a next higher hierarchical level, the model 2900 may include two model components 2906 and 2908 (labeled L21 and L22). At a next higher hierarchical level, the model 2900 may include a top-level component 2910 (labeled L1). Model components 2902 and 2903 (L31 and L32) may be included in model component 2906 (L21), and model components 2904 and 2905 (L33 and L34) may be included in model component 2908. The two model components 2906 and 2908 (L21 and L22) may be included in the top-level component 2910 (L1). Implicit and/or explicit initialization operations may be defined at each hierarchical level of the model 2900. For example, implicit and explicit initialization operations, explicit reset operations, and implicit and explicit termination operations may be defined or specified for each of the model components 2902-2904 (L31, L32, L33, and L34), model components 2906 and 2908 (L21 and L22), and model component 2910 (L1).

The implicit and explicit initialization operations, explicit reset operations, and implicit and explicit termination operations may be aggregated and organized into execution units, such as callable units by the organizing engine 1320.

Figure 30:
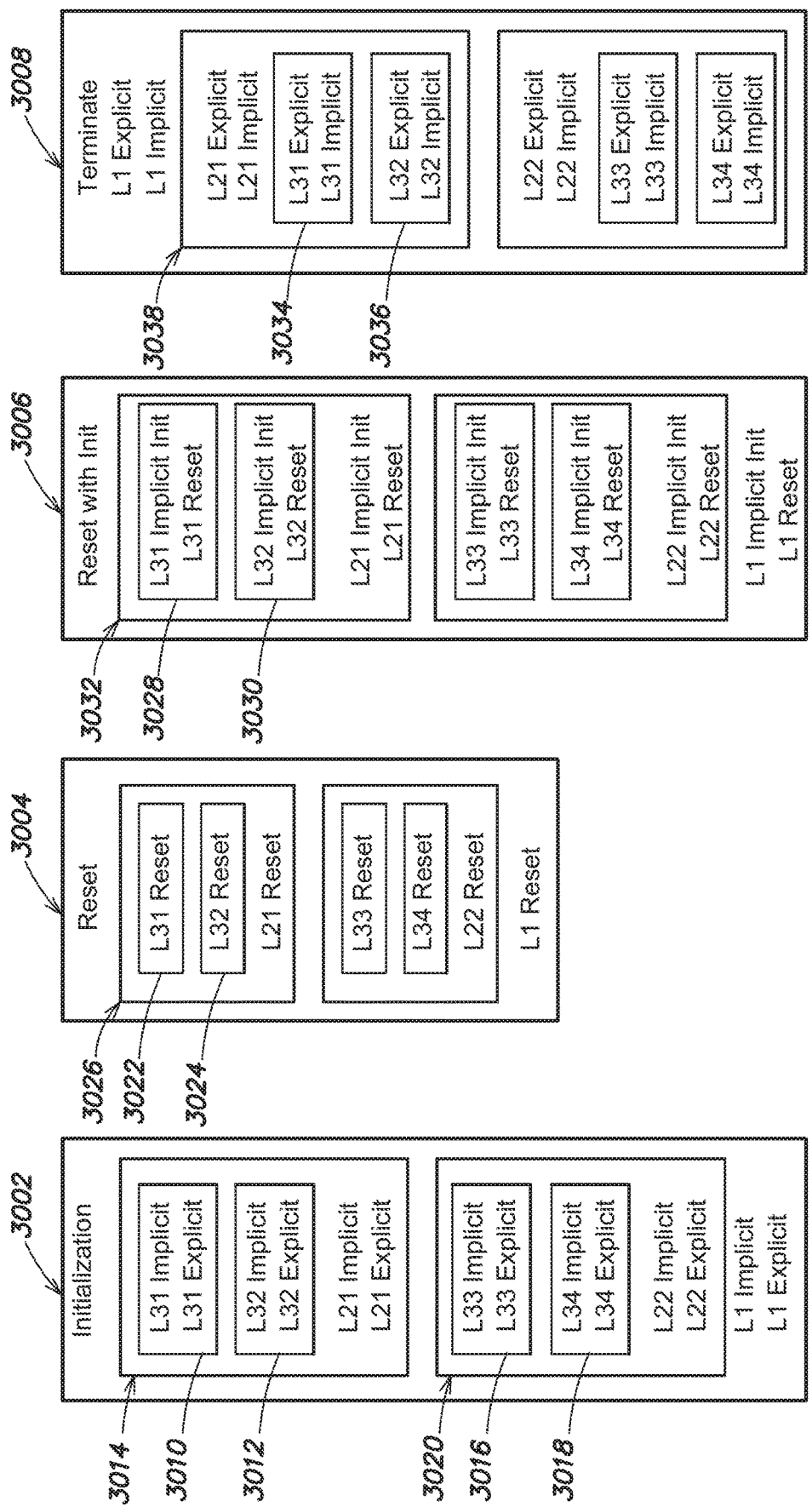
FIG. 30 is a schematic illustration of example execution units that may be produced for the model of FIG. 29.

FIG. 30 is a schematic illustration of example execution units that may be produced for the model 2900. The execution units may include an initialization unit 3002, a reset unit 3004, a reset with initialize (init) unit 3006, and a terminate unit 3008.

The initialization unit 3002 may include the implicit and explicit initialization operations specified or defined at each level of the model's hierarchy, e.g., for each component of each hierarchical level. In some implementations, at each component, explicit initialization operation(s) are executed after implicit initialization operation(s), such that explicit initialization operation(s) overrides implicit operations. In some implementations, at each level, when there are multiple model components, the arranged initialization operation sets for different model components may be interleaved. Furthermore, the implicit and explicit initialization operations of different hierarchical levels may be aggregated, e.g., in a manner described previously.

For example, the initialization unit 3002 may include a first operation set 3010 that includes the implicit and explicit initialization operations defined for the model component 2902 (L31), and a second operation set 3012 that includes the implicit and explicit initialization operations defined for the model component 2903 (L32). Note that, in this example, implicit initialization operations for a given model component, e.g., L31 Implicit, are ordered for execution before the explicit initialization operations for the given model component, e.g., L31 Explicit. The first and second operation sets 3010 and 3012 are interleaved, such that the first operation set 3010 executes before the second operation set 3012, and may be included, e.g., aggregated, in a third operation set 3014 that includes the implicit and explicit initialization operations defined for the model component 2906 (L21) that includes model components 2902 and 2903 (L31 and L32). In some implementations, the aggregation may follow one or more rules previously described. In this example, the implicit and explicit initialization operations for the model component 2906 (L21 Implicit and L21 Explicit) execute after the initialization operations for the model components 2902 and 2903 (L31 and L32).

The initialization unit 3002 may further include a fourth operation set 3016 that includes the implicit and explicit initialization operations defined for the model component 2904 (L33), and a fifth operation set 3018 that includes the implicit and explicit initialization operations defined for the model component 2905 (L34). The fourth and fifth operation sets 3016 and 3018 are interleaved, such that the fourth operation set 3016 executes before the fifth operation set 3018, and may be included, e.g., aggregated, in a sixth operation set 3020 that includes the implicit and explicit initialization operations defined for the model component 2908 (L22) that includes model components 2904 and 2905 (L33 and L34). In this example, the implicit and explicit initialization operations for the model component 2908 (L22 Implicit and L22 Explicit) execute after the initialization operations for the model components 2904 and 2905 (L33 and L34).

The implicit and explicit initialization operations for the model component 2910 (L1 Implicit and L1 Explicit) execute after the initialization operations for the model components at lower hierarchical levels, e.g., model components 2906 and 2908 (L21 and L22) and model components 2902-2904 (L31, L32, L33, and L34).

As illustrated, initialization operations defined or specified for different hierarchical levels may be interleaved.

A single entry point may be provided for the initialization unit 3002. In some embodiments, entry points may be provided for different operation sets of the initialization unit 3002, such as the first, second, third, or fourth operation sets 3010, 3012, 3014, 3016, among others.

The reset unit 3004 may include the explicit reset operations specified or defined at each level of the model's hierarchy, e.g., for each model component of each level. In some implementations, at each level, when there are multiple model components, the arranged reset operation sets for different model components are interleaved. Furthermore, the explicit reset operations of different hierarchical levels may be aggregated.

For example, the reset unit 3004 may include a first operation set 3022 that includes the explicit reset operations defined for the model component 2902 (L31), and a second operation set 3024 that includes the explicit reset operations defined for the model component 2903 (L32). The first and second operation sets 3022 and 3024 are interleaved and may be included, e.g., aggregated, in a third operation set 3026 that includes the explicit reset operations defined for the model component 2906 (L21) that includes model components 2902 and 2903 (L31 and L32).

As illustrated, reset operations defined or specified for different hierarchical levels may be interleaved.

A single entry point may be provided for the reset unit 3004. In some embodiments, entry points may be provided for different operation sets of the reset unit 3004, such as the first, second, or third operation sets 3022, 3024, 3026, among others.

The reset with init unit 3006 may include selected implicit initialization operations and explicit reset operations specified or defined at each level of the model's hierarchy, e.g., for each model component of each level. In some implementations, reset operation(s) are executed after implicit initialization operation(s), such that reset operation(s) override implicit initialization operation(s). In some implementations, at each level, when there are multiple model components, the arranged initialization and rest operation sets for different model components are interleaved. Furthermore, the implicit initialization operations and the explicit reset operations of different hierarchical levels may be aggregated.

For example, the reset with init unit 3006 may include a first operation set 3028 that includes implicit initialization operations and reset operations defined for the model component 2902 (L31), and a second operation set 3030 that also includes implicit initialization operations and reset operations defined for the model component 2903 (L32). The first and second operation sets 3028 and 3030 are interleaved and may be included, e.g., aggregated, in a third operation set 3032 that includes implicit initialization operations and reset operations defined for the model component 2906 (L21) that includes model components 2902 and 2903 (L31 and L32).

A single entry point may be provided for the reset with init unit 3006. In some embodiments, entry points may be provided for different operation sets of the reset with init unit 3006. For example, the organizing engine 1320 may aggregate a first implicit initialization operation into a reset unit that includes one or more explicit reset operations and has an entry point. In addition, calling the entry point created for the reset unit may cause all of the one or more explicit reset operations and the first implicit initialization operation to be executed.

The terminate unit 3008 may include the implicit and explicit terminate operations specified or defined at each level of the model's hierarchy, e.g., for each component of each level. In some implementations, at each component, explicit terminate operation(s) are executed before implicit terminate operation(s), such that implicit terminate operation(s) override explicit terminate operation(s). In some implementations, at each level, when there are multiple model components, the arranged terminate operation sets for different model components interleave. Furthermore, the implicit and explicit terminate operations of different hierarchical levels may be aggregated.

For example, the terminate unit 3008 may include a first operation set 3034 that includes the implicit and explicit terminate operations defined for the model component 2902 (L31), and a second operation set 3036 that includes the implicit and explicit terminate operations defined for the model component 2903 (L32). Note that, in this example, implicit terminate operations for a given model component, e.g., L31 Implicit, are ordered for execution after the explicit terminate operations for the given model component, e.g., L31 Explicit. The first and second operation sets 3034 and 3036 may be included in a third operation set 3038 that includes the implicit and explicit terminate operations defined for the model component 2906 (L21) that includes model components 2902 and 2903 (L31 and L32). The explicit and implicit terminate operations for the model component 2906 (L21 Explicit and L21 Implicit) execute before the terminate operations for the model components 2902 and 2903 (L31 and L32).

The explicit and implicit terminate operations for the model component 2910 (L1 Explicit and L1 Implicit) execute before the terminate operations for the model components at lower hierarchical levels, e.g., model components 2906 and 2908 (L21 and L22) and model components 2902-2904 (L31, L32, L33, and L34).

As illustrated, terminate operations defined or specified for different hierarchical levels may be interleaved.

A single entry point may be provided for the terminate unit 3008. In some embodiments, entry points may be provided for different operation sets of the terminate unit 3008, such as the first, second, or third operation sets 3034, 3036, 3038, among others.

In some embodiments, explicit initialize, reset, or terminate operations may be defined within a model component in other ways besides including them in conditionally executed subsystems. For example, explicit initialize, reset, or terminate operations may be implemented using other components or containers, such as conditionally executed sub-models. In some embodiments, explicit initialize, reset, or terminate operations may be defined without the use of subsystems, sub-models, or other components or containers.

Figure 20:
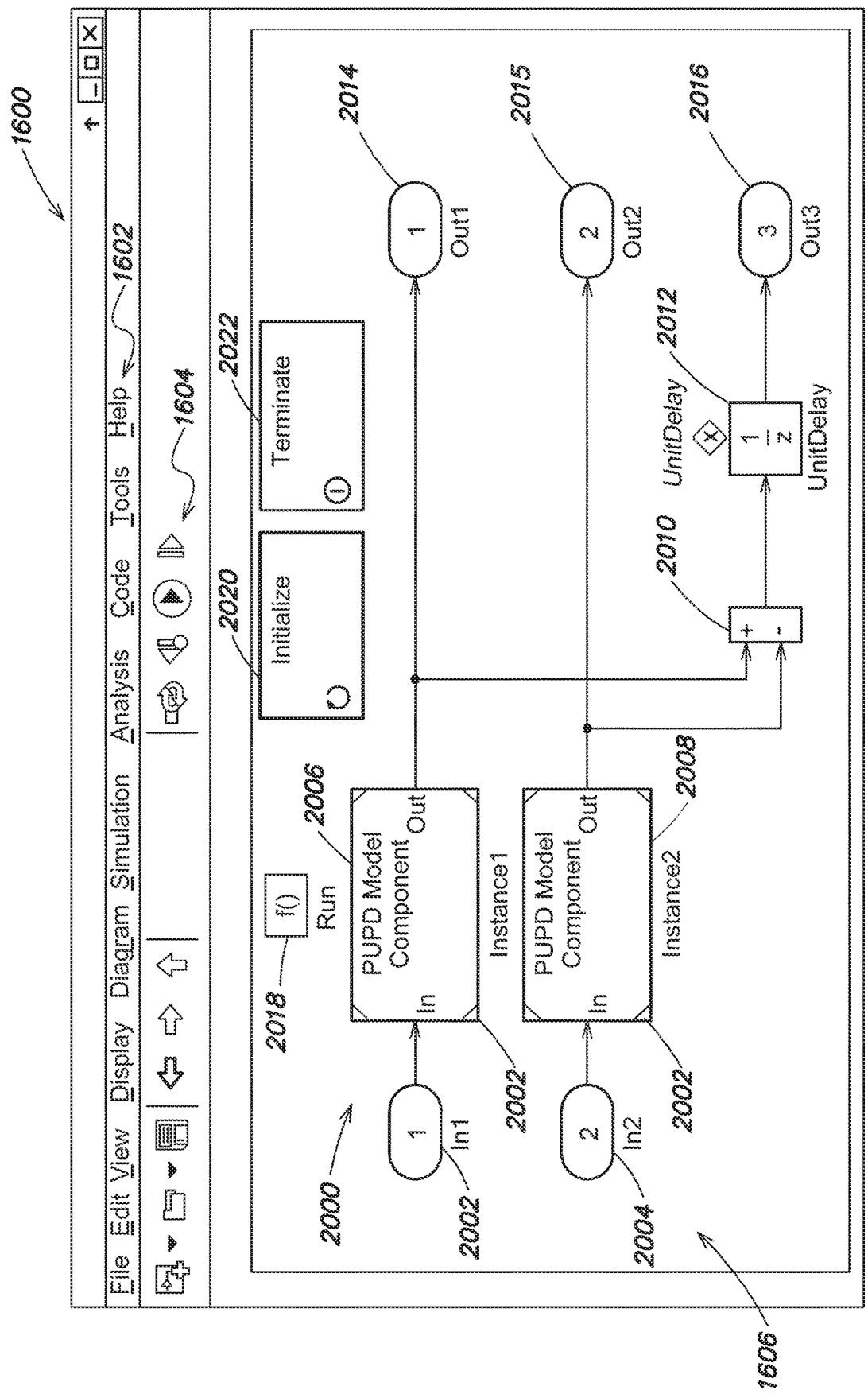
FIG. 20 is a schematic illustration of another example model component in accordance with an embodiment.

FIG. 20 is a schematic illustration of another example model component 2000 that may be opened in the model editor window 1600. The model component 2000 may represent a function-call subsystem, and may include a plurality of model elements and components. For example, the model component 2000 includes two Inport blocks 2002 and 2004, a first instance 2006 of the PUPD model component 1616, a second instance 2008 of the PUPD model component 1616, a Sum block 2010, a Unit Delay block 2012, three Outport blocks 2014-2016, a function call block 2018, an initialize subsystem 2020, and a terminate subsystem 2022.

The initialize subsystem 2020, and the terminate subsystem 2022 may each include or define user-specified functionality, e.g., explicit operations, that is to be executed during initialization and termination phases of the model component 2000. For example, the initialize subsystem 2020 may initialize the value of an internal state variable x of the Unit Delay block 2012 from a value read from non-volatile memory before execution of the function-call model component 2000. The terminate subsystem 2022 may store the value of the internal state variable x of the Unit Delay block 2012 during shutdown of the function-call model component 2000.

Figure 21:
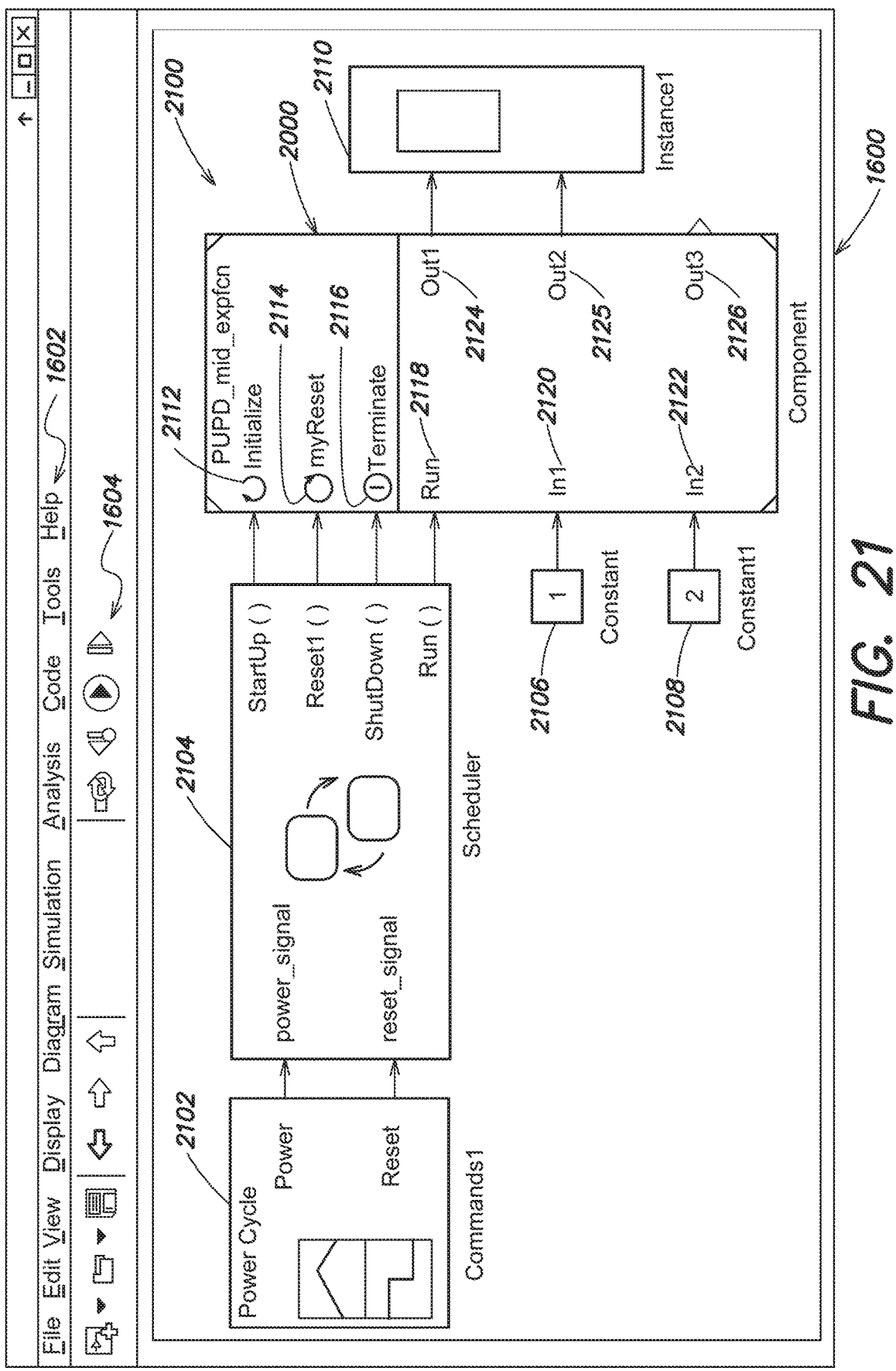
FIG. 21 is a schematic illustration of a top-level of an example model in accordance with an embodiment.

FIG. 21 is a schematic illustration of an example model 2100 that may be opened in the model editor window 1600. The model 2100 may mimic a deployment environment for the model component 2000, and may include a Signal Builder block 2102 (labeled Commands), a state chart 2104 (labeled Scheduler), two Constant blocks 2106 and 2108, the model component 2000 (labeled Component), and a Scope block 2110. The model component 2000 may include an Initialize input port 2112, a myReset input port 2114, a Terminate input port 2116, a Run input port 2118, and two signal input ports (In1 and In2) 2120 and 2122. The model component 2000 also may include three output ports (Out1, Out2, and Out3) 2124-2126. The Signal Builder block 2102 may generate two signals (labeled Power and Reset) that are received by the state chart 2104. The state chart 2104 may generate Startup data, Reset data, Shutdown data, and Run data that are received at the input ports 2112-2118, respectively, of the model component 2000. The Startup, Reset, Shutdown, and Run data may be signals, events, triggers, and/or function calls. The constant blocks 2106 and 2108 may provide constant values that are received at the two input ports 2120 and 2122 of the model component.

FIG. 22 is a schematic illustration of example code 2200 that may be generated for the model component 2000. The code 2200 may be source code generated for model component 2000 by the code generator 1306 (FIG. 13). The code 2200 may be compiled and executed outside of the modeling environment 1300. The code 2200 may include an initialize code section 2202, a reset code section 2204, and a terminate code section 2206. The initialize code section 2202 may implement the initialize callable unit produced for the model component 2000, e.g., by the organizing engine 1320 and the model compiler 1314. The initialize code section 2202 may include lines of code that correspond to the implicit and explicit initialize operations that have been aggregated from all of the model component's hierarchical levels by the organizing engine 1320, and arranged within the initialize callable unit in a particular execution order. For example, the initialize code section unit 2202 may include:
  one or more entries or lines, schematically illustrated at entry 2208, that represent the implicit initialization operations for a lowest hierarchical level of the model component 2000, such as the first instance 2006 of the model component 1616;
  one or more entries or lines, schematically illustrated at entry 2210, that represent the explicit initialize operations for the first instance 2006 of the model component 1616;
  one or more entries or lines, schematically illustrated at entry 2212, that represent the second instance 2008 of the model component 1616;
  one or more entries or lines, schematically illustrated at entry 2214, that represent the explicit initialize operations for the second instance 2008 of the model component 1616;
  one or more entries or lines, schematically illustrated at entry 2216, that represent the implicit initialization operations for a next higher hierarchical level of the model component 2000; and
  one or more entries or lines, schematically illustrated at entry 2218, that represent the explicit initialize operations for the next higher hierarchical level of the model component 2000.

The initialize code section 2202 also may include a single entry point 2220, which may be a function call to an initialize function.

The reset code section 2204 may implement the reset callable unit produced for the model component 2000, e.g., by the organizing engine 1320 and the model compiler 1314. The reset code section 2204 may include lines of code that correspond to the implicit (if any) and explicit reset operations that have been aggregated from all of the model's hierarchical levels by the organizing engine 1320, and arranged within the reset callable unit in a particular execution order. Because the model component 2000 only includes explicit reset operations defined for the first and second instances 2006 and 2008 of the model component 1616, the reset code section 2204 may include:
  one or more entries or lines, schematically illustrated at entry 2222, that represent the explicit reset operations for a lowest hierarchical level of the model component 2000, such as the first instance 2006 of the model component 1616; and
  one or more entries or lines, schematically illustrated at entry 2224, that represent the explicit reset operations for the second instance 2008 of the model component 1616.

The reset code section 2204 also may include a single entry point 2226, which may be function call to a reset function.

The terminate code section 2206 may implement the terminate callable unit produced for the model component 2000, e.g., by the organizing engine 1320 and the model compiler 1314. The terminate code section 2206 may include lines of code that correspond to implicit and explicit terminate operations that have been aggregated from all of the model's hierarchical levels by the organizing engine 1320, and arranged within the terminate callable unit in a particular execution order. For example, the terminate code section 2206 may include:
  one or more entries or lines, schematically illustrated at entry 2228, that represent the explicit termination operations for a highest hierarchical level of the model component 2000;
  one or more entries or lines, schematically illustrated at entry 2230, that represent the implicit termination operations for the highest hierarchical level of the model component 2000;

one or more entries or lines, schematically illustrated at entry 2232, that represent the explicit termination operations for a next lower hierarchical level of the model component 2000, such as the second instance 2008 of the model component 1616;

one or more entries or lines, schematically illustrated at entry 2234, that represent the implicit termination operations for the second instance 2008 of the model component 1616;

one or more entries or lines, schematically illustrated at entry 2236, that represent the explicit termination operations for the first instance 2006 of the model component 1616; and one or more entries or lines, schematically illustrated at entry 2238, that represent the implicit termination operations for the first instance 2006 of the model component 1616.

The termination code section 2206 also may include a single entry point 2240, which may be function call to a terminate function.

It should be understood that the code 2200 may include other sections or elements, such as a run section or element.

FIG. 23 is a schematic illustration of example initialization code 2300 generated for the model component 1616. The initialization code 2300 may include an implicit initialize code section 2302 and an explicit initialize code section 2304. The explicit initialize code section 2304 may correspond to the initialize subsystem 1618 (FIG. 17). The implicit initialize code section 2302 may include a default initialization entry 2306 that initializes a Unit delay's state to 0.0. The explicit initialize code section 2304 that initializes the Unit delay's state by a value read from Non-volatile memory overrides or takes precedence over the implicit or default initialization entry 2306. The optimizer 1328 of the code generator 1306 may remove the default initialization entry 2306, as indicated by the comment appended to the default initialization entry 2306.

FIG. 24 is a schematic illustration of example reset code 2400 generated for the explicit reset operations for the second instance 2008 of the model component 1616, e.g., as specified by the myReset subsystem 1620 (FIG. 18). The code 2400 may include instructions to reset a Unit delay's state by the value '10'.

FIG. 25 is a schematic illustration of example algorithmic code 2500 that may be generated for the algorithmic model portion 1624 of the model component 1616. The algorithmic code 2500 may include instructions to implement an accumulator, e.g., to set a current output to 1.3*input+previous output. Furthermore, the state of the Unit Delay block may be modified during execution of the algorithmic code 2500.

FIG. 26 is a schematic illustration of example termination code 2600 generated for the model component 1616. The termination code 2600 may combine code for both implicit and explicit termination operations, although only code for explicit operations, e.g., as specified by the terminate subsystem 1622 (FIG. 19), may be illustrated in the termination code 2600. The termination code 2600 may include instructions to save a Unit delay's state by reading and saving (e.g., writing) the state value to Non-volatile memory.

In some embodiments, a user-defined model element may be created by writing code using a text-based computer programming language. The textual code may be associated with an icon to form the model element, and the model element may be included in an executable graphical model. The textual code may be compiled into an executable. During execution of the model, the compiled textual code may be automatically loaded and executed by the simulation engine 1310. Exemplary text-based programming languages that may be used to create a user-defined model element include C, C++, C#, MATLAB, and Fortran, among others. Examples of textually-defined model elements used in executable models include system function (S-function) blocks in the Simulink model-based design environment, and Formula nodes and MathScript nodes in the LabVIEW programming system.

In accordance with one or more embodiments of the present disclosure, the functionality specified by a textually-defined model element may be aggregated with other functionality defined within an executable model. Different techniques may be used to aggregate the functionality specified by a textually-defined model element.

First, a textually-defined model element may be included in one or more initialize, reset, or terminate subsystems of an executable model. The organizing engine 1320 may deem at least some of the functionality specified by the textually-defined model element to be explicit operations. The organizing engine 1320 may aggregate the functionality specified by the textually-defined model element in accordance with the rules specified for the respective subsystem, e.g., initialize, reset, or terminate. For example, the organizing engine 1320 may treat a textually-defined model element in the same manner as a built-in model element included in an initialize, reset, or terminate subsystem.

Second, initialize, reset, and terminate phases of model execution may be exposed through methods used by a textually-defined model element. For example, a modeling environment may define one or more methods, such as callback methods, for textually-defined model elements. For a given textually-defined model element, user-defined functions or operations may be associated with these callback functions. The callback methods may be invoked by the simulation engine 1310 during model execution. Exemplary callback methods include:

mdlStart—performs user-defined initialization activities of the textually-defined model element that only need to be performed once for each execution of the model, such as setting up user data or initializing states. This callback method may only be called once at the start of model execution. The contents of this function may be automatically aggregated and executed in an initialize phase of the model execution.

mdlInitalizeConditions—performs user-defined initialization activities of the textually-defined model element that may be performed more than once during model execution. This callback method may be called at the start of model execution, and each time input values to the textually-defined model element are calculated. The contents of this function may be automatically aggregated and executed in an initialize phase of the model execution.

mdlOutputs—computes the textually-defined model element's output values. This callback method may be called one or more times during model execution. For a time-based modeling environment, a sample time may be computed for the textually-defined model element, and the mdlOutputs callback method may be called at each occurrence of the sample time, e.g., at each sample time hit, during model execution.

mdlReset(indentifier)—performs user-defined reset activities of the textually-defined model element. By choosing different values for the "identifier", different sets of reset activities may be defined within a textually-defined model element and/or model. This callback method may be called at each reset event, if any, during model execution. The contents of this function may be automatically aggregated and executed in a reset function responding to this reset event during model execution.

mdlTerminate—performs actions required by the textually-defined model element at the termination of model execution. This callback method may be called once at the end of model execution. The contents of this function may be automatically aggregated and executed in a terminate phase of the model execution.

A textually-defined model element may be included within an executable model. However, in this embodiment, the textually-defined model element may not be included within an initialize, reset, or terminate subsystem of the executable model.

If the textually-defined model element includes functionality associated with the mdlStart and/or the mdlInitializeConditions callback methods, that functionality may be handled by the organizing engine 1320 as explicit initialize operations. For example, the organizing engine 1320 may aggregate the functionality associated with the mdlStart and/or the mdlInitializeConditions callback methods with other explicit initialization operations defined at the respective hierarchical level at which the textually-defined model element is disposed within the executable model. In addition, the functionality associated with the mdlStart and/or the mdlInitializeConditions callback methods may be aggregated with explicit initialization operations at other, e.g., higher, hierarchical levels, for example according to the rules implemented by the organizing engine 1320.

If the textually-defined model element includes functionality associated with the reset callback method, that functionality may be handled by the organizing engine 1320 as reset operations. For example, the organizing engine 1320 may aggregate the functionality associated with the reset callback method with other reset operations defined at the respective hierarchical level at which the textually-defined model element is disposed within the executable model. In addition, the functionality associated with the reset callback method may be aggregated with reset operations at other, e.g., higher, hierarchical levels, for example according to the rules implemented by the organizing engine 1320. If a higher hierarchical level does not include reset operations associated with the same identifier value as used in the reset callback method, the organizing engine 1320 may create an entry function for the reset identifier, and may include the functionality of the textually-defined model element for this reset identifier value.

If the textually-defined model element includes functionality associated with the mdlTerminate callback method, that functionality may be handled by the organizing engine 1320 as explicit terminate operations. For example, the organizing engine 1320 may aggregate the functionality associated with the mdlTerminate callback method with other explicit termination operations defined at the respective hierarchical level at which the textually-defined model element is disposed within the executable model. In addition, the functionality associated with the mdlTerminate callback method may be aggregated with explicit terminate operations at other, e.g., higher, hierarchical levels, for example according to the rules implemented by the organizing engine 1320.

FIG. 31 is a schematic illustration of example code 3100 specifying at least a portion of a textually-defined model element. The code 3100 may include a define statement 3102 that specifies the name of the textually-defined model element. The code 3100 may further include a section 3104 that implements the mdlStart callback function, and a section 3106 that implements the mdlInitializeConditions callback function. The explicit operations included in sections 3104 and 3106 may be performed during an initialization phase of an executable model that includes the textually-specified model element. The code 3100 also may include a section 3108 that implements the mdlReset callback function. Explicit operations included in section 3108 may be performed during a reset phase of model execution. Finally, the code 3100 may include a section 3110 that implements the mdlTerminate callback function. Explicit operations included in section 3110 may be performed during a terminate phase of model execution.

In a third embodiment, initialize, reset, and terminate phases of model execution may be exported to a textually-defined model element through particular sample rates assigned to initialize, reset, and terminate phases of model execution. For example, the simulation engine 1310 may specify one sample time, e.g., InitExec, at which the initialize phase of model execution is performed, another sample time, e.g., ResetExec, at which a reset phase of model execution is performed, and yet another sample time, e.g., TermExec, at which a terminate phase of model execution is performed. A user may set the sample time for a textually-defined model element to one or more of these sample times. When the sample time assigned to the textually-defined model element occurs, e.g., InitExec, ResetExec, or TermExec, the functionality specified for the textually-defined model element may be performed. In this way, explicit initialize, reset, or terminate operations may be specified through a textually-defined model element. The organizing engine 1320 may aggregate the functionality specified by the textually-defined model element in accordance with the rules specified for the respective operations, e.g., initialize, reset, or terminate operations.

The setting of sample times may be achieved through one or more functions included in the textually-defined model element. For example, a textually-defined model element may include a function, such as ssSetNumSampleTime( ), that sets the number of sample times for the textually-defined model element. This function may be used to set one or more sample times for the textually-defined model element. The textually-defined model element may further include one or more functions, such as ssSetSampleTime( ) that specify the model element's sample time(s). The ssSetSampleTime( ) function may be used to assign one or more of the InitExec, ResetExec, or TermExec sample times to the textually-defined model element.

It should be understood that in some embodiments, one or more of the initialize, reset, or terminate operations included in a textually-defined model element may be aggregated as implicit operations, rather than as explicit operations.

In some embodiments, various combinations of the different techniques may be used to aggregate the functionality specified by a textually-defined model element. For example, for a given model, a textually-defined model element may be included in one or more initialize, reset or terminate subsystems, while that same or another textually-defined model element may include functionality associated with one or more of the mdlStart, mdlInitializeCondition, mdlOutputs, mdlReset, and mdlTerminate callback methods. Other combinations of the techniques may be utilized.

Figure 27:
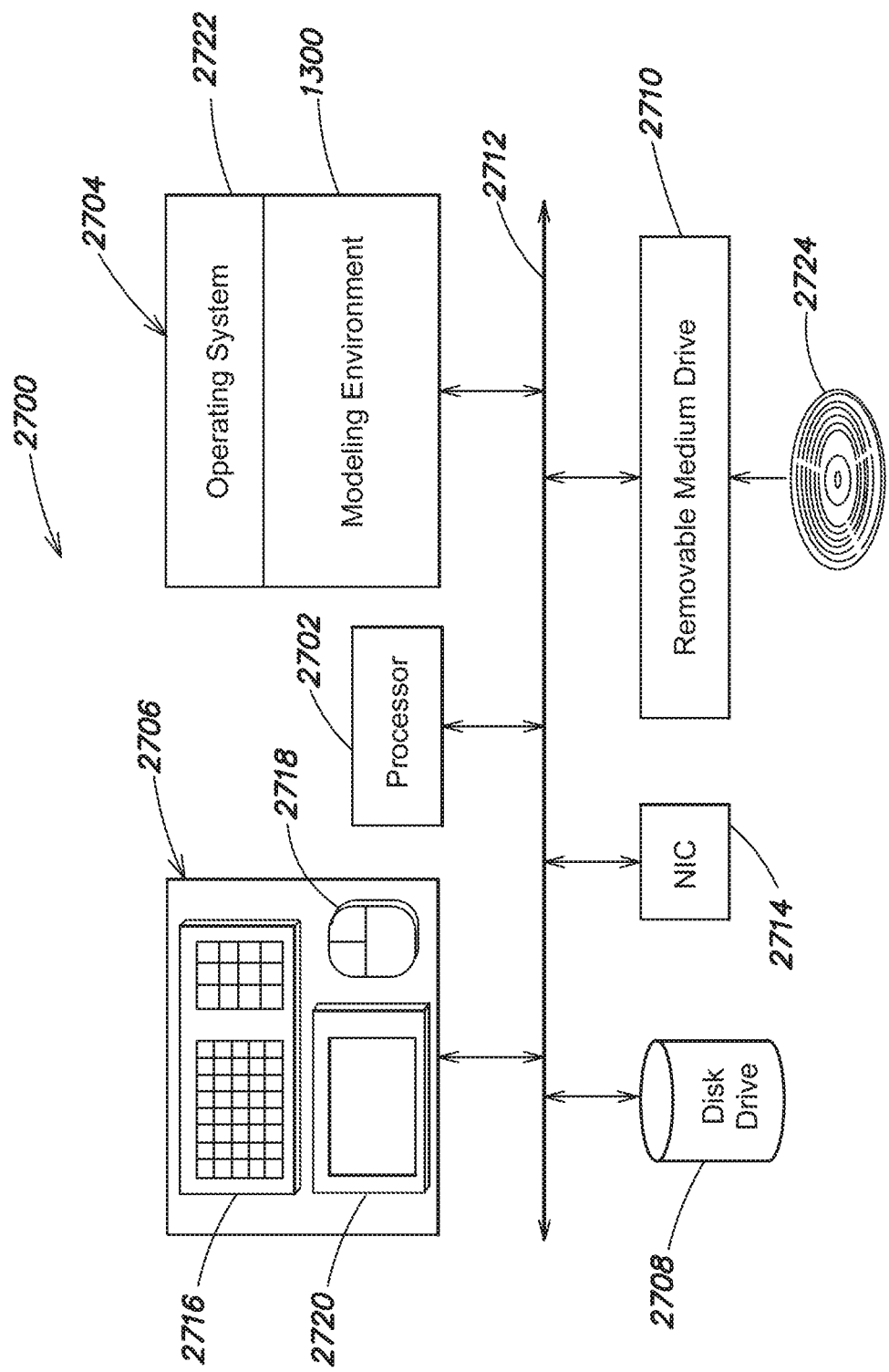
FIG. 27 is a schematic illustration of an example computer or data processing system in accordance with an embodiment.

FIG. 27 is a schematic illustration of an example computer or data processing system 2700 for implementing an embodiment of the invention. The computer system 2700 may include one or more processing elements, such as a processor 2702, a main memory 2704, user input/output (I/O) 2706, a persistent data storage unit, such as a disk drive 2708, and a removable medium drive 2710 that are interconnected by a system bus 2712. The computer system 2700 may also include a communication unit, such as a network interface card (NIC) 2714. The user I/O 2706 may include a keyboard 2716, a pointing device, such as a mouse 2718, and a display 2720. Other user I/O 2706 components include voice or speech command systems, touchpads and touch-screens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 2704, which may be a Random Access Memory (RAM), may store a plurality of program libraries or modules, such as an operating system 2722, and one or more application programs that interface to the operating system 2722, such as the modeling environment 1300.

The removable medium drive 2710 may accept and read a computer readable medium 2726, such as a CD, DVD, floppy disk, solid state drive, tape, flash memory or other non-transitory medium. The removable medium drive 2710 may also write to the computer readable medium 2724.

Suitable computer systems include personal computers (PCs), workstations, servers, laptops, tablets, palm computers, smart phones, electronic readers, and other portable computing devices, etc. Nonetheless, those skilled in the art will understand that the computer system 2700 of FIG. 27 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 1300 may be hosted on one or more cloud servers or devices, and accessed by remote clients through a web portal or an application hosting system, such as the Remote Desktop Connection tool from Microsoft Corp.

Suitable operating systems 2722 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 2722 may provide services or functions for applications or modules, such as allocating memory, organizing data objects or files according to a file system, prioritizing requests, managing I/O, etc. The operating system 2722 may run on a virtual machine, which may be provided by the data processing system 2700.

As indicated above, a user, such as an engineer, scientist, programmer, developer, etc., may utilize one or more input devices, such as the keyboard 2716, the mouse 2718, and the display 2720 to operate the modeling environment 1300, and construct and revise one or more models. As discussed, the models may be computational and may have executable semantics. In particular, the models may be simulated or executed. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Figure 28:
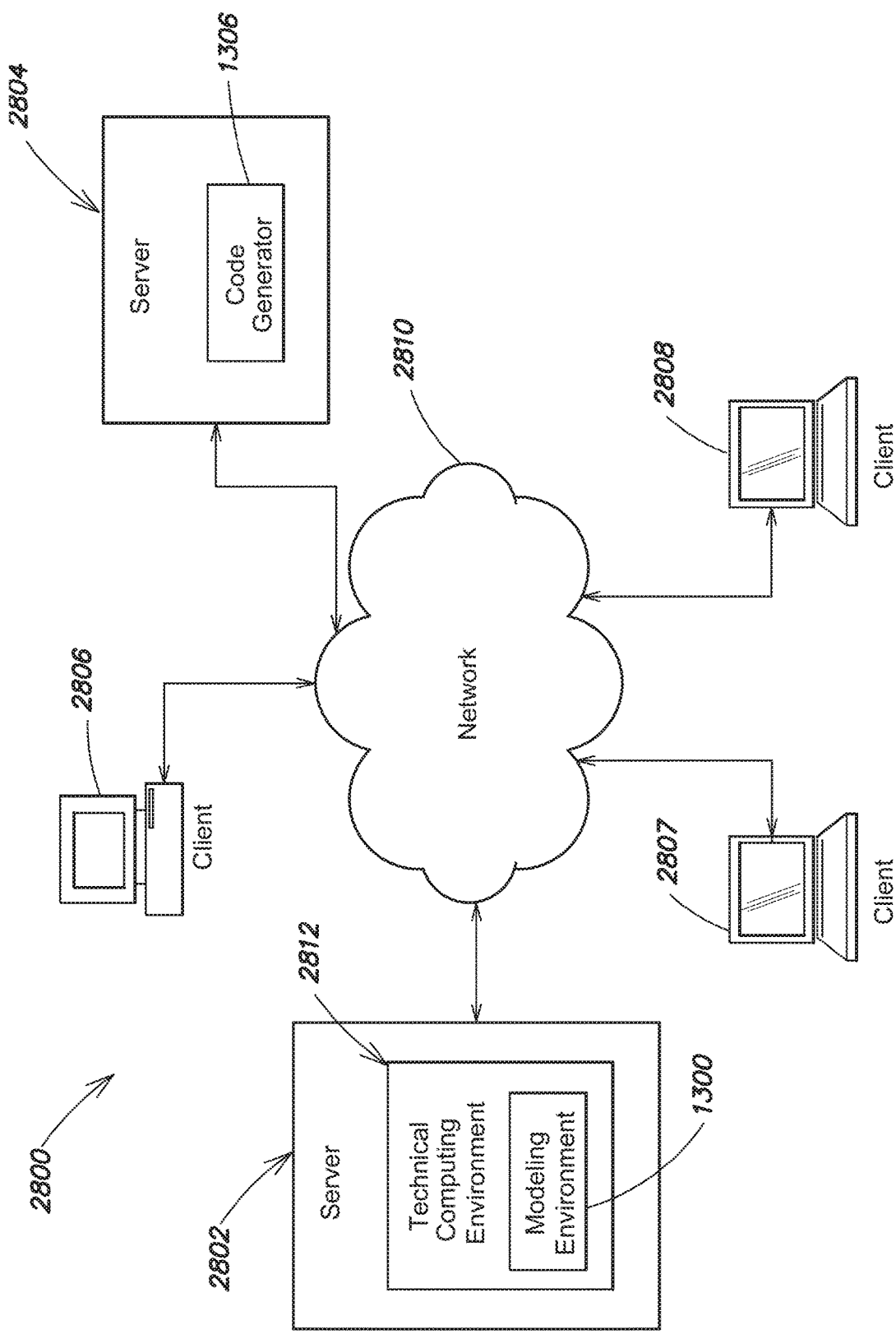
FIG. 28 is a schematic diagram of an example distributed computing environment in accordance with an embodiment.

FIG. 28 is a schematic diagram of an example distributed computing environment 2800 in which systems and/or methods described herein may be implemented. The environment 2800 may include client and server devices, such as two servers 2802 and 2804, and three clients 2806-2808, interconnected by one or more networks, such as network 2810. The servers 2802 and 2804 may include applications or processes accessible by the clients 2806-2808. For example, the server 2802 may include a technical computing environment (TCE) 2812, which may include or have access to a modeling environment, such as the modeling environment 1300. The server 2804 may include a code generator, such as the code generator 1306. The devices of the environment 2800 may interconnect via wired connections, wireless connections, or a combination of wired and wireless connections.

The servers 2802 and 2804 may include one or more devices capable of receiving, generating, storing, processing, executing, and/or providing information. For example, the servers 2802 and 2804 may include a computing device, such as a server, a desktop computer, a laptop computer, a tablet computer, a handheld computer, or a similar device. In some implementations, the servers 2802 and 2804 may host the TCE 2812, the modeling environment 1300, and/or the code generator 1306.

The clients 2806-2808 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 2806-2808 may download data and/or code from the servers 2802 and 2804 via the network 2810. In some implementations, the clients 2806-2808 may be desktop computers, workstations, laptop computers, tablet computers, handheld computers, mobile phones (e.g., smart phones, radiotelephones, etc.), electronic readers, or similar devices. In some implementations, the clients 2806-2808 may receive information from and/or transmit information to the servers 2802 and 2804.

The network 2810 may include one or more wired and/or wireless networks. For example, the network 2810 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 28 is provided as an example. In practice, there may be additional devices and/or networks, fewer devices and/or networks, different devices and/or networks, or differently arranged devices and/or networks than those shown in FIG. 28. Furthermore, two or more devices shown in FIG. 28 may be implemented within a single device, or a single device shown in FIG. 28 may be implemented as multiple, distributed devices. Additionally, one or more of the devices of the distributed computing environment 2800 may perform one or more functions described as being performed by another one or more devices of the environment 2800.

The following examples implement one or more aspects of methods and/or systems of the present disclosure. These examples are non-limiting examples. Features of different examples may be combined in other implementations. Features of each example may be modified or removed in other implementations.

Systems and methods comprise, for an executable model that includes a first hierarchical level, a second hierarchical level different from the first hierarchical level, a first implicit initialization operation associated with one of the first hierarchical level or the second hierarchical level, and a first explicit initialization operation associated with one of the first hierarchical level or the second hierarchical level, automatically aggregating into a first initialization unit, by a first processor, the first implicit initialization operation and the first explicit initialization operation; automatically arranging, by the first processor or a second processor, the first implicit initialization operation and the first explicit initialization operation in an execution order, where the first implicit initialization operation and the first explicit initialization operation in the first initialization unit are in the execution order; and defining, by the first processor, the second processor, or a third processor, an entry point for executing the first implicit operation and the first explicit initialization operation of the initialization unit in the execution order.

The systems and methods further comprise executing the executable model, where the executing the executable model includes utilizing the entry point for executing the first initialization unit.

The systems and methods further comprise generating code for the executable model, the generated code including a code section corresponding to the first initialization unit and a code based single entry point corresponding to the entry point for executing the code section.

The systems and methods wherein the first initialization unit is accessible through a function call, and the code based single entry point includes a code based function call.

The systems and methods wherein the entry point is accessible through an occurrence of an event.

The systems and methods wherein the execution order includes executing the first implicit initialization before executing the first explicit initialization.

The systems and methods wherein the arranging the execution order is based on one or more rules, and the one or more rules include: arranging execution of explicit initialization operations associated with a given hierarchical level to execute after implicit initialization operations associated with the given hierarchical level; and arranging execution of explicit initialization operations and implicit initialization operations for a lower hierarchical level to execute before explicit initialization operations and implicit initialization operations for a higher hierarchical level.

The systems and methods wherein the first hierarchical level is a level higher than the second hierarchical level, the first implicit initialization operation is associated with the first hierarchical level, the first explicit initialization operation is associated with the second hierarchical level, the executable model comprises a second implicit initialization operation associated with the second hierarchical level, and a second explicit initialization operation associated with the first hierarchical level, wherein the method comprises aggregating the second implicit initialization operation and the second explicit initialization operation into the first initialization unit, and wherein the execution order comprises executing operations in the following order: the first implicit initialization operation, the second implicit initialization operation, the first explicit initialization operation, and the second explicit initialization operation.

The systems and methods further comprising: detecting a conflict in the first initialization unit, where the conflict involves setting a variable; and resolving the conflict.

The systems and methods wherein the model further includes: a first explicit reset operation associated with the first hierarchical level, and a second explicit reset operation associated with the second hierarchical level, automatically aggregating into a first reset unit the first explicit reset operation and the second explicit reset operation; automatically arranging the first explicit reset operation and the second explicit reset operation in a reset execution order, wherein the first and second explicit reset operations are in the reset execution order in the first reset unit; and automatically defining for the first reset unit, by the first processor, the second processor, or a third processor, an entry point for executing the first reset operation and the second reset operation in the first reset unit in the reset execution order.

The systems and methods further comprising aggregating the first implicit initialization operation into the first reset unit and wherein the entry point for the first reset unit is for executing all of the first and second explicit reset operations and the first implicit initialization operation.

The systems and methods wherein the model further includes: a first implicit termination operation associated with the one of the first hierarchical level or the second hierarchical level, and a first explicit termination operation associated with one of the first hierarchical level or the second hierarchical level, automatically aggregating into a first termination unit the first implicit termination operation and the first explicit termination operation; automatically arranging the first implicit termination operation and the first explicit termination operation in a termination execution order, where the first implicit termination operation and the first explicit termination operation in the first termination unit are in the termination execution order; and defining, by the first processor, the second processor, or a third processor, an entry point for executing the first implicit termination operation and the first explicit termination operation of the first termination unit in the termination execution order.

The systems and methods where the executable model further includes: a second implicit initialization operation associated with one of the first hierarchical level or the second hierarchical level, and a second explicit initialization operation associated with one of the first hierarchical level or the second hierarchical level, automatically aggregating into a second initialization unit the second implicit initialization operation and the second explicit initialization operation; automatically arranging the second implicit initialization operation and the second explicit initialization operation in a second execution order, where the second implicit initialization operation and the second explicit initialization operation in the second initialization unit are in the second execution order; and defining an entry point for executing the second implicit initialization operation and the second explicit initialization operation of the second initialization unit in the second execution order.

The systems and methods wherein the executable model further includes first and second model components at the first hierarchical level, a first initialization operation set for the first model component, and a second initialization operation set for the second model component, the method further comprising: interleaving the first initialization operation set with the second initialization operation set in the initialization unit.

Systems and methods comprise: for an executable model that includes a first hierarchical level, a second hierarchical level different from the first hierarchical level, a first implicit initialization operation associated with the first hierarchical level, and a first explicit initialization operation associated with one of the first hierarchical level or the second hierarchical level, automatically generating code for the executable model, by a first processor, where the code generated for the executable model includes an initialize code section including a code based entry point, wherein, when executed, the initialization code section performs, through the single code based entry point, instructions that correspond to: the first implicit initialization operation and the first explicit initialization operation.

Systems and methods comprise: for an executable model that includes a first hierarchical level, a first model component at the first hierarchical level, a second model component at the first hierarchical level, a first initialization operation set for the first model component, and a second initialization operation set for the second model component, automatically aggregating into a first initialization unit, by a first processor, the first initialization operation set and the second initialization operation set; automatically interleaving, by the first processor or a second processor, the first initialization operation with the second initialization set in the first initialization unit; and defining, by the first processor, the second processor, or a third processor, an entry point for executing the first initialization operation set and the second initialization operation set of the initialization unit.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 2700. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, while the callable units may typically include all initialize, reset, and terminate operations included in a model, in some implementations one or more of the initialize, reset, and/or terminate operations may be omitted from the respective callable units. Therefore, it is the object of the appended claims to cover all such variations and modifications as come within the true spirit and scope of the disclosure.

What is claimed is:

1. A computer-implemented method comprising:
for an executable model that simulates a system wherein execution of the executable model includes an initialization phase and a run phase, and the executable model includes
a first hierarchical level,
a second hierarchical level different from the first hierarchical level,
a first implicit initialization operation associated with either the first hierarchical level or the second hierarchical level, and
a first explicit initialization operation associated with either the first hierarchical level or the second hierarchical level,
automatically aggregating into a first initialization unit, by a first processor, the first implicit initialization operation and the first explicit initialization operation;
automatically arranging, by the first processor or a second processor, the first implicit initialization operation and the first explicit initialization operation in an execution order for executing both the first implicit initialization operation and the first explicit initialization operation; and
defining, by the first processor, the second processor, or a third processor, an entry point for the executing both the first implicit initialization operation and the first explicit initialization operation as aggregated into the initialization unit in the automatically arranged execution order during the initialization phase,
wherein the arranging the first implicit initialization operation and the first explicit initialization operation in the execution order is based on one or more rules, and the one or more rules include at least one of:
arranging execution of explicit initialization operations associated with a given hierarchical level to execute after implicit initialization operations associated with the given hierarchical level; or
arranging execution of explicit initialization operations and implicit initialization operations for a lower hierarchical level to execute before explicit initialization operations and implicit initialization operations for a higher hierarchical level.

2. The computer-implemented method of claim 1 further comprising executing the executable model, where the executing the executable model includes utilizing the entry point for executing the first initialization unit.

3. The computer-implemented method of claim 1 further comprising generating code for the executable model, the generated code including a code section corresponding to the first initialization unit and a code based single entry point corresponding to the entry point for executing the code section.

4. The computer-implemented method of claim 3 wherein the first initialization unit is accessible through a function call, and the code based single entry point includes a code based function call.

5. The computer-implemented method of claim 1 wherein the entry point is accessible through an occurrence of an event.

6. The computer-implemented method of claim 1 wherein the execution order includes executing the first implicit initialization before executing the first explicit initialization.

7. The computer-implemented method of claim 1, wherein the first hierarchical level is a level higher than the second hierarchical level, the first implicit initialization operation is associated with the first hierarchical level, the first explicit initialization operation is associated with the second hierarchical level, the executable model comprises a second implicit initialization operation associated with the second hierarchical level, and a second explicit initialization operation associated with the first hierarchical level, wherein the computer-implemented method further comprises aggregating the second implicit initialization operation and the second explicit initialization operation into the first initialization unit, and wherein the execution order comprises executing operations in the following order: the first implicit initialization operation, the second implicit initialization operation, the first explicit initialization operation, and the second explicit initialization operation.

8. The computer-implemented method of claim 1 further comprising:
 detecting a conflict in the first initialization unit, where the conflict involves setting a variable; and
 resolving the conflict.

9. The computer-implemented method of claim 1 wherein the execution of the executable model further includes a reset phase and the executable model further includes:
 a first explicit reset operation associated with the first hierarchical level, and
 a second explicit reset operation associated with the second hierarchical level, the computer-implemented method further comprising:
 automatically aggregating into a first reset unit the first explicit reset operation and the second explicit reset operation;
 automatically arranging the first explicit reset operation and the second explicit reset operation in a reset execution order, wherein the first and second explicit reset operations are in the reset execution order in the first reset unit; and
 automatically defining for the first reset unit, by the first processor, the second processor, the third processor, or a fourth processor, an entry point for executing the first explicit reset operation and the second explicit reset operation in the first reset unit in the reset execution order during the reset phase.

10. The computer-implemented method of claim 9 further comprising generating code for the executable model, the generated code including a code section corresponding to the first reset unit and a code based single entry point corresponding to the entry point for the first reset unit for executing the code section.

11. The computer-implemented method of claim 9 further comprising aggregating the first implicit initialization operation into the first reset unit and wherein the entry point for the first reset unit is for executing all of the first and second explicit reset operations and the first implicit initialization operation.

12. The computer-implemented method of claim 1 wherein the execution of the executable model further includes a termination phase and the executable model further includes:
 a first implicit termination operation associated with either the first hierarchical level or the second hierarchical level, and
 a first explicit termination operation associated with either the first hierarchical level or the second hierarchical level, the computer-implemented method further comprising:
 automatically aggregating into a first termination unit the first implicit termination operation and the first explicit termination operation;
 automatically arranging the first implicit termination operation and the first explicit termination operation in a termination execution order, where the first implicit termination operation and the first explicit termination operation in the first termination unit are in the termination execution order; and
 defining, by the first processor, the second processor, the third processor, or a fourth processor, an entry point for executing the first implicit termination operation and the first explicit termination operation of the first termination unit in the termination execution order during the termination phase.

13. The computer-implemented method of claim 12 further comprising generating code for the executable model, the generated code including a code section corresponding to the first termination unit and a code based single entry point corresponding to the entry point for the first termination unit for executing the code section.

14. The computer-implemented method of claim 1 where the executable model further includes:
 a second implicit initialization operation associated with either the first hierarchical level or the second hierarchical level, and
 a second explicit initialization operation associated with either the first hierarchical level or the second hierarchical level, the computer-implemented method further comprising:
 automatically aggregating into a second initialization unit the second implicit initialization operation and the second explicit initialization operation;
 automatically arranging the second implicit initialization operation and the second explicit initialization operation in a second execution order, where the second implicit initialization operation and the second explicit initialization operation in the second initialization unit are in the second execution order; and
 defining an entry point for executing the second implicit initialization operation and the second explicit initialization operation of the second initialization unit in the second execution order during the initialization phase.

15. The computer-implemented method of claim 1 wherein the executable model further includes first and second model components at the first hierarchical level, a first initialization operation set for the first model component, and a second initialization operation set for the second model component, the method further comprising:
 interleaving the first initialization operation set with the second initialization operation set in the first initialization unit.

16. The computer-implemented method of claim 1 wherein the first implicit initialization operation is predetermined by a run-time engine configured to execute the executable model.

17. The computer-implemented method of claim 1 wherein the first explicit initialization operation is custom defined by a user.

18. One or more non-transitory computer-readable media comprising program instructions for execution by one or more processors, the program instructions instructing the one or more processors to:
  for an executable model that simulates a system wherein execution of the executable model includes an initialization phase and a run phase, and the executable model includes a first hierarchical level,
  a second hierarchical level different from the first hierarchical level,
  a first implicit initialization operation associated with either the first hierarchical level or the second hierarchical level, and
  a first explicit initialization operation associated with either the first hierarchical level or the second hierarchical level,
  automatically aggregate into a first initialization unit the first implicit initialization operation and the first explicit initialization operation;
  automatically arrange the first implicit initialization operation and the first explicit initialization operation in an execution order for executing both the first implicit initialization operation and the first explicit initialization operation; and
  define an entry point for the executing both the first implicit initialization operation and the first explicit initialization operation as aggregated into the initialization unit in the automatically arranged execution order during the initialization phase,
  wherein the arranging the first implicit initialization operation and the first explicit initialization operation in the execution order is based on one or more rules, and the one or more rules include at least one of:
  arranging execution of explicit initialization operations associated with a given hierarchical level to execute after implicit initialization operations associated with the given hierarchical level; or
  arranging execution of explicit initialization operations and implicit initialization operations for a lower hierarchical level to execute before explicit initialization operations and implicit initialization operations for a higher hierarchical level.

19. The one or more non-transitory computer-readable media of claim 18 further comprising program instructions to:
  execute the executable model, where the executing the executable model includes utilizing the entry point for executing the first initialization unit.

20. The one or more non-transitory computer-readable media of claim 18 further comprising program instructions to:
  generate code for the executable model, the generated code including a code section
  corresponding to the first initialization unit and a code based single entry point corresponding to the entry point for executing the code section.

21. The one or more non-transitory computer-readable media of claim 20 wherein the first initialization unit is accessible through a function call, and the code based single entry point includes a code based function call.

22. The one or more non-transitory computer-readable media of claim 18 wherein the entry point is accessible through an occurrence of an event.

23. The one or more non-transitory computer-readable media of claim 18 further comprising program instructions to:
  detect a conflict in the first initialization unit, where the conflict involves setting a variable; and
  resolve the conflict.

24. The one or more non-transitory computer-readable media of claim 18 wherein the execution of the executable model further includes a reset phase and the executable model further includes:
  a first explicit reset operation associated with the first hierarchical level, and
  a second explicit reset operation associated with the second hierarchical level,
  the media further comprising program instructions to:
  automatically aggregate into a first reset unit the first explicit reset operation and the second explicit reset operation;
  automatically arrange the first explicit reset operation and the second explicit reset operation in a reset execution order, wherein the first and second explicit reset operations are in the reset execution order in the first reset unit; and
  automatically define for the first reset unit an entry point for executing the first explicit reset operation and the second explicit reset operation in the first reset unit in the reset execution order during the reset phase.

25. The one or more non-transitory computer-readable media of claim 24 further comprising program instructions to:
  generate code for the executable model, the generated code including a code section
  corresponding to the first reset unit and a code based single entry point corresponding to the entry point for the first reset unit for executing the code section.

26. The one or more non-transitory computer-readable media of claim 24 further comprising program instructions to:
  aggregate the first implicit initialization operation into the first reset unit and wherein the entry point for the first reset unit is for executing all of the first and second explicit reset operations and the first implicit initialization operation.

27. The one or more non-transitory computer-readable media of claim 18 wherein the execution of the executable model further includes a termination phase and the executable model further includes:
  a first implicit termination operation associated with either the first hierarchical level or the second hierarchical level, and
  a first explicit termination operation associated with either the first hierarchical level or the second hierarchical level,
  the media further comprising program instructions to:
  automatically aggregate into a first termination unit the first implicit termination operation and the first explicit termination operation;
  automatically arrange the first implicit termination operation and the first explicit termination operation in a termination execution order, where the first implicit termination operation and the first explicit termination operation in the first termination unit are in the termination execution order; and
  define an entry point for executing the first implicit termination operation and the first explicit termination operation of the first termination unit in the termination execution order during the termination phase.

28. The one or more non-transitory computer-readable media of claim 18 wherein the executable model further includes first and second model components at the first hierarchical level, a first initialization operation set for the first model component, and a second initialization operation set for the second model component, the media further comprising program instructions to:
interleave the first initialization operation set with the second initialization operation set in the first initialization unit.

29. The one or more non-transitory computer-readable media of claim 18 wherein the first implicit initialization operation is pre-determined by a run-time engine configured to execute the executable model.

30. The one or more non-transitory computer-readable media of claim 18 wherein the first explicit initialization operation is custom defined by a user.

31. An apparatus comprising:
a memory storing an executable model that simulates a system wherein execution of the executable model includes an initialization phase and a run phase, and the executable model includes:
a first hierarchical level,
a second hierarchical level different from the first hierarchical level,
a first implicit initialization operation associated with either the first hierarchical level or the second hierarchical level, and
a first explicit initialization operation associated with either the first hierarchical level or the second hierarchical level; and
one or more processors coupled to the memory, the one or more processor configured to:
automatically aggregate into a first initialization unit the first implicit initialization operation and the first explicit initialization operation;
automatically arrange the first implicit initialization operation and the first explicit initialization operation in an execution order for executing both the first implicit initialization operation and the first explicit initialization operation; and
define an entry point for the executing both the first implicit initialization operation and the first explicit initialization operation as aggregated into the initialization unit in the automatically arranged execution order during the initialization phase,
wherein the arranging the first implicit initialization operation and the first explicit initialization operation in the execution order is based on one or more rules, and the one or more rules include at least one of:
arranging execution of explicit initialization operations associated with a given hierarchical level to execute after implicit initialization operations associated with the given hierarchical level; or
arranging execution of explicit initialization operations and implicit initialization operations for a lower hierarchical level to execute before explicit initialization operations and implicit initialization operations for a higher hierarchical level.

32. The apparatus of claim 31 wherein the one or more processors are further configured to:
execute the executable model, where the executing the executable model includes utilizing the entry point for executing the first initialization unit.

33. The apparatus of claim 31 wherein the entry point is accessible through an occurrence of an event.

34. The apparatus of claim 31 wherein the one or more processors are further configured to:
detect a conflict in the first initialization unit, where the conflict involves setting a variable; and
resolve the conflict.

35. The apparatus of claim 31 wherein the execution of the executable model further includes a reset phase and the executable model further includes:
a first explicit reset operation associated with the first hierarchical level, and
a second explicit reset operation associated with the second hierarchical level,
the one or more processors further configured to:
automatically aggregate into a first reset unit the first explicit reset operation and the second explicit reset operation;
automatically arrange the first explicit reset operation and the second explicit reset operation in a reset execution order, wherein the first and second explicit reset operations are in the reset execution order in the first reset unit; and
automatically define for the first reset unit an entry point for executing the first explicit reset operation and the second explicit reset operation in the first reset unit in the reset execution order during the reset phase.

36. The apparatus of claim 35 wherein the one or more processors are further configured to:
generate code for the executable model, the generated code including a code section corresponding to the first reset unit and a code based single entry point corresponding to the entry point for the first reset unit for executing the code section.

37. The apparatus of claim 35 wherein the one or more processors are further configured to:
aggregate the first implicit initialization operation into the first reset unit and wherein the entry point for the first reset unit is for executing all of the first and second explicit reset operations and the first implicit initialization operation.

38. The apparatus of claim 31 wherein the execution of the executable model further includes a termination phase and the executable model further includes:
a first implicit termination operation associated with either the first hierarchical level or the second hierarchical level, and
a first explicit termination operation associated with either the first hierarchical level or the second hierarchical level,
the one or more processors further configured to:
automatically aggregate into a first termination unit the first implicit termination operation and the first explicit termination operation;
automatically arrange the first implicit termination operation and the first explicit termination operation in a termination execution order, where the first implicit termination operation and the first explicit termination operation in the first termination unit are in the termination execution order; and
define an entry point for executing the first implicit termination operation and the first explicit termination operation of the first termination unit in the termination execution order during the termination phase.

39. The apparatus of claim 31 wherein the executable model further includes first and second model components at the first hierarchical level, a first initialization operation set for the first model component, and a second initialization operation set for the second model component,
the one or more processors further configured to:
interleave the first initialization operation set with the second initialization operation set in the first initialization unit.

* * * * *